(12) United States Patent
Sasaki et al.

(10) Patent No.: US 9,881,688 B2
(45) Date of Patent: Jan. 30, 2018

(54) SHIFT REGISTER

(71) Applicant: Sharp Kabushiki Kaisha, Osaka (JP)

(72) Inventors: Yasushi Sasaki, Osaka (JP);
Yuhichiroh Murakami, Osaka (JP);
Shuji Nishi, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 22 days.

(21) Appl. No.: 14/432,593

(22) PCT Filed: Sep. 27, 2013

(86) PCT No.: PCT/JP2013/076216
§ 371 (c)(1),
(2) Date: Mar. 31, 2015

(87) PCT Pub. No.: WO2014/054518
PCT Pub. Date: Apr. 10, 2014

(65) Prior Publication Data
US 2015/0279481 A1    Oct. 1, 2015

(30) Foreign Application Priority Data

Oct. 5, 2012 (JP) ................................ 2012-222909

(51) Int. Cl.
*G11C 19/00* (2006.01)
*G11C 19/28* (2006.01)
(Continued)

(52) U.S. Cl.
CPC ............ *G11C 19/28* (2013.01); *G11C 19/184* (2013.01); *G09G 3/3677* (2013.01);
(Continued)

(58) Field of Classification Search
None
See application file for complete search history.

(56) References Cited

U.S. PATENT DOCUMENTS 5,410,583 A    4/1995 Weisbrod et al.
5,859,630 A    1/1999 Huq
(Continued)

FOREIGN PATENT DOCUMENTS

JP      7-182891 A     7/1995
JP   2001-506044 A     5/2001
(Continued)

OTHER PUBLICATIONS

U.S. Appl. Nos. 14/432,577 and 14/432,586 filed Mar. 31, 2015.

*Primary Examiner* — Tuan T Lam
(74) *Attorney, Agent, or Firm* — Chen Yoshimura LLC

(57) ABSTRACT

A shift register is realized having a simple construction with which it is possible to switch the scanning order of gate bus lines and the occurrence of an erroneous operation caused by a threshold voltage drop can be prevented. Unit circuits that make up the shift register are configured of: a thin film transistor in which a third clock is supplied to the gate terminal, the drain terminal is connected to a first node, and a first input signal (output signal of prior stage) is supplied to the source terminal; a thin film transistor in which a second clock is supplied to the gate terminal, the drain terminal is connected to the first node, and a second input signal (output signal of subsequent stage) is supplied to the source terminal; and a thin film transistor in which the gate terminal is connected to the first node, a first clock is supplied to the drain terminal, and the source terminal is connected to an output terminal. The shift direction is switched by changing the generation order of pulses of clock signals.

10 Claims, 39 Drawing Sheets

(51) Int. Cl.
*G11C 19/18* (2006.01)
*G09G 3/36* (2006.01)
(52) U.S. Cl.
CPC .............. *G09G 2310/0286* (2013.01); *G09G 2310/0291* (2013.01); *G09G 2310/08* (2013.01)

(56) References Cited

U.S. PATENT DOCUMENTS

| | | | |
|---|---|---|---|
| 6,813,332 B2 | 11/2004 | Nagao et al. | |
| 6,913,332 B1* | 7/2005 | Besterfield | A47B 21/0073 108/50.01 |
| 6,928,135 B2* | 8/2005 | Sasaki | G11C 8/04 345/100 |
| 7,436,923 B2* | 10/2008 | Tobita | G09G 3/3677 377/64 |
| 7,817,770 B2* | 10/2010 | Chang | G09G 3/3674 345/100 |
| 7,978,809 B2* | 7/2011 | Lai | G11C 19/28 377/64 |
| 8,019,039 B1* | 9/2011 | Tsai | G11C 19/184 377/64 |
| 8,023,610 B2* | 9/2011 | Miyayama | G11C 19/28 377/64 |
| 8,023,611 B2 | 9/2011 | Lin et al. | |
| 8,031,160 B2 | 10/2011 | Chen et al. | |
| 8,199,870 B2* | 6/2012 | Shang | G11C 19/184 377/64 |
| 8,427,416 B2 | 4/2013 | Tsou | |
| 8,675,811 B2 | 3/2014 | Yamamoto et al. | |
| 8,766,958 B2 | 7/2014 | Zhang et al. | |
| 8,854,292 B2 | 10/2014 | Han et al. | |
| 8,983,020 B2 | 3/2015 | Chien et al. | |
| 9,064,466 B2 | 6/2015 | Lin et al. | |
| 9,269,318 B2 | 2/2016 | Sasaki et al. | |
| 2002/0190326 A1 | 12/2002 | Nagao et al. | |
| 2004/0104882 A1* | 6/2004 | Kitani | G09G 3/3677 345/100 |
| 2005/0008114 A1 | 1/2005 | Moon | |
| 2008/0068326 A1 | 3/2008 | Chen et al. | |
| 2008/0219401 A1* | 9/2008 | Tobita | G09G 3/3677 377/79 |
| 2009/0115792 A1* | 5/2009 | Otose | G11C 19/28 345/559 |
| 2010/0111245 A1 | 5/2010 | Tobita | |
| 2010/0141642 A1 | 6/2010 | Furuta et al. | |
| 2010/0150303 A1 | 6/2010 | Tsai et al. | |
| 2010/0156869 A1 | 6/2010 | Lee et al. | |
| 2010/0214206 A1* | 8/2010 | Yokoyama | G09G 3/3677 345/100 |
| 2010/0245298 A1 | 9/2010 | Chen et al. | |
| 2010/0245304 A1 | 9/2010 | Umezaki | |
| 2010/0309184 A1 | 12/2010 | Yamamoto et al. | |
| 2011/0157124 A1* | 6/2011 | Jung | G11C 19/28 345/211 |
| 2011/0228894 A1 | 9/2011 | Wang et al. | |
| 2012/0008731 A1* | 1/2012 | Hsu | G11C 19/28 377/79 |
| 2012/0194489 A1 | 8/2012 | Iwamoto et al. | |
| 2012/0307959 A1* | 12/2012 | Furuta | G11C 19/184 377/64 |
| 2013/0010916 A1* | 1/2013 | Jang | G09G 3/3677 377/64 |
| 2013/0077736 A1 | 3/2013 | Son | |
| 2013/0155044 A1* | 6/2013 | Ohkawa | G09G 3/3677 345/211 |
| 2013/0156148 A1* | 6/2013 | Sasaki | H03K 3/02 377/64 |
| 2013/0272487 A1* | 10/2013 | Tobita | G09G 3/3677 377/79 |
| 2013/0335665 A1 | 12/2013 | Tseng et al. | |
| 2014/0119491 A1 | 5/2014 | Liu | |
| 2015/0255171 A1* | 9/2015 | Nishi | G09G 3/3677 377/54 |
| 2015/0262703 A1* | 9/2015 | Murakami | G09G 3/20 345/214 |
| 2015/0279480 A1 | 10/2015 | Murakami et al. | |

FOREIGN PATENT DOCUMENTS

| | | |
|---|---|---|
| JP | 2001-160299 A | 6/2001 |
| JP | 2002-8388 A | 1/2002 |
| JP | 2004-185684 A | 7/2004 |
| JP | 2005-50502 A | 2/2005 |
| JP | 2009-77415 A | 4/2009 |
| JP | 2010-135050 A | 6/2010 |
| JP | 2010-250303 A | 11/2010 |
| WO | 98/26423 A1 | 6/1998 |
| WO | 2009/034750 A1 | 3/2009 |
| WO | 2009/084269 A1 | 7/2009 |
| WO | 2011/055570 A1 | 5/2011 |
| WO | 2014/054516 A1 | 4/2014 |
| WO | 2014/054517 A1 | 4/2014 |

* cited by examiner

FIG. 39
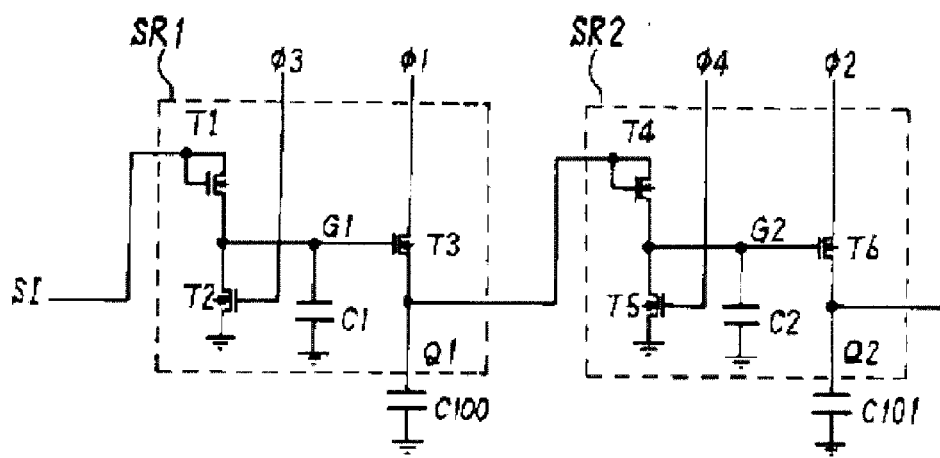
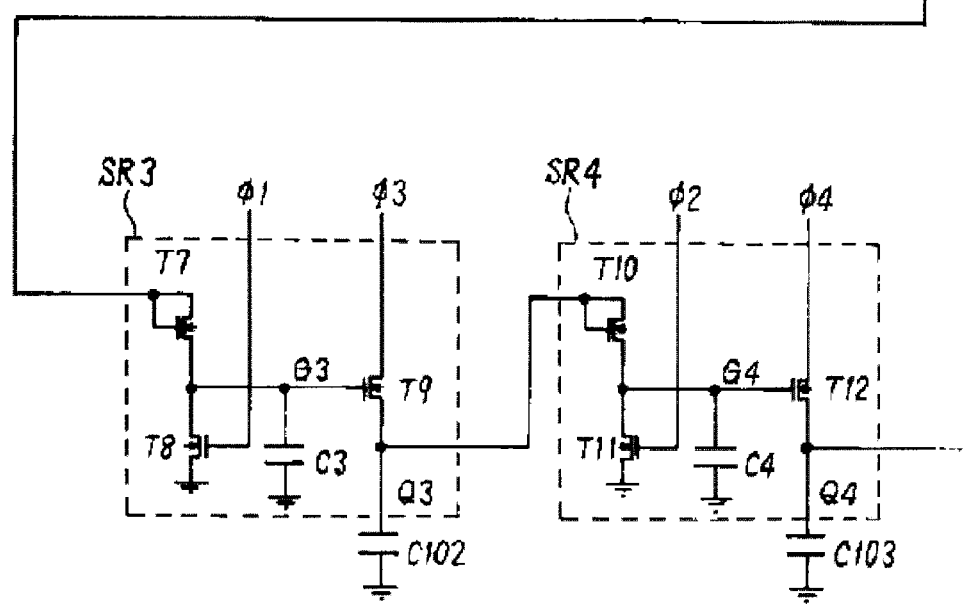

SHIFT REGISTER

TECHNICAL FIELD

The present invention relates to a shift register, and, more particularly, relates to a shift register provided inside a gate driver (scanning signal line driver circuit) for driving gate bus lines (scanning signal lines) of a display device.

BACKGROUND ART

Generally, in an active matrix-type liquid crystal display device, a liquid crystal panel made up of two substrates that hold a liquid crystal layer therebetween is provided, a plurality of gate bus lines (scanning signal lines) and a plurality of source bus lines (video signal lines) are arranged in a grid pattern on one of the substrates from among the two substrates, and a plurality of pixel-forming sections arranged in a matrix are provided corresponding respectively to intersection points between the plurality of gate bus lines and the plurality of source bus lines. Each pixel-forming section includes a thin film transistor (TFT), which is a switching element in which a gate terminal is connected to a gate bus line that passes through the corresponding intersection point and a source terminal is connected to a source bus line that passes through the intersection point, and a pixel capacitance for retaining a pixel value. Furthermore, a common electrode, which is an opposite electrode provided in common to the plurality of pixel-forming sections, is provided on the other substrate from among the two substrates. A gate driver (scanning signal line driver circuit) that drives the plurality of gate bus lines and a source driver (video signal line driver circuit) that drives the plurality of source bus lines are additionally provided in the active matrix-type liquid crystal display device.

Video signals that indicate pixel values are transmitted by the source bus lines; however, the source bus lines are not able to, at one time (at the same time), transmit video signals that indicate pixel values of a plurality of rows. Therefore, the writing of video signals to the pixel capacitances inside the aforementioned pixel-forming sections arranged in a matrix is carried out sequentially one row at a time. Consequently, the gate driver is configured of a shift register made up of a plurality of stages such that the plurality of gate bus lines are sequentially selected in each prescribed period. Then, as a result of active scanning signals being sequentially output from that plurality of stages, the writing of video signals to pixel capacitances is carried out sequentially one row at a time as previously mentioned. It should be noted that, hereinafter, circuits that constitute the stages of the shift register are also referred to as "unit circuits".

FIG. 39 (FIG. 1 of Japanese Patent Application Laid-Open Publication No. 2002-8388) is a drawing depicting an example of the circuit configuration of a conventional shift register. FIG. 40 (FIG. 2 of Japanese Patent Application Laid-Open Publication No. 2002-8388) is a signal waveform diagram for illustrating the operation of this shift register. In this shift register, as a result of a start signal SI becoming high level, a node (hereinafter referred to as a "node G1") that is connected to the gate terminal of a transistor T3 is precharged by way of a transistor T1. The transistor T3 thereby enters an on state. Thereafter, when a clock signal $\varphi1$ changes from low level to high level, the potential of the node G1 greatly rises due to a bootstrap effect caused by the presence of a parasitic capacitance between the channel and gate of the transistor T3. As a result, a large voltage is applied to the gate terminal of the transistor T3, the transistor T3 has a low impedance, and the high-level potential of the clock signal $\varphi1$ is expressed without change as the potential of an output signal Q1. Thereafter, when a clock signal $\varphi3$ changes from low level to high level, a transistor T2 enters an on state and the potential of the node G1 becomes low level. The transistor T3 thereby enters an off state.

In this connection, configurations that make it possible to switch the scanning order (scanning direction) of gate bus lines have been proposed in the past with regard to display devices. In the case where the configuration of the shift register depicted in FIG. 39 is to be modified to make it possible to switch the scanning order of gate bus lines, generally, a configuration such as that depicted in FIG. 41 is conceivable as the configuration of one stage (the configuration of a unit circuit) of the shift register. In a shift register made up of a plurality of unit circuits having the configuration depicted in FIG. 41, for example, forward direction scanning is carried out as a result of a signal UD being made to be high level and a signal UDB being made to be low level, and reverse direction scanning is carried out as a result of the signal UD being made to be low level and the signal UDB being made to be high level.

RELATED ART DOCUMENTS

Patent Documents

Patent Document 1: Japanese Patent Application Laid-Open Publication No. 2002-8388

SUMMARY OF THE INVENTION

Problems to be Solved by the Invention

Here, in the case where forward direction scanning, for example, is carried out in the configuration depicted in FIG. 41, when a high-level input signal SI (N−1) is supplied to a node A1 (a node connected to the gate terminal of the transistor T1), the potential drops in proportion to the threshold voltage of a transistor T4. As a result, when the potential of the high-level input signal SI (N−1) is taken as VDD, the potential of the node A1 becomes "VDD-Vth". Furthermore, when a signal is additionally transmitted from the node A1 to the node G1, the potential drops in proportion to the threshold voltage of the transistor T1. As a result, the potential of the node G1 becomes "VDD-2Vth". It should be noted that, here, the threshold voltage of the transistor T4 and the threshold voltage of the transistor T1 are both represented by Vth. As described above, according to the configuration depicted in FIG. 41, when the node G1 is precharged, a second threshold voltage drop (the source potential only rising to a low potential in proportion to the threshold voltage compared with the drain potential) occurs. Therefore, the possibility of an erroneous operation occurring increases.

Consequently, it is conceivable to implement a configuration such as that depicted in FIG. 42 for a unit circuit in order to suppress the occurrence of a threshold voltage drop. According to the configuration depicted in FIG. 42, for example, when the signal UD is high level and the signal UDB is low level, taking the threshold voltage drop at a transistor T9 into consideration, the potential of a node D (a node connected to the gate terminal of a thin film transistor T6) when in a precharged state becomes "VDD-Vth" (it should be noted that the potential of the high-level signal UD is taken as VDD, and the threshold voltage of a transistor T9 is taken as Vth). Then, when an input signal SIN1 changes from low level to high level while the node D is in a precharged state, the potential of the node D greatly rises due to a bootstrap effect. Thus, it becomes possible to supply the potential of the high-level input signal SIN1 to the node A1 without a threshold voltage drop occurring. However, according to the configuration depicted in FIG. 42, the number of elements required becomes quite high compared with the conventional configuration.

Consequently, an objective of the present invention is to realize a shift register having a simple construction with which it is possible to switch the scanning order of gate bus lines and to prevent the occurrence an erroneous operation caused by a threshold voltage drop, and to realize a display device provided with the shift register.

Means for Solving the Problems

A first aspect of the present invention is a shift register, including a plurality of unit circuits serially-connected to each other in a plurality of stages and constituted by transistors of the same conductivity type, each transistor having a control terminal, a first conducting terminal, and a second conducting terminal, the shift register operating in accordance with a plurality of clock signals having mutually differing phases, wherein each of the unit circuits includes:

first to third clock terminals respectively receiving the clock signals;

an output terminal for outputting an output signal;

a first transistor in which the third clock terminal is connected to the control terminal of the first transistor, an output signal from a previous stage being supplied to the second conducting terminal of the first transistor;

a first node connected to the first conducting terminal of the first transistor;

a second transistor in which the second clock terminal is connected to the control terminal of the second transistor, the first conducting terminal of the second transistor being connected to the first node and an output signal of a subsequent stage being supplied to the second conducting terminal of the second transistor; and a third transistor in which the control terminal of the third transistor is connected to the first node, the first clock terminal being connected to the first conducting terminal of the third transistor and the second conducting terminal being connected to the output terminal.

A second aspect of the present invention is the first aspect of the present invention, wherein the clock signals are a first gate clock signal, a second gate clock signal, and a third gate clock signal each shifted in phase 120 degrees relative to one another, wherein, when three of the unit circuits including three successive stages are respectively defined as a first unit circuit, a second unit circuit, and a third unit circuit:

the first unit circuit is configured such that the first gate clock signal is supplied to the first clock terminal, the second gate clock signal is supplied to the second clock terminal, and the third gate clock signal is supplied to the third clock terminal;

the second unit circuit is configured such that the second gate clock signal is supplied to the first clock terminal, the third gate clock signal is supplied to the second clock terminal, and the first gate clock signal is supplied to the third clock terminal; and the third unit circuit is configured such that the third gate clock signal is supplied to the first clock terminal, the first gate clock signal is supplied to the second clock terminal, and the second gate clock signal is supplied to the third clock terminal.

A third aspect of the present invention is the second aspect of the present invention, wherein shift operations of the shift register when pulses are repeatedly generated in order of the first gate clock signal, the second gate clock signal, and the third gate clock signal are performed in a direction opposite to when pulses are repeatedly generated in order of the third gate clock signal, the second gate clock signal, and the first gate clock signal.

A fourth aspect of the present invention is the first aspect of the present invention, wherein the clock signals are a first gate clock signal, a second gate clock signal, a third gate clock signal, and a fourth gate clock signal each shifted in phase of 90 degrees relative to one another, wherein, when four of the unit circuits including four successive stages are respectively defined as a first unit circuit, a second unit circuit, a third unit circuit, and a fourth unit circuit:

the first unit circuit is configured such that the first gate clock signal is supplied to the first clock terminal, the second gate clock signal is supplied to the second clock terminal, and the fourth gate clock signal is supplied to the third clock terminal;

the second unit circuit is configured such that the second gate clock signal is supplied to the first clock terminal, the third gate clock signal is supplied to the second clock terminal, and the first gate clock signal is supplied to the third clock terminal;

the third unit circuit is configured such that the third gate clock signal is supplied to the first clock terminal, the fourth gate clock signal is supplied to the second clock terminal, and the second gate clock signal is supplied to the third clock terminal; and the fourth unit circuit is configured such that the fourth gate clock signal is supplied to the first clock terminal, the first gate clock signal is supplied to the second clock terminal, and the third gate clock signal is supplied to the third clock terminal.

A fifth aspect of the present invention is the fourth aspect of the present invention, wherein shift operations of the shift register when pulses are repeatedly generated in order of the first gate clock signal, the second gate clock signal, the third gate clock signal, and the fourth gate clock signal are performed in a direction opposite to when pulses are repeatedly generated in order of the fourth gate clock signal, the third gate clock signal, the second gate clock signal, and the first gate clock signal.

A sixth aspect of the present invention is the first aspect of the present invention, wherein each of the unit circuits further includes either one or both of:

a fourth transistor in which an output signal of a previous stage is supplied to the control terminal and the first conducting terminal thereof, the second conducting terminal thereof being connected to the first node; and a fifth transistor in which an output signal of a previous stage is supplied to the control terminal and the first conducting terminal thereof, the second conducting terminal thereof being connected to the first node.

A seventh aspect of the present invention is the first aspect of the present invention, wherein each of the unit circuits further includes a fourth transistor in which the first clock terminal is connected to the control terminal thereof, the first conducting terminal thereof being connected to the first node and the second conducting terminal thereof being connected to the output terminal.

An eighth aspect of the present invention is the first aspect of the present invention, wherein each of the unit circuits further includes either one or both of:
- a fourth transistor in which the third clock terminal is connected to the control terminal thereof, the first conducting terminal thereof being connected to the output terminal and a potential of a first potential power source being supplied to the second conducting terminal thereof; and
- a fifth transistor in which the second clock terminal is connected to the control terminal thereof, the first conducting terminal thereof being connected to the output terminal and a potential of a first potential power source being supplied to the second conducting terminal thereof.

A ninth aspect of the present invention is the first aspect of the present invention, wherein each of the unit circuits further includes either one or both of:
- a fourth transistor in which an initialization signal is supplied to the control terminal thereof, the first conducting terminal being connected to the output terminal and a potential of a first potential power source being supplied to the second conducting terminal thereof; and
- a fifth transistor in which the initialization signal is supplied to the control terminal thereof, the first conducting terminal being connected to the first node and a potential of a first potential power source being supplied to the second conducting terminal thereof, wherein the initialization signal is supplied in common to all of the unit circuits.

A tenth aspect of the present invention is the first aspect of the present invention, wherein each of the unit circuits further includes a fourth transistor in which the first node is divided into two nodes of an input-side first node and an output-side first node, and wherein the fourth transistor is configured such that a potential of a second potential power source is supplied to the control terminal thereof, the first conducting terminal being connected to the input-side first node and the second conducting terminal thereof being connected to the output-side first node.

An eleventh aspect of the present invention is the first aspect of the present invention, wherein each of the unit circuits further includes:
- a fourth transistor in which the first conducting terminal thereof is connected to the output terminal and a potential of a first potential power source is supplied to the second conducting terminal thereof;
- a second node connected to the control terminal of the fourth transistor; and
- a fifth transistor in which the control terminal thereof is connected to the first node, the first conducting terminal thereof being connected to the second node, and a potential of a first potential power source being supplied to the second conducting terminal thereof, wherein each of the unit circuits further includes either one or both of:
- a sixth transistor in which the second clock terminal is connected to the control terminal thereof, the second clock terminal being connected, or a potential of a second potential power source being supplied to the first conducting terminal thereof, and the second conducting terminal thereof being connected to the second node; and
- a seventh transistor in which the third clock terminal is connected to the control terminal thereof, the third clock terminal being connected, or a potential of a second potential power source being supplied to the first conducting terminal thereof, and the second conducting terminal thereof being connected to the second node.

A twelfth aspect of the present invention is the first aspect of the present invention, wherein, when for every two clock signals of the plurality of clock signals that successively generate a clock pulse, a clock signal that generates a clock pulse first is defined as a first clock signal, and a clock signal that generates a pulse afterwards is defined as a second clock signal, a latter half of a pulse output period of the first clock signal coincides with a leading half period of a pulse output period of the second clock signal.

A thirteenth aspect of the present invention is any of the first to twelfth aspects of the present invention, wherein the shift register is configured to receive a start pulse for starting a shift operation, the start pulse being either one of a first start pulse that causes the shift operation to be carried out in a forward direction or a second start pulse that causes the shift operation to be carried out in a reverse direction.

A fourteenth aspect of the present invention is the thirteenth aspect of the present invention, wherein, when the shift operation is carried out in the forward direction, assuming that a unit circuit has been added at a stage subsequent to a final stage, a signal corresponding to an output signal that would be outputted from the added unit circuit is supplied as the second start pulse to a unit circuit of the final stage, and wherein, when the shift operation is carried out in the reverse direction, assuming that a unit circuit has been added at a stage prior to a first stage, a signal corresponding to an output signal that would be outputted from the added unit circuit is supplied as the first start pulse to a unit circuit of the first stage.

A fifteenth aspect of the present invention is the first aspect of the present invention, wherein a unit circuit of a final stage further includes a fourth transistor in which an output signal of a previous stage is supplied to the control terminal and the first conducting terminal thereof, the second conducting terminal thereof being connected to the first node, wherein a unit circuit of a first stage further includes a fifth transistor in which an output signal of a subsequent stage is supplied to the control terminal and the first conducting terminal thereof, the second conducting terminal thereof being connected to the first node, and wherein the unit circuits other than of the first stage and the final stage each further includes the fourth transistor and the fifth transistor.

Effects of the Invention

According to the first aspect of the present invention, the third transistor, which functions such that the potential of the first clock is supplied to the output terminal in accordance with the potential of the first node, is provided in the unit circuits that make up the shift register. Furthermore, in the unit circuits, the first transistor functions such that the potential of the output signal of the prior stage is supplied to the first node in accordance with the third clock, and the second transistor functions such that the potential of the output signal of the subsequent stage is supplied to the first node in accordance with the second clock. Because the unit circuits are configured in this manner, it becomes possible to switch the shift direction (the order in which active output signals are output in the plurality of unit circuits making up the shift register) by appropriately supplying the clock signals to each unit circuit. In other words, different from a conventional configuration, it becomes possible to switch the shift direction of a shift register without using a signal for switching the shift direction (a dedicated signal). Thus, by providing this shift register inside a scanning signal line driver circuit that drives scanning signal lines of a display device, for example, it becomes possible to switch the scanning order of the scanning signal lines without using a signal for switching the scanning order (a dedicated signal).

Furthermore, the output signal of the prior stage is supplied to the first node by way of only one transistor (the first transistor), and the output signal of the subsequent stage is supplied to the first node by way of only one transistor (the second transistor). In such a configuration, when the first clock rises after the first node has entered a precharged state, the potential of the first node greatly increases due to a bootstrap effect caused by the presence of parasitic capacitances of the third transistor. Thus, it becomes possible for a high-level potential of a clock signal to be output without change from the output terminal without a threshold voltage drop occurring. Therefore, the occurrence of an operation failure caused by a threshold voltage drop is suppressed. It should be noted that effects have been described here based on operations carried out when assuming that the transistors inside the unit circuits are n-channel type transistors; however, the same effects are also obtained in the case where the transistors inside the unit circuits are of the p-channel type (the same is also true hereinafter).

Thus, a shift register with which it is possible to switch the shift direction and the occurrence of an erroneous operation caused by a threshold voltage drop can be prevented is able to be realized with a simple configuration. For example, a shift register with which it is possible to switch the scanning order of scanning signal lines of a display device and the occurrence of an erroneous operation caused by a threshold voltage drop can be prevented is able to be realized with a simple configuration.

According to the second aspect of the present invention, focusing on three successive stages (three unit circuits) in the shift register, the clock signals (gate clock signals) that are supplied as the first clock, the second clock, and the third clock are different from each other. Therefore, it becomes possible for the shift direction of the shift register to be switched by changing the generation order of pulses of clock signals having three phases.

According to the third aspect of the present invention, in the same manner as in the second aspect of the present invention, it becomes possible for the shift direction of the shift register to be switched by changing the generation order of pulses of clock signals having three phases.

According to the fourth aspect of the present invention, focusing on four successive stages (four unit circuits) in the shift register, the clock signals (gate clock signals) that are supplied as the first clock, the second clock, the third clock, and the fourth clock are different from each other. Therefore, it becomes possible for the shift direction of the shift register to be switched by changing the generation order of pulses of clock signals having four phases.

According to the fifth aspect of the present invention, in the same manner as in the fourth aspect of the present invention, it becomes possible for the shift direction of the shift register to be switched by changing the generation order of pulses of clock signals having four phases.

According to the sixth aspect of the present invention, the fourth transistor functions as an auxiliary transistor when the first node is precharged based on the output signal of the prior stage, and the fifth transistor functions as an auxiliary transistor when the first node is precharged based on the output signal of the subsequent stage. Therefore, it is possible to make the sizes of the first transistor and the second transistor smaller. Furthermore, by making the sizes of the first transistor and the second transistor smaller, it becomes possible to make the loads of the clock signal lines smaller.

According to the seventh aspect of the present invention, the sixth transistor enters an on state when the first clock becomes high level. Thus, a conducting state is established between the first node and the output terminal by way of the sixth transistor. Here, when the output terminal is connected to a large capacitive load, the effect that the presence of the parasitic capacitances of the third transistor has on the potential of the first node becomes notably smaller compared with the effect on the potential of the first node caused by the sixth transistor entering an on state. Therefore, the potential of the first node is brought to low level when the first clock has become high level in periods other than a period in which an active output signal is to be output, and the occurrence of an erroneous operation is prevented.

According to the eighth aspect of the present invention, the potential of the output terminal is brought to low level whenever a pulse of the second clock is generated and whenever a pulse of the third clock is generated. Therefore, the occurrence of an erroneous operation caused by noise or the like is suppressed.

According to the ninth aspect of the present invention, the potential of the first node and the potential of the output terminal can be set to low level on the basis of the initialization signal at an appropriate timing. The occurrence of an erroneous operation is thereby suppressed.

According to the tenth aspect of the present invention, because the eleventh transistor functions as a dividing unit, a rise in the potential of the first node (input-side first node) is suppressed. Therefore, a voltage that exceeds a breakdown voltage is prevented from being applied to a transistor connected to the first node (input-side first node). Circuit reliability is thereby improved.

According to the eleventh aspect of the present invention, the second node enters a charged state and the potential of the output terminal is brought to low level during periods other than a period in which the first node is high level. Therefore, the occurrence of an erroneous operation caused by noise or the like is effectively suppressed.

According to the twelfth aspect of the present invention, a charging period for a capacitive load connected to the output terminal can be made twice as long compared with the case where a plurality of clock signals with which pulse output periods do not overlap are employed. Therefore, it is possible to make the size of the third transistor that controls the output of an output signal smaller and therefore make the circuit area of the shift register smaller. Thus, a shift register with which it is possible to switch the shift direction and the occurrence of an erroneous operation caused by a threshold voltage drop can be prevented is able to be realized with a simple configuration while suppressing an increase in the circuit area.

According to the thirteenth aspect of the present invention, the same effect as any of the first to twelfth aspects of the present invention is obtained with respect to a shift register that operates using two start pulses.

According to the fourteenth aspect of the present invention, the same effect as the thirteenth aspect of the present invention is obtained.

According to the fifteenth aspect of the present invention, in the first stage, the first node does not enter a precharged state as long as the third clock does not become high level, even when the second conducting terminal of the first transistor becomes high level. Furthermore, in the final stage, the first node does not enter a precharged state as long as the second clock does not become high level, even when the second conducting terminal of the second transistor becomes high level. Therefore, an erroneous operation is prevented from occurring in the first stage when reverse direction scanning is performed and an erroneous operation is prevented from occurring in the final stage when forward direction scanning is performed, even when the shift transistor is caused to operate with one start pulse. Accordingly, a shift register with which it is possible to switch the shift direction is able to be realized with an even simpler configuration.

BRIEF DESCRIPTION OF THE DRAWINGS

FIG. 39 is a drawing depicting an example of a circuit configuration of a conventional shift register.

DETAILED DESCRIPTION OF EMBODIMENTS

Hereinafter, embodiments of the present invention will be described with reference to the appended drawings. In the following description, the gate terminal (gate electrode) of a thin film transistor corresponds to the control terminal, the drain terminal (drain electrode) corresponds to the first conducting terminal, and the source terminal (source electrode) corresponds to the second conducting terminal. It should be noted that, although the one having the highest potential out of the drain and the source is generally referred to as the drain, in the following description, because one is defined as the drain and the other as the source, there are also cases where the source potential becomes higher than the drain potential.

Furthermore, a description is given in which unit circuits that make up a shift register are configured of thin film transistors of the same conductivity type, and the thin film transistors inside the unit circuits are of the n-channel type (the thin film transistors are of the p-channel type only in the third modification example of the third embodiment) unless otherwise specifically stated. In the case where the thin film transistors inside the unit circuits are of the n-channel type, a low-level power source corresponds to a first potential power source, and a high-level power source corresponds to a second potential power source. In the case where the thin film transistors inside the unit circuits are of the p-channel type, the low-level power source corresponds to the second potential power source, and the high-level power source corresponds to the first potential power source. Furthermore, in the present specification, a "state in which a constituent element A is connected to a constituent element B" also includes the case where the constituent element A is connected to the constituent element B by way of another constituent element as well as the case where the constituent element A is physically connected directly to the constituent element B. Here, a "constituent element" refers to a circuit, an element, a terminal, a node, wiring, or an electrode or the like, for example. Furthermore, hereinafter, it is assumed that m and n are integers that are equal to or greater than 2.

1. First Embodiment 1.1 Overall Configuration

Figure 2:
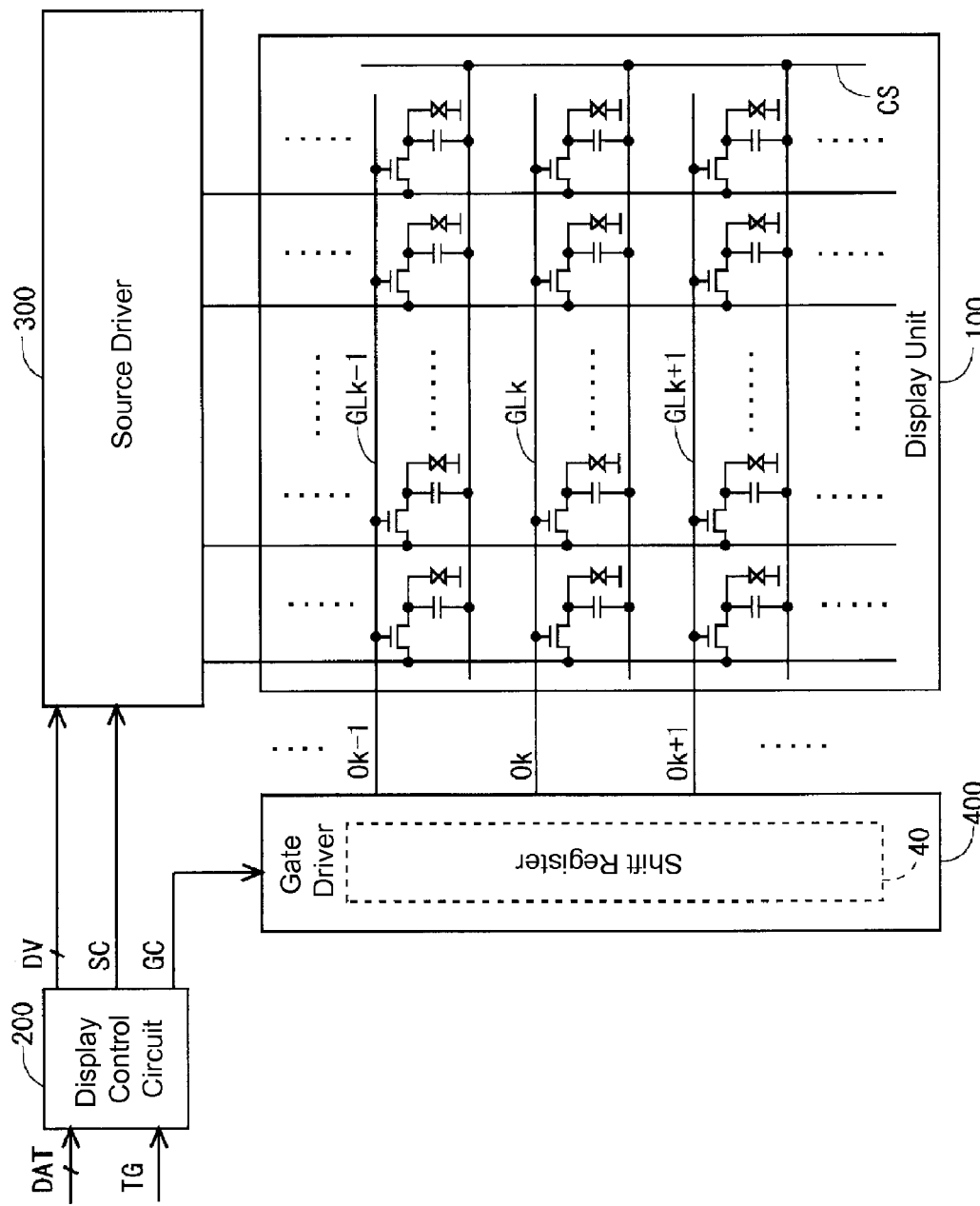
FIG. 2 is a block diagram depicting the overall configuration of the liquid crystal display device in the first embodiment.

FIG. 2 is a block diagram depicting the overall configuration of an active matrix-type liquid crystal display device according to the first embodiment of the present invention. As depicted in FIG. 2, this liquid crystal display device is provided with a display unit 100, a display control circuit 200, a source driver (video signal line driver circuit) 300, and a gate driver (scanning signal line driver circuit) 400. The gate driver 400 is formed on a liquid crystal panel that includes the display unit 100, using any of amorphous silicon, polycrystalline silicon, microcrystalline silicon, and an oxide semiconductor. In other words, in the present embodiment, the gate driver 400 and the display unit 100 are formed on the same substrate (an array substrate that is one of two substrates that make up the liquid crystal panel). It should be noted that, because the mobility of an oxide semiconductor is greater than the mobility of amorphous silicon, it is possible to realize a reduction in frame area and an increase in resolution by employing a thin film transistor in which an oxide semiconductor is used, as a driver element. IGZO (InGaZnOx: indium gallium zinc oxide), in which indium (In), gallium (Ga), zinc (Zn), and oxygen (O) are the main components, can be employed as the oxide semiconductor, for example.

Figure 3:
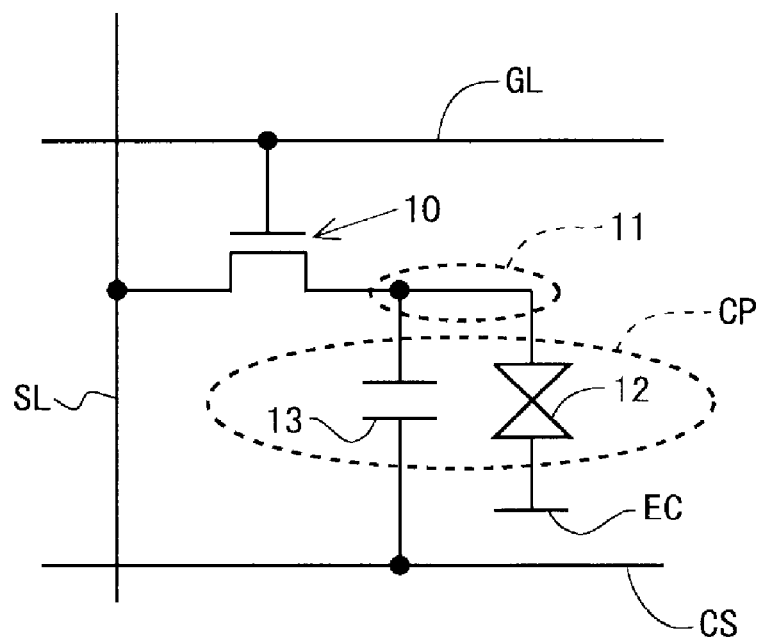
FIG. 3 is a circuit diagram depicting a configuration of a pixel-forming section in the first embodiment.

A plurality of source bus lines (video signal lines), a plurality of gate bus lines (scanning signal lines), a plurality of pixel-forming sections that are provided respectively corresponding to intersection points between the plurality of source bus lines and the plurality of gate bus lines, and auxiliary capacitance wiring CS are included in the display unit 100. FIG. 3 is a circuit diagram depicting a configuration of a pixel-forming section. As depicted in FIG. 3, a thin film transistor (TFT) 10 in which the gate electrode is connected to a gate bus line GL that passes through the corresponding intersection point and also the source electrode is connected to a source bus line SL that passes through the intersection point, a pixel electrode 11 connected to the drain electrode of that thin film transistor 10, a common electrode EC and the auxiliary capacitance wiring CS provided in common in the plurality of pixel-forming sections, a liquid crystal capacitance 12 formed by the pixel electrode 11 and the common electrode EC, and an auxiliary capacitance 13 formed by the pixel electrode 11 and the auxiliary capacitance wiring CS are included in each pixel-forming section. Furthermore, a pixel capacitance CP is formed by the liquid crystal capacitance 12 and the auxiliary capacitance 13. A voltage that indicates a pixel value is then retained in the pixel capacitance CP on the basis of a video signal received by the source electrode of the thin film transistor 10 from the source bus line SL when the gate electrode of each thin film transistor 10 has received an active scanning signal from the gate bus line GL. It should be noted that, in the following description, it is assumed that m number of source bus lines and n number of gate bus lines are arranged in the display unit 100. Furthermore, only constituent elements corresponding to gate bus lines GLk−1 to GLk+1 of the k−1$^{th}$ line to the k+1$^{th}$ line are depicted in the display unit 100 of FIG. 2.

The display control circuit 200 receives a timing signal group TG such as an image signal DAT and a horizontal synchronization signal and vertical synchronization signal sent from outside, and outputs a digital video signal DV, a source control signal SC that controls the operation of the source driver 300, and a gate control signal GC that controls the operation of the gate driver 400. A source start pulse signal, a source clock signal, and a latch strobe signal and the like are included in the source control signal SC, for example. A gate start pulse signal and a gate clock signal and the like are included in the gate control signal GC, for example.

The source driver 300 receives the digital video signal DV and the source control signal SC, which are output from the display control circuit 200, and applies a driver video signal to each source bus line SL. At such time, the digital video signal DV, which indicates a voltage to be applied to each source bus line SL, is sequentially retained in the source driver 300 at a timing at which a pulse of a source clock signal is generated. Then, the retained digital video signal DV is converted into an analog voltage at a timing at which a pulse of a latch strobe signal is generated. That converted analog voltage is simultaneously applied to all of the source bus lines SL as a driver video signal. The gate driver 400 repeatedly applies an active scanning signal to each gate bus line GL with one vertical scanning period serving as a period, on the basis of the gate control signal GC, which is output from the display control circuit 200.

As a result of the driver video signal being applied to each source bus line SL and the scanning signal being applied to each gate bus line GL in the manner described above, an image that is based on the image signal DAT, which is sent from outside, is displayed on the display unit 100.

1.2 Configuration and Operation of Gate Driver

Figure 4:
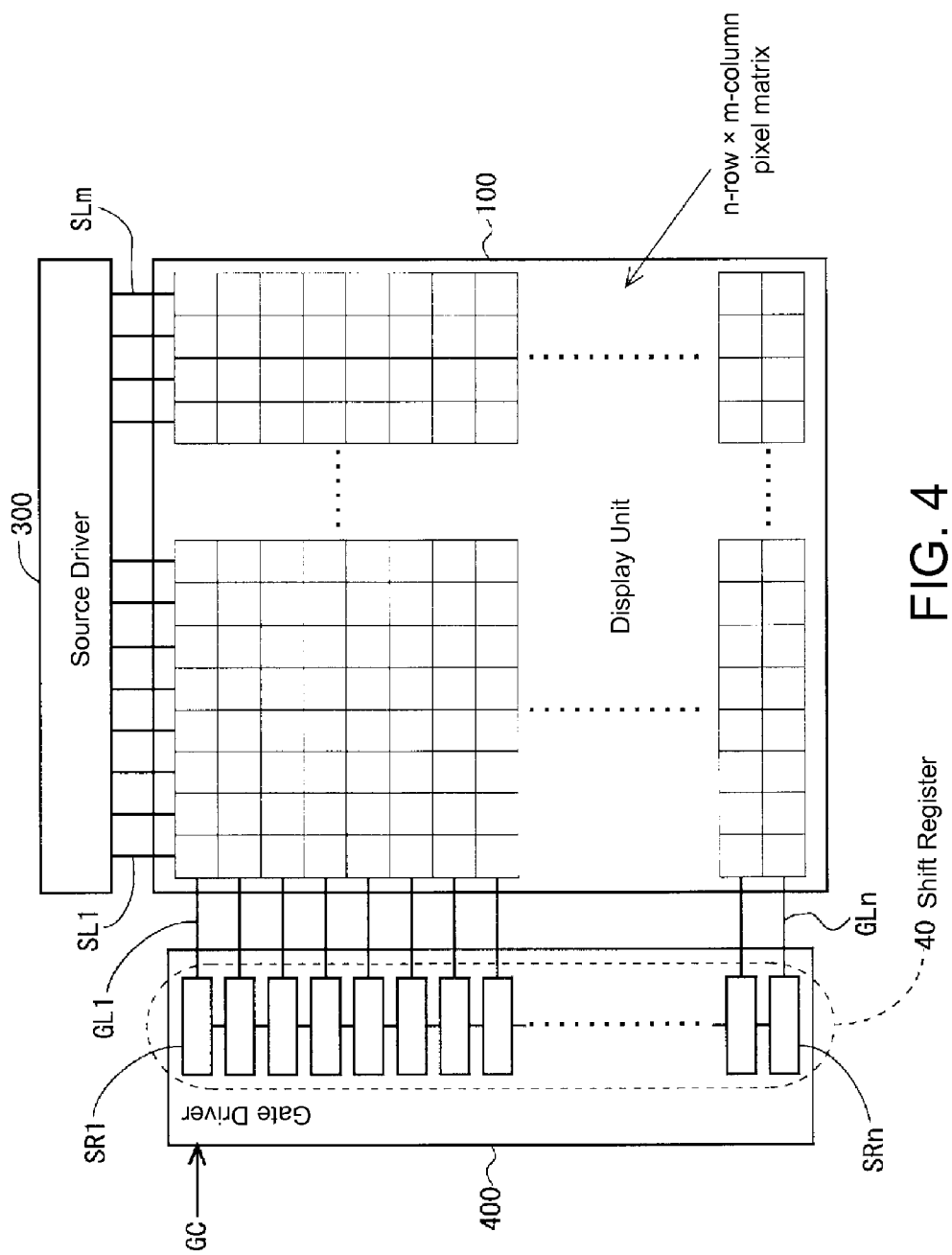
FIG. 4 is a block diagram for illustrating a configuration of a gate driver in the first embodiment.

Next, a summary of a configuration and operation of the gate driver 400 in the present embodiment will be described with reference to FIG. 4 to FIG. 7. As depicted in FIG. 4, the gate driver 400 is constituted by a shift register 40 made up of a plurality of stages. An n-row×m-column pixel matrix is formed in the display unit 100, and each stage (unit circuit) of the shift register 40 is provided so as to correspond with each row of the pixel matrix on a one-to-one basis. In other words, n number of unit circuits SR1 to SRn are included in the shift register 40. Those n number of unit circuits SR1 to SRn are connected to each other in series.

Figure 5:
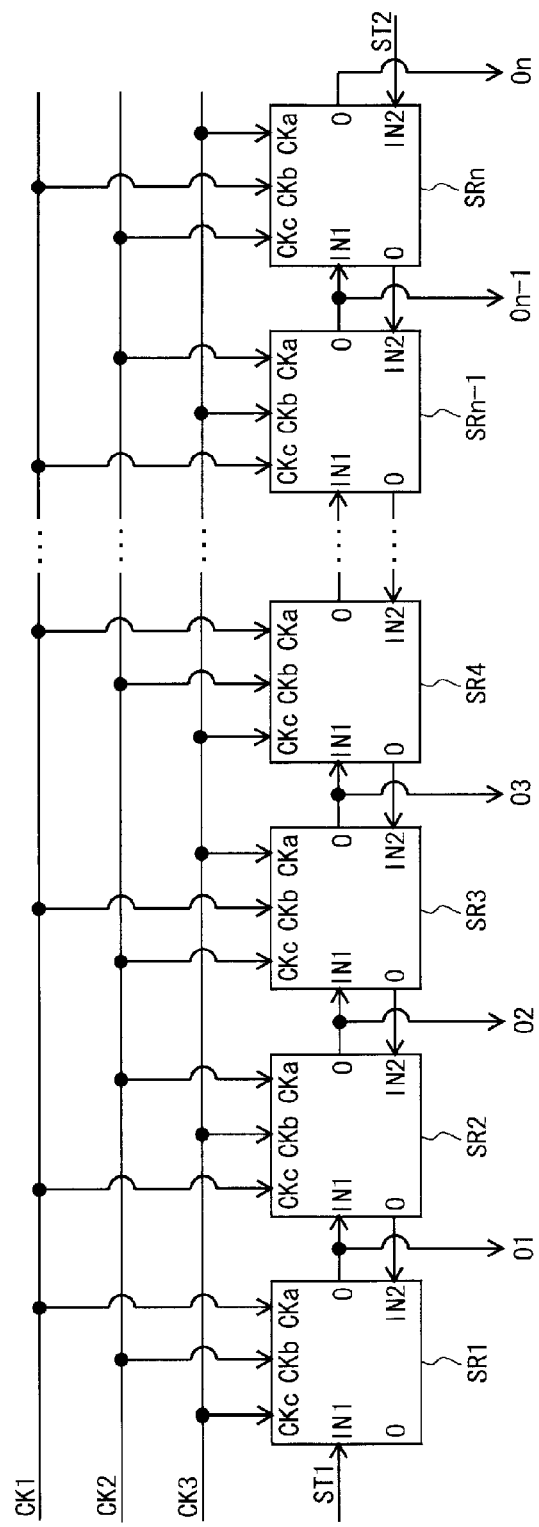
FIG. 5 is a block diagram depicting a configuration of a shift register inside the gate driver in the first embodiment.

FIG. 5 is a block diagram depicting a configuration of the shift register 40 inside the gate driver 400. As mentioned above, the shift register 40 is constituted by n number of unit circuits SR1 to SRn. In the present embodiment, in the shift register 40, two gate start pulse signals (a first gate start pulse signal ST1 and a second gate start pulse signal ST2) and gate clock signals having three phases are supplied as the gate control signal GC. In the present description, it is assumed that the gate clock signals having three phases are made up of a first gate clock signal CK1, a second gate clock signal CK2, and a third gate clock signal CK3. An input terminal for receiving a clock signal CKa (hereinafter referred to as a "first clock"), an input terminal for receiving a clock signal clock signal CKb (hereinafter referred to as a "second clock"), an input terminal for receiving a clock signal CKc (hereinafter referred to as a "third clock"), an input terminal for receiving a first input signal IN1, an input terminal for receiving a second input signal IN2, and an output terminal for outputting a scanning signal O are provided in each unit circuit. It should be noted that the gate clock signals alternately repeat a high-level power source potential VDD and a low-level power source potential VSS in each prescribed period.

In the present embodiment, the gate clock signals are supplied to the shift register 40 in the following manner. With regard to a first stage SR1, the first gate clock signal CK1 is supplied as the first clock CKa, the second gate clock signal CK2 is supplied as the second clock CKb, and the third gate clock signal CK3 is supplied as the third clock CKc. With regard to a second stage SR2, the second gate clock signal CK2 is supplied as the first clock CKa, the third gate clock signal CK3 is supplied as the second clock CKb, and the first gate clock signal CK1 is supplied as the third clock CKc. With regard to a third stage SR3, the third gate clock signal CK3 is supplied as the first clock CKa, the first gate clock signal CK1 is supplied as the second clock CKb, and the second gate clock signal CK2 is supplied as the third clock CKc. The same configuration as the configuration from the first stage SR1 to the third stage SR3 as described above is repeated every three stages. Furthermore, in any stage (unit circuit), a scanning signal O that is output from the prior stage is supplied as a first input signal IN1, and a scanning signal O that is output from the subsequent stage is supplied as a second input signal IN2. To paraphrase, the scanning signal O that is output from any stage is supplied to the subsequent stage as the first input signal IN1 and is also supplied to the prior stage as the second input signal IN2, as well as being supplied to the gate bus line GL. It should be noted that, with regard to the first stage SR1, the first gate start pulse signal ST1 is supplied as the first input signal IN1. Furthermore, with regard to the $n^{th}$ stage (final stage) SRn, the second gate start pulse signal ST2 is supplied as the second input signal IN2.

Here, the gate driver 400 in the present embodiment is configured such that it is possible for the scanning order of gate bus lines GL1 to GLn to be switched. Then, different operations are carried out as follows when forward direction scanning is carried out and when reverse direction scanning is carried out. It should be noted that, in the present description, regardless of the scanning order, the unit circuit corresponding to the gate bus line GL1 is defined as the first stage SR1, and the unit circuit corresponding to the gate bus line GLn is defined as the $n^{th}$ stage (final stage) SRn. Accordingly, regardless of the scanning order, the "subsequent stage" of a certain unit circuit means the unit circuit that is adjacent to the right of that certain unit circuit in FIG. 5. In the same manner, the "prior stage" of a certain unit circuit means the unit circuit that is adjacent to the left of that unit certain circuit in FIG. 5.

Figure 6:
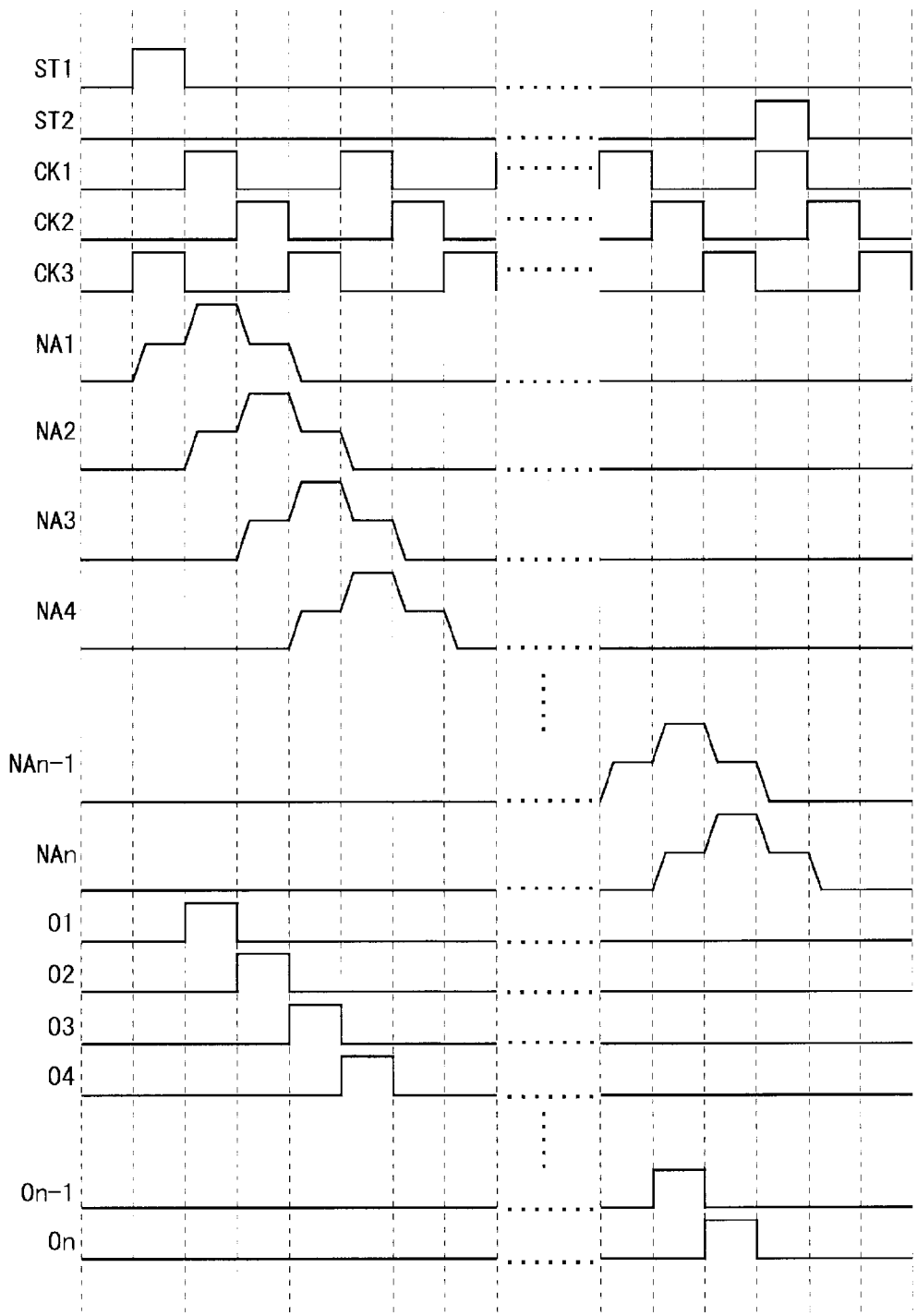
FIG. 6 is a signal waveform diagram for illustrating the operation of the gate driver performed when forward direction scanning is carried out in the first embodiment.

When forward direction scanning is carried out, the first to third gate clock signals CK1 to CK3 having waveforms as depicted in FIG. 6 are supplied to the shift register 40. The phase of the second gate clock signal CK2 is 120 degrees behind the phase of the first gate clock signal CK1, and the phase of the third gate clock signal CK3 is 120 degrees ahead of the phase of the first gate clock signal CK1. Furthermore, the first gate start pulse signal ST1 rises at a timing at which the third gate clock signal CK3 rises. Thus, based upon the rising timing of the first gate start pulse signal ST1, when forward direction scanning is carried out, pulses of the gate clock signals having three phases are generated in the order of "the third gate clock signal CK3, the first gate clock signal CK1, and the second gate clock signal CK2".

Under a premise such as the aforementioned, when a pulse of the first gate start pulse signal ST1 serving as the first input signal IN1 is supplied to the first stage SR1 of the shift register 40, based on the first to third gate clock signals CK1 to CK3, a pulse included in the first gate start pulse signal ST1 (this pulse is included in a scanning signal O that is output from each stage) is sequentially transferred from the first stage SR1 to the $n^{th}$ stage SRn. In accordance with the transfer of this pulse, scanning signals O1 to On that are output from each stage SR1 to SRn of the shift register 40 sequentially become high level. In this manner, the scanning signals O1 to On that sequentially become high level (active) in each one horizontal scanning period are supplied to the gate bus lines GL1 to GLn in the display unit 100 (see the waveforms of O1 to On of FIG. 6).

Figure 7:
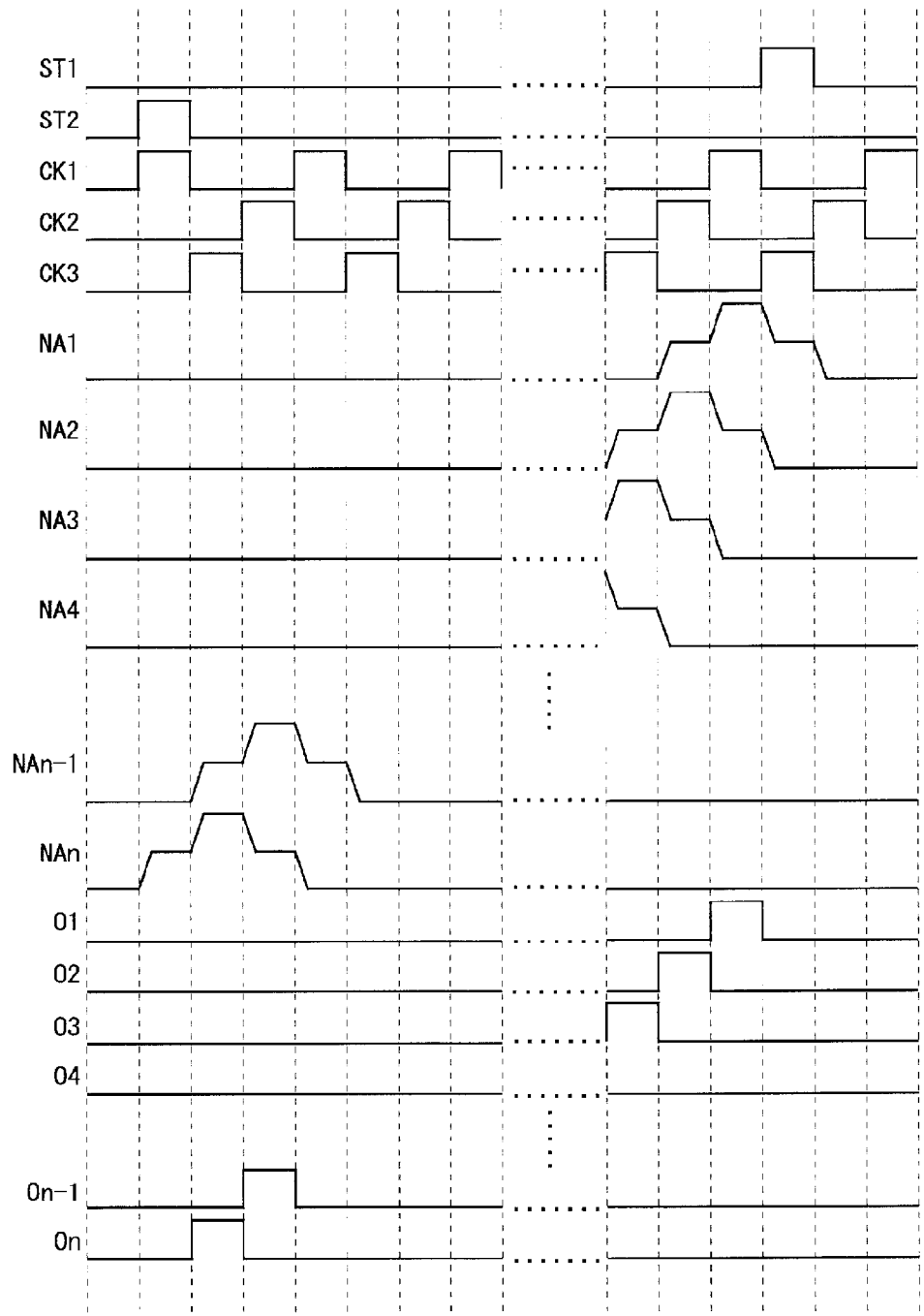
FIG. 7 is a signal waveform diagram for illustrating the operation of the gate driver performed when reverse direction scanning is carried out in the first embodiment.

When reverse direction scanning is carried out, the first to third gate clock signals CK1 to CK3 having waveforms as depicted in FIG. 7 are supplied to the shift register 40. The phase of the second gate clock signal CK2 is 120 degrees ahead of the phase of the first gate clock signal CK1, and the phase of the third gate clock signal CK3 is 120 degrees behind the phase of the first gate clock signal CK1. Furthermore, the second gate start pulse signal ST2 rises at a timing at which the first gate clock signal CK1 rises. Thus, based upon the rising timing of the second gate start pulse signal ST2, when reverse direction scanning is carried out, pulses of the gate clock signals having three phases are generated in the order of "the first gate clock signal CK1, the third gate clock signal CK3, and the second gate clock signal CK2".

Under a premise such as the aforementioned, when a pulse of the second gate start pulse signal ST2 serving as the second input signal IN2 is supplied to the $n^{th}$ stage SRn of the shift register 40, based on the first to third gate clock signals CK1 to CK3, a pulse included in the second gate start pulse signal ST2 is sequentially transferred from the $n^{th}$ stage SRn to the first stage SR1. In accordance with the transfer of this pulse, scanning signals On to O1 that are output from each stage SRn to SR1 of the shift register 40 sequentially become high level. In this manner, the scanning signals On to O1 that sequentially become high level (active) in each one horizontal scanning period are supplied to the gate bus lines GLn to GL1 in the display unit 100 (see the waveforms of O1 to On of FIG. 7).

1.3 Configuration of Unit Circuit

Figure 1:
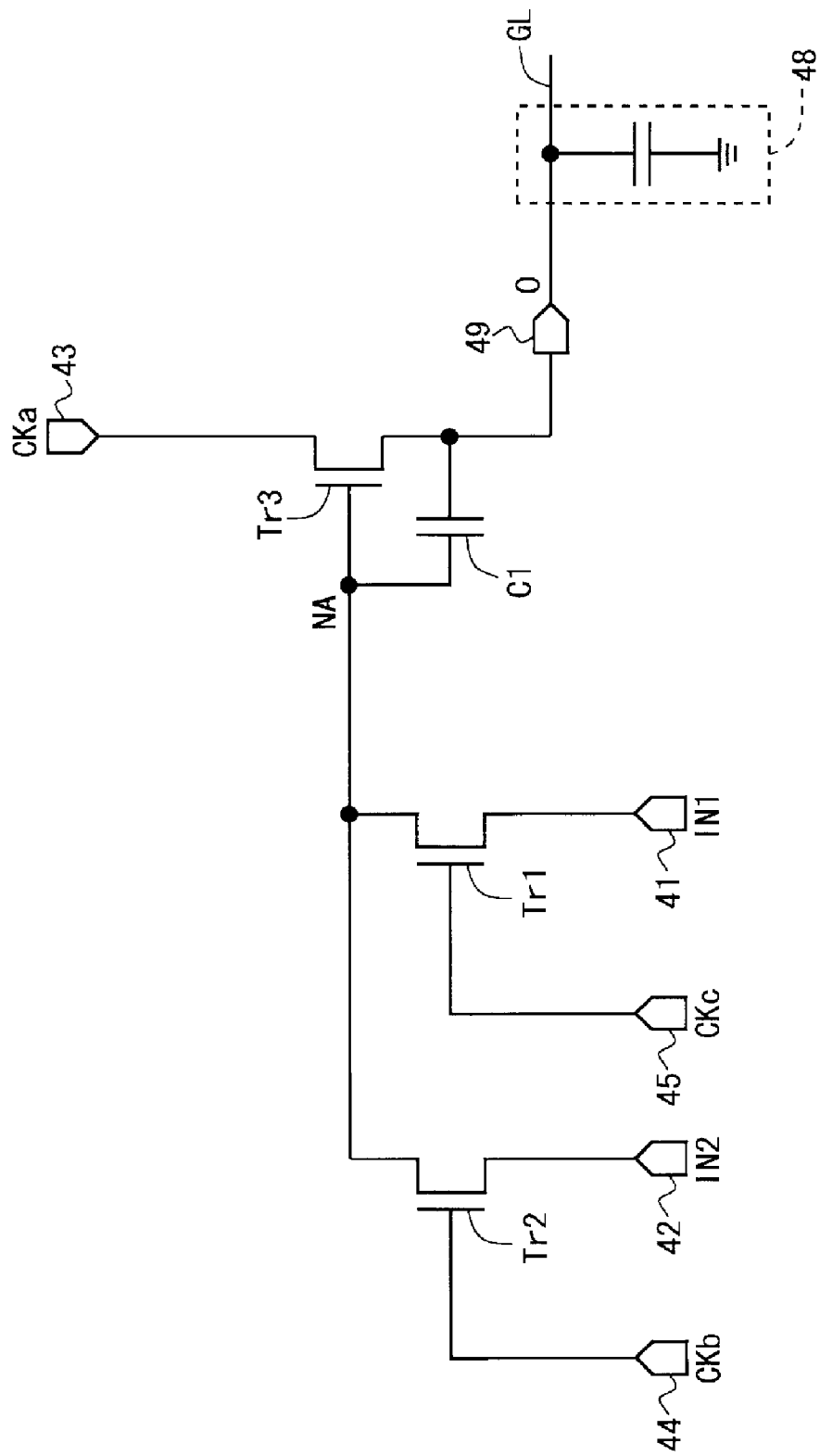
FIG. 1 is a circuit diagram depicting a configuration of a unit circuit (configuration of one stage of a shift register) in an active matrix-type liquid crystal display device according to a first embodiment of the present invention.

FIG. 1 is a circuit diagram depicting a configuration of a unit circuit (configuration of one stage of the shift register 40) in the present embodiment. As depicted in FIG. 1, this unit circuit is provided with three thin film transistors Tr1 to Tr3 and one capacitor (capacitance element) C1. Furthermore, this unit circuit has five input terminals 41 to 45 and one output terminal 49. The output terminal 49 is connected to a capacitive load (the gate bus line GL and the like). In FIG. 1, this state is represented by reference character 48. It should be noted that reference character 41 is assigned to the input terminal that receives the first input signal IN1, and reference character 42 is assigned to the input terminal that receives the second input signal IN2. Furthermore, reference character 43 is assigned to the input terminal that receives the first clock CKa, reference character 44 is assigned to the input terminal that receives the second clock CKb, and reference character 45 is assigned to the input terminal that receives the third clock CKc.

Next, the connection relationship among the constituent elements in this unit circuit will be described. The drain terminal of the thin film transistor Tr1, the drain terminal of the thin film transistor Tr2, and the gate terminal of the thin film transistor Tr3 are connected to each other. It should be noted that the region (wiring) where these are connected to each other is referred to as the "first node" for convenience. The reference character NA is assigned to this first node.

With regard to the thin film transistor Tr1, the gate terminal is connected to the input terminal 45, the drain terminal is connected to the first node NA, and the source terminal is connected to the input terminal 41. With regard to the thin film transistor Tr2, the gate terminal is connected to the input terminal 44, the drain terminal is connected to the first node NA, and the source terminal is connected to the input terminal 42. With regard to the thin film transistor Tr3, the gate terminal is connected to the first node NA, the drain terminal is connected to the input terminal 43, and the source terminal is connected to the output terminal 49. With regard to the capacitor C1, one end is connected to the first node NA and the other end is connected to the output terminal 49. To paraphrase, the capacitor C1 is provided between the gate and source of the thin film transistor Tr3.

Next, the function of each constituent element will be described. When the third clock CKc is high level, the thin film transistor Tr1 supplies the potential of the first input signal IN1 to the first node NA. When the second clock CKb is high level, the thin film transistor Tr2 supplies the potential of the second input signal IN2 to the first node NA. When the potential of the first node NA is high level, the thin film transistor Tr3 supplies the potential of the first clock CKa to the output terminal 49. The capacitor C1 functions as a compensation capacitance for maintaining the potential of the first node NA at high level during a period in which the gate bus line GL connected to this unit circuit is in a selected state (active state).

It should be noted that the first transistor is realized by the thin film transistor Tr1, the second transistor is realized by the thin film transistor Tr2, and the third transistor is realized by the thin film transistor Tr3.

1.4 Operation of Shift Register

Next, the operation of the shift register 40 in the present embodiment will be described. It should be noted that, as mentioned above, switching between forward direction scanning and reverse direction scanning is carried out in accordance with the generation order of the first to third gate clock signals CK1 to CK3 and the gate clock signal that rises when a gate start pulse signal (the first gate start pulse signal ST1 or the second gate start pulse signal ST2) rises.

1.4.1 Operation of Each Stage (Unit Circuit)

Figure 8:
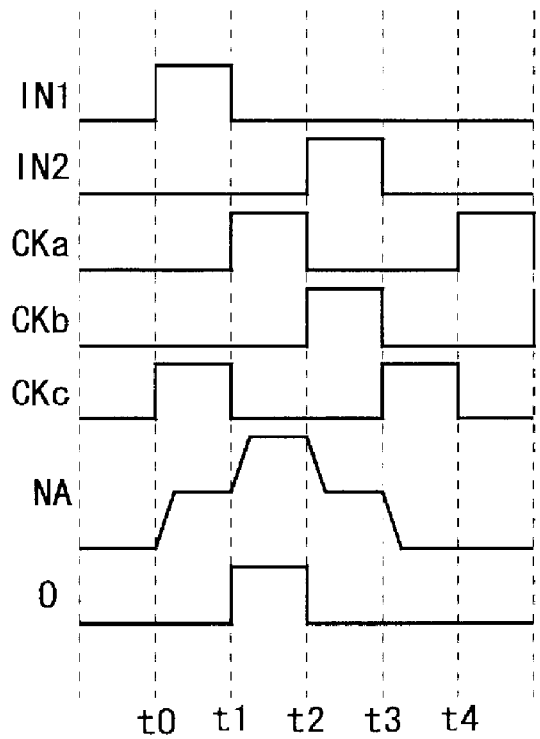
FIG. 8 is a signal waveform diagram for illustrating the operation of the unit circuit performed when forward direction scanning is carried out in the first embodiment.
Figure 9:
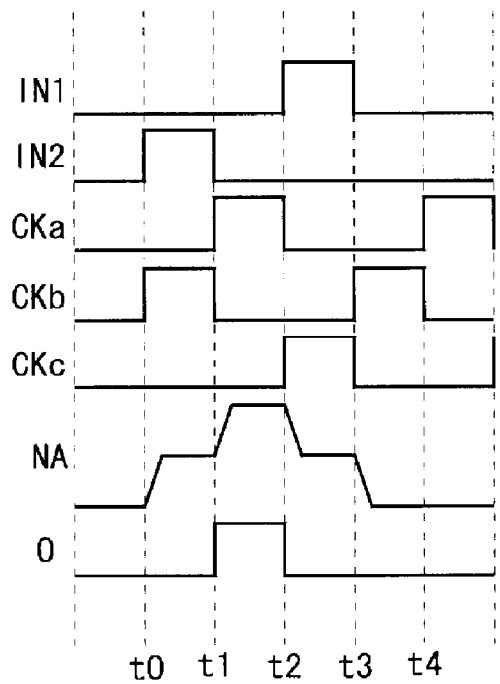
FIG. 9 is a signal waveform diagram for illustrating the operation of the unit circuit performed when reverse direction scanning is carried out in the first embodiment.

First, the operation of each stage (unit circuit) of the shift register 40 will be described with reference to FIG. 1, FIG. 8, and FIG. 9. FIG. 8 is a signal waveform diagram of when forward direction scanning is carried out, and FIG. 9 is a signal waveform diagram of when reverse direction scanning is carried out. It should be noted that, in the following description, it is assumed that the period from time t1 to time t2 of FIG. 8 and FIG. 9 is a period in which the gate bus line GL that is connected to the output terminal 49 of the unit circuit is to be put into a selected state (selected period).

1.4.1.1 Operation when Forward Direction Scanning is Carried Out

In the period prior to time t0, the potential of the first node NA and the potential of the scanning signal O (the potential of the output terminal 49) are low level. When time t0 is reached, the first input signal IN1 changes from low level to high level. Furthermore, at time t0, the third clock CKc changes from low level to high level. The thin film transistor Tr1 thereby enters an on state. Thus, the potential of the first node NA changes from low level to high level, and the first node NA enters a precharged state. As a result, the thin film transistor Tr3 enters an on state. Here, the first clock CKa is low level during the period from time t0 to time t1. Therefore, the scanning signal O is maintained at low level during this period.

When time t1 is reached, the first clock CKa changes from low level to high level. At such time, because the thin film transistor Tr3 is in an on state, the potential of the output terminal 49 (the potential of the scanning signal O) rises together with a rise in the potential of the input terminal 43. Parasitic capacitances are present between the gate and source and the gate and drain of the thin film transistor Tr3. Furthermore, the capacitor C1 is provided between the gate and source of the thin film transistor Tr3. Therefore, the potential of the first node NA also rises together with the rise in the potential of the output terminal 49 (the first node is bootstrapped). As a result, a large voltage is applied to the gate terminal of the thin film transistor Tr3, and the potential of the output terminal 49 rises to the high-level potential of the first clock CKa without a threshold voltage drop occurring. In this manner, the gate bus line GL connected to the output terminal 49 of this unit circuit enters a selected state.

When time t2 is reached, the first clock CKa changes from high level to low level. Thus, the potential of the output terminal 49 (the potential of the scanning signal O) drops to low level together with a drop in the potential of the input terminal 43. Furthermore, the potential of the first node NA also drops by way of the capacitor C1 and the parasitic capacitances between the gate and source and between the gate and drain of the thin film transistor Tr3. Furthermore, at time t2, the second input signal IN2 changes from low level to high level, and the second clock CKb changes from low level to high level. Thus, the thin film transistor Tr2 enters an on state and the second input signal IN2 becomes high level, and therefore the first node NA is maintained in a precharged state.

When time t3 is reached, the second clock CKb changes from high level to low level, and the third clock CKc changes from low level to high level. Thus, the thin film transistor Tr2 enters an off state, and the thin film transistor Tr1 enters an on state. Furthermore, the first input signal IN1 is low level during the period from time t3 to time t4. The potential of the first node NA thereby becomes low level during this period.

1.4.1.2 Operation when Reverse Direction Scanning is Carried Out

In the period prior to time t0, the potential of the first node NA and the potential of the scanning signal O (the potential of the output terminal 49) are low level. When time t0 is reached, the second input signal IN2 changes from low level to high level. Furthermore, at time t0, the second clock CKb changes from low level to high level. The thin film transistor Tr2 thereby enters an on state. Thus, the potential of the first node NA changes from low level to high level, and the first node NA enters a precharged state. As a result, the thin film transistor Tr3 enters an on state. Here, the first clock CKa is low level during the period from time t0 to time t1. Therefore, the scanning signal O is maintained at low level during this period.

When time t1 is reached, the first clock CKa changes from low level to high level. At such time, because the thin film transistor Tr3 is in an on state, the potential of the output terminal 49 (the potential of the scanning signal O) rises together with a rise in the potential of the input terminal 43. Parasitic capacitances are present between the gate and source and the gate and drain of the thin film transistor Tr3. Furthermore, the capacitor C1 is provided between the gate and source of the thin film transistor Tr3. Therefore, the potential of the first node NA also rises together with the rise in the potential of the output terminal 49 (the first node is bootstrapped). As a result, a large voltage is applied to the gate terminal of the thin film transistor Tr3, and the potential of the output terminal 49 rises to the high-level potential of the first clock CKa without a threshold voltage drop occurring. In this manner, the gate bus line GL connected to the output terminal 49 of this unit circuit enters a selected state.

When time t2 is reached, the first clock CKa changes from high level to low level. Thus, the potential of the output terminal 49 (the potential of the scanning signal O) drops to low level together with a drop in the potential of the input terminal 43. Furthermore, the potential of the first node NA also drops by way of the capacitor C1 and the parasitic capacitances between the gate and source and between the gate and drain of the thin film transistor Tr3. Furthermore, at time t2, the first input signal IN1 changes from low level to high level, and the third clock CKc changes from low level to high level. Thus, the thin film transistor Tr1 enters an on state and the first input signal IN1 becomes high level, and therefore the first node NA is maintained in a precharged state.

When time t3 is reached, the third clock CKc changes from high level to low level, and the second clock CKb changes from low level to high level. Thus, the thin film transistor Tr1 enters an off state, and the thin film transistor Tr2 enters an on state. Furthermore, the second input signal IN2 is low level during the period from time t3 to time t4. The potential of the first node NA thereby becomes low level during this period.

1.4.2 Overall Operation of Shift Register

Next, the overall operation of the shift register based on the operations in each of the aforementioned stages (unit circuits) will be described with reference to FIG. 1 and FIG. 5 to FIG. 7. FIG. 6 is a signal waveform diagram of when forward direction scanning is carried out, and FIG. 7 is a signal waveform diagram of when reverse direction scanning is carried out. It should be noted that, in relation to FIG. 6 and FIG. 7, NAi means the first node NA of the $i^{th}$ stage of the shift register 40, and Oi means the scanning signal that is output from the $i^{th}$ stage of the shift register 40 (i is an integer that is equal to or greater than 1 and equal to or less than n).

1.4.2.1 Operation when Forward Direction Scanning is Carried Out

The overall operation of the shift register when forward direction scanning is carried out will be described. First, when the first gate start pulse signal ST1 and the third gate clock signal CK3 rise, a first node NA1 of the first stage SR1 is precharged due to the shift register 40 being configured as depicted in FIG. 5. Next, when the first gate clock signal CK1 rises, the potential of the first node NA1 of the first stage SR1 greatly rises due to a bootstrap effect. As a result, the potential of a scanning signal O1, which is output from the first stage SR1, rises to a high-level power source potential VDD at which a threshold voltage drop is not occurring. Furthermore, at such time, a first node NA2 of the second stage SR2 is precharged.

Thereafter, when the second gate clock signal CK2 rises, the potential of a scanning signal O2, which is output from the second stage SR2, rises to the high-level power source potential VDD at which a threshold voltage drop is not occurring. At such time, a first node NA3 of the third stage SR3 is precharged. Furthermore, at such time, the potential of the first node NA1 of the first stage SR1 drops because the first gate clock signal CK1 falls.

Thereafter, when the third gate clock signal CK3 rises, the potential of a scanning signal O3, which is output from the third stage SR3, rises to the high-level power source potential VDD at which a threshold voltage drop is not occurring. At such time, a first node NA4 of a fourth stage SR4 is precharged. Furthermore, at such time, the potential of the first node NA1 of the first stage SR1 drops to low level. In addition, at such time, the potential of the first node NA2 of the second stage SR2 drops because the second gate clock signal CK2 falls.

The operation as described above repeats, and, together with the potentials of the first nodes NA1 to NAn of the first stage SR1 to the n$^{th}$ stage SRn greatly rising in a sequential manner due to a bootstrap effect, the scanning signals O1 to On, which are output from the first stage SR1 to the n$^{th}$ stage SRn, sequentially become high level in each prescribed period. It should be noted that, as understood from FIG. 6, when assuming that a unit circuit has been added to the stage subsequent to the n$^{th}$ stage (final stage), a signal corresponding to the scanning signal that is output from that added unit circuit may be supplied to the n$^{th}$ stage as the second gate start pulse signal ST2.

1.4.2.2 Operation when Reverse Direction Scanning is Carried Out

The overall operation of the shift register when reverse direction scanning is carried out will be described. First, when the second gate start pulse signal ST2 and the first gate clock signal CK1 rise, a first node NAn of the n$^{th}$ stage SRn is precharged due to the shift register 40 being configured as depicted in FIG. 5. Next, when the third gate clock signal CK3 rises, the potential of the first node NAn of the n$^{th}$ stage SRn greatly rises due to a bootstrap effect. As a result, the potential of a scanning signal On, which is output from the n$^{th}$ stage SRn, rises to the high-level power source potential VDD at which a threshold voltage drop is not occurring. Furthermore, at such time, a first node NAn−1 of an n−1$^{th}$ stage SRn−1 is precharged.

Thereafter, when the second gate clock signal CK2 rises, the potential of a scanning signal On−1, which is output from the n−1$^{th}$ stage SRn−1, rises to the high-level power source potential VDD at which a threshold voltage drop is not occurring. At such time, a first node NAn−2 of an n−2$^{th}$ stage SRn−2 is precharged (not depicted). Furthermore, at such time, the potential of the first node NAn of the n$^{th}$ stage SRn drops because the third gate clock signal CK3 falls.

Thereafter, when the first gate clock signal CK1 rises, the potential of a scanning signal On−2, which is output from the n−2$^{th}$ stage SRn−2, rises to the high-level power source potential VDD at which a threshold voltage drop is not occurring (not depicted). At such time, a first node NAn−3 of an n−3$^{th}$ stage SRn−3 is precharged (not depicted). Furthermore, at such time, the potential of the first node NAn of the n$^{th}$ stage SRn drops to low level. In addition, at such time, the potential of the first node NAn−1 of the n−1$^{th}$ stage SRn−1 drops because the second gate clock signal CK2 falls.

The operation as described above repeats, and, together with the potentials of the first nodes NAn to NA1 of the n$^{th}$ stage SRn to the first stage SR1 greatly rising in a sequential manner due to a bootstrap effect, the scanning signals On to O1, which are output from the n$^{th}$ stage SRn to the first stage SR1 sequentially become high level in each prescribed period. It should be noted that, as understood from FIG. 7, when assuming that a unit circuit has been added to the stage prior to the first stage, a signal corresponding to a scanning signal that is output from that added unit circuit may be supplied to the first stage as the first gate start pulse signal ST1.

1.5 Effects

According to the present embodiment, with regard to the shift register 40, which operates based on the clock signals having three phases (the first gate clock signal CK1 to the third gate clock signal CK3), each stage (unit circuit) is configured of: the thin film transistor Tr3, which has a drain terminal to which one of the clock signals having three phases is supplied as the first clock CKa and a source terminal connected to the output terminal 49; the thin film transistor Tr1, which has a gate terminal to which another one of the clock signals having three phases is supplied as the third clock CKc and a source terminal to which a scanning signal (the first input signal IN1) that is output from the prior stage is supplied; and the thin film transistor Tr2, which has a gate terminal to which the remaining one of the clock signals having three phases is supplied as the second clock CKb and a source terminal to which a scanning signal (the second input signal IN2) that is output from the subsequent stage is supplied. Furthermore, the drain terminal of the thin film transistor Tr1, the drain terminal of the thin film transistor Tr2, and the gate terminal of the thin film transistor Tr3 are connected to each other by a certain region (the first node NA). Here, focusing on three successive stages in the shift register 40, the gate clock signals, which are supplied as the first clock CKa, the second clock CKb, and the third clock CKc, are different from each other (see FIG. 5). Because the shift register 40 is configured as described above, the scanning order of the gate bus lines GL1 to GLn can be switched by changing the generation order of pulses of the first to third gate clock signals CK1 to CK3 and the gate clock signal that rises when a gate start pulse signal (the first gate start pulse signal ST1 or the second gate start pulse signal ST2) rises. In other words, different from a conventional configuration, it becomes possible to switch the scanning order of the gate bus lines GL1 to GLn without using a signal for switching the scanning direction (a dedicated signal). Accordingly, a shift register can be realized with a simple circuit configuration.

Furthermore, only one thin film transistor is present between the gate terminal of the thin film transistor Tr3 for controlling the output of the scanning signal O and the input terminals 41 and 42 to which input signals (the first input signal IN1 and the second input signal IN2) are supplied. In such a configuration, in the first node NA connected to the gate terminal of the thin film transistor Tr3, after having been precharged, the potential greatly rises due to a bootstrap effect caused by the presence of the parasitic capacitances of the thin film transistor Tr3 and the rise in the potential of the first clock CKa. Thus, it becomes possible for a high-level potential of a clock signal to be output without change from the output terminal 49 without a threshold voltage drop occurring. Therefore, the occurrence of an operation failure caused by a threshold voltage drop is suppressed.

Thus, according to the present embodiment, a shift register with which it is possible to switch the scanning order of gate bus lines and the occurrence of an erroneous operation caused by a threshold voltage drop can be prevented is able to be realized with a simple configuration.

1.6 Modification Examples

1.6.1 First Modification Example

Figure 10:
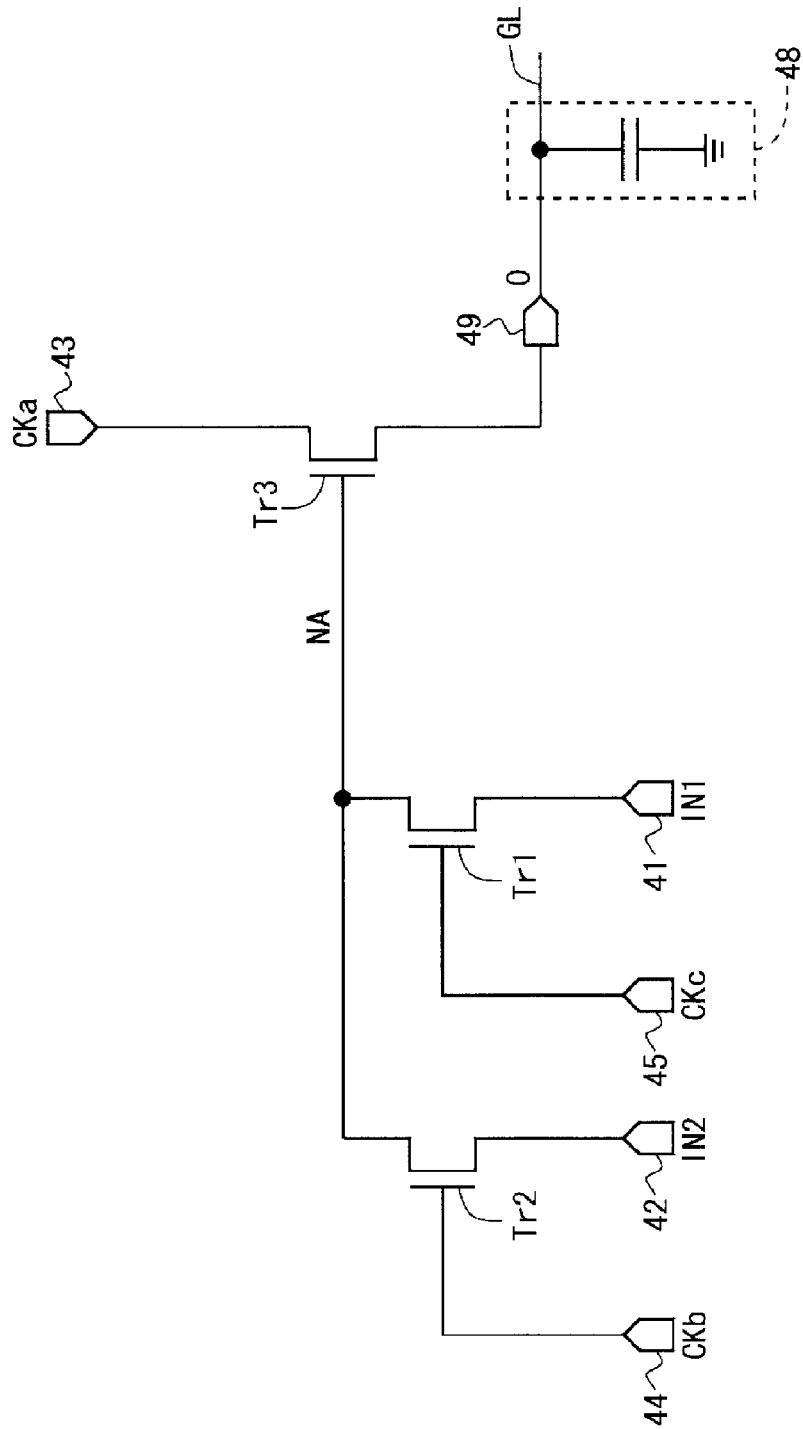
FIG. 10 is a circuit diagram depicting a configuration of the unit circuit in a first modification example of the first embodiment.

FIG. 10 is a circuit diagram depicting a configuration of a unit circuit in a first modification example of the first embodiment. In the first embodiment, the capacitor C1 was provided between the gate and source of the thin film transistor Tr3; however, a configuration that does not have the capacitor C1 can also be implemented as depicted in FIG. 10. However, providing the capacitor C1 makes it possible for the potential of the first node NA to be increased to an even greater extent and to further lower the impedance of the output (the output of the scanning signal O).

1.6.2 Second Modification Example

Figure 11:
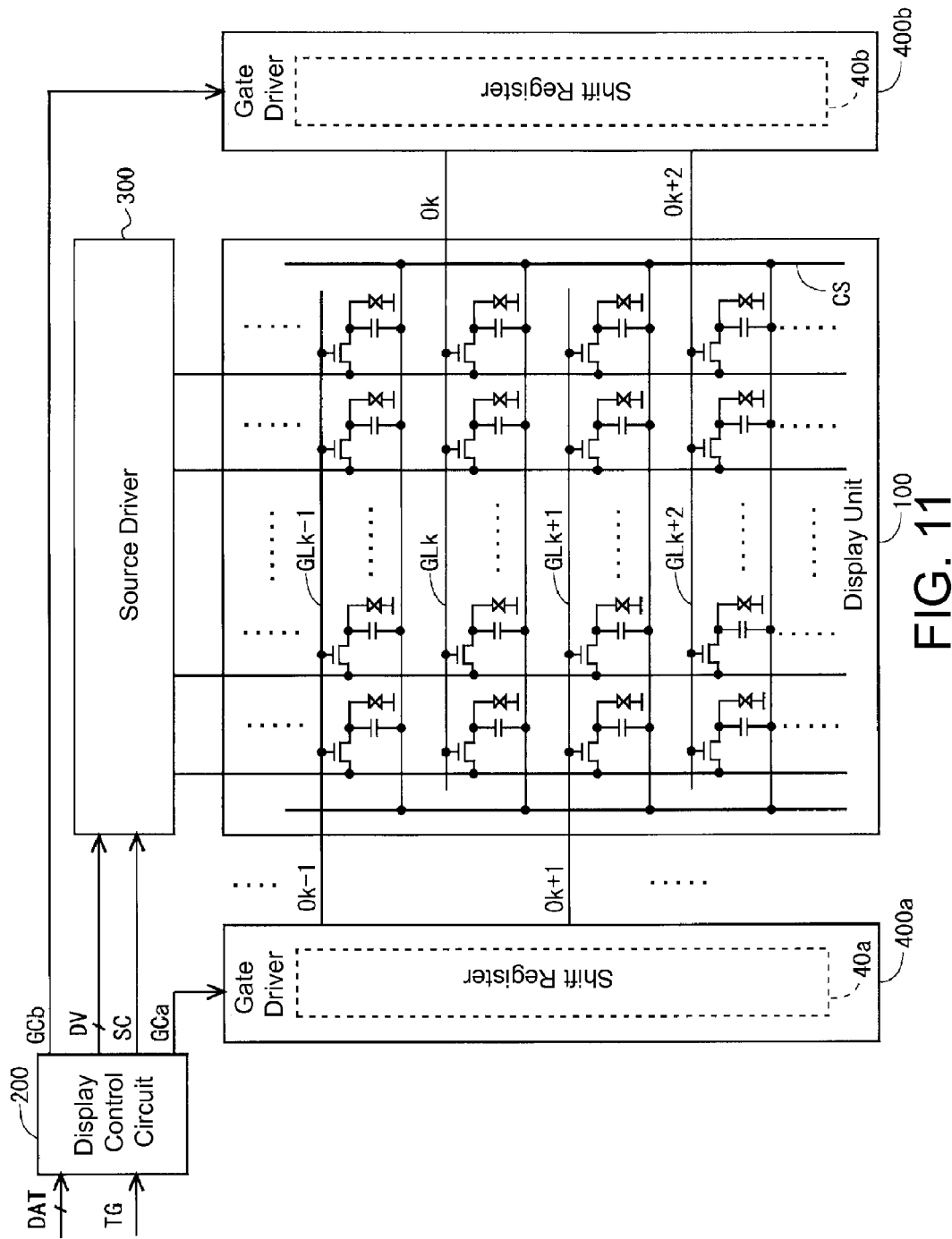
FIG. 11 is a block diagram depicting the overall configuration of the liquid crystal display device in a second modification example of the first embodiment.

FIG. 11 is a block diagram depicting the overall configuration of a liquid crystal display device in a second modification example of the first embodiment. It should be noted that only constituent elements corresponding to gate bus lines GLk−1 to GLk+2 of the k−1$^{th}$ line to the k+2$^{th}$ line are depicted in the display unit 100 of FIG. 11. In the present modification example, a gate driver 400a for driving the gate bus lines of odd-numbered rows is provided at one side of the display unit 100, and a gate driver 400b for driving the gate bus lines of even-numbered rows is provided at the other side of the display unit 100. The gate driver 400a includes a shift register 40a, and the operation of the gate driver 400a is controlled by a gate control signal GCa. The gate driver 400b includes a shift register 40b, and the operation of the gate driver 400b is controlled by a gate control signal GCb.

In the gate driver 400a, two gate start pulse signals (the first gate start pulse signal ST1 and the second gate start pulse signal ST2) and three clock signals (the first gate clock signal CK1, the third gate clock signal CK3, and a fifth gate clock signal CK5) are supplied as the gate control signal GCa. In the gate driver 400b, two gate start pulse signals (the third gate start pulse signal ST3 and a fourth gate start pulse signal ST4) and three clock signals (the second gate clock signal CK2, a fourth gate clock signal CK4, and a sixth gate clock signal CK6) are supplied as the gate control signal GCb.

Figure 12:
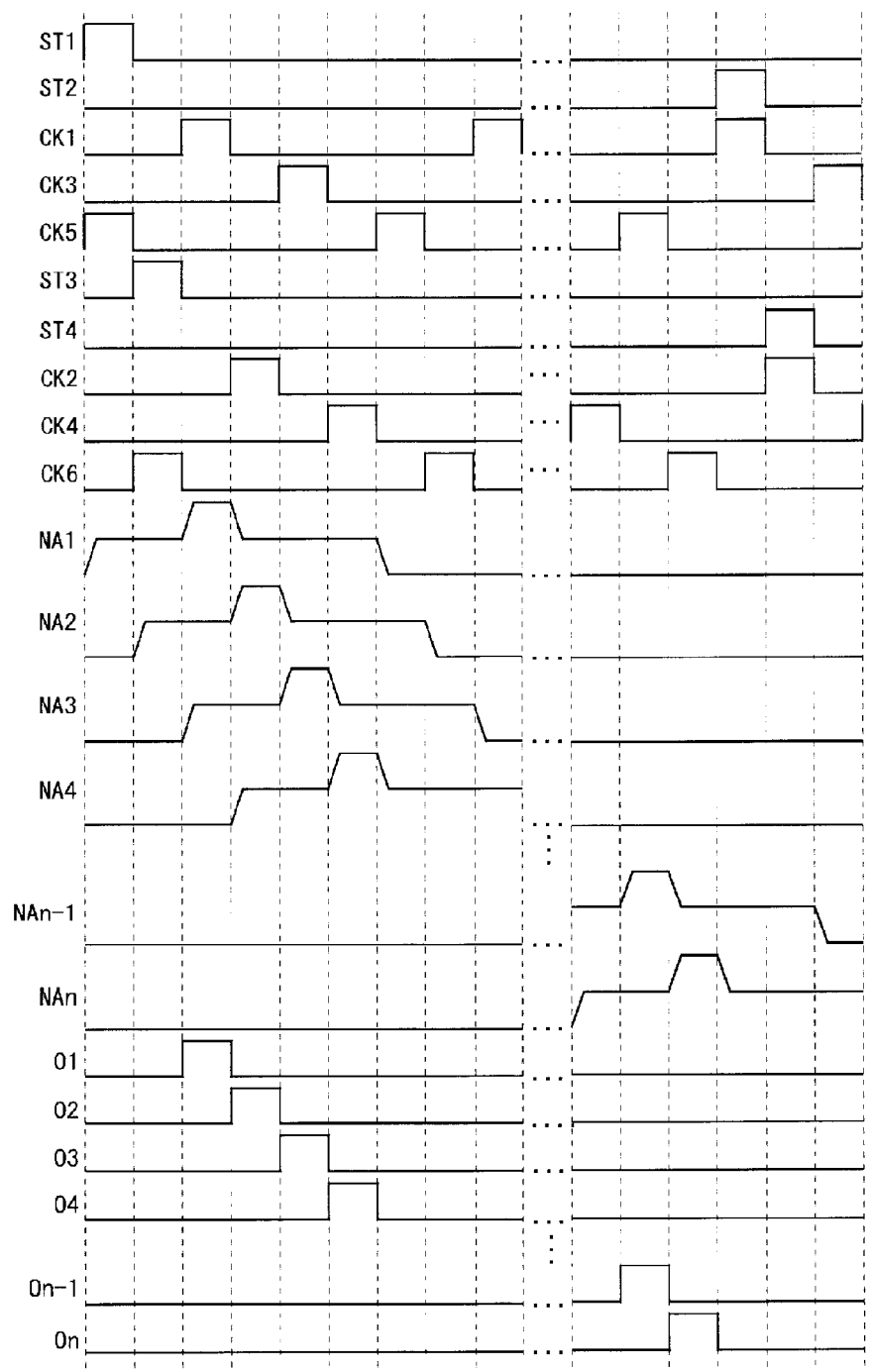
FIG. 12 is a signal waveform diagram for illustrating the operation of the gate driver in the second modification example of the first embodiment.

In the present modification example, it is necessary for the gate bus lines to be alternately put into a selected state by the gate driver 400a and the gate driver 400b. Therefore, the clock signals included in the gate control signal GCa and the clock signals included in the gate control signal GCb are alternately set to high level in each prescribed period as depicted in FIG. 12. Thus, the potentials of the first nodes NA in the unit circuits included in the shift register 40a and the potentials of the first nodes NA in the unit circuits included in the shift register 40b greatly rise in an alternating manner due to a bootstrap effect. As a result, in the same manner as in the first embodiment, the scanning signals On to O1 that sequentially become high level (active) in each one horizontal scanning period are supplied to the gate bus lines GLn to GL1 in the display unit 100 (see the waveforms of O1 to On of FIG. 12).

As described above, shift registers having a configuration in which a shift register is provided at one side and a shift register is provided at the other side of the display unit 100, with which it is possible to switch the scanning order of gate bus lines and the occurrence of an erroneous operation caused by a threshold voltage drop can be prevented, are also able to be realized with a simple configuration. Furthermore, in the present modification example, a plurality of gate bus lines constituting one half of the entirety of the gate bus lines are connected to each shift register. Therefore, a unit circuit (a circuit for one stage of a shift register) may be formed for a region that includes two gate bus lines. Accordingly, the shift register region for one side of the panel can be made smaller compared with a configuration in which a gate driver is provided only on one side of the display unit 100.

It should be noted that a configuration may be implemented in which gate drivers are provided at both one side and the other side of the display unit 100 in the same manner as in the present modification example also with regard to embodiments and modification examples other than the first embodiment.

2. Second Embodiment

2.1 Configuration, Etc.

Figure 13:
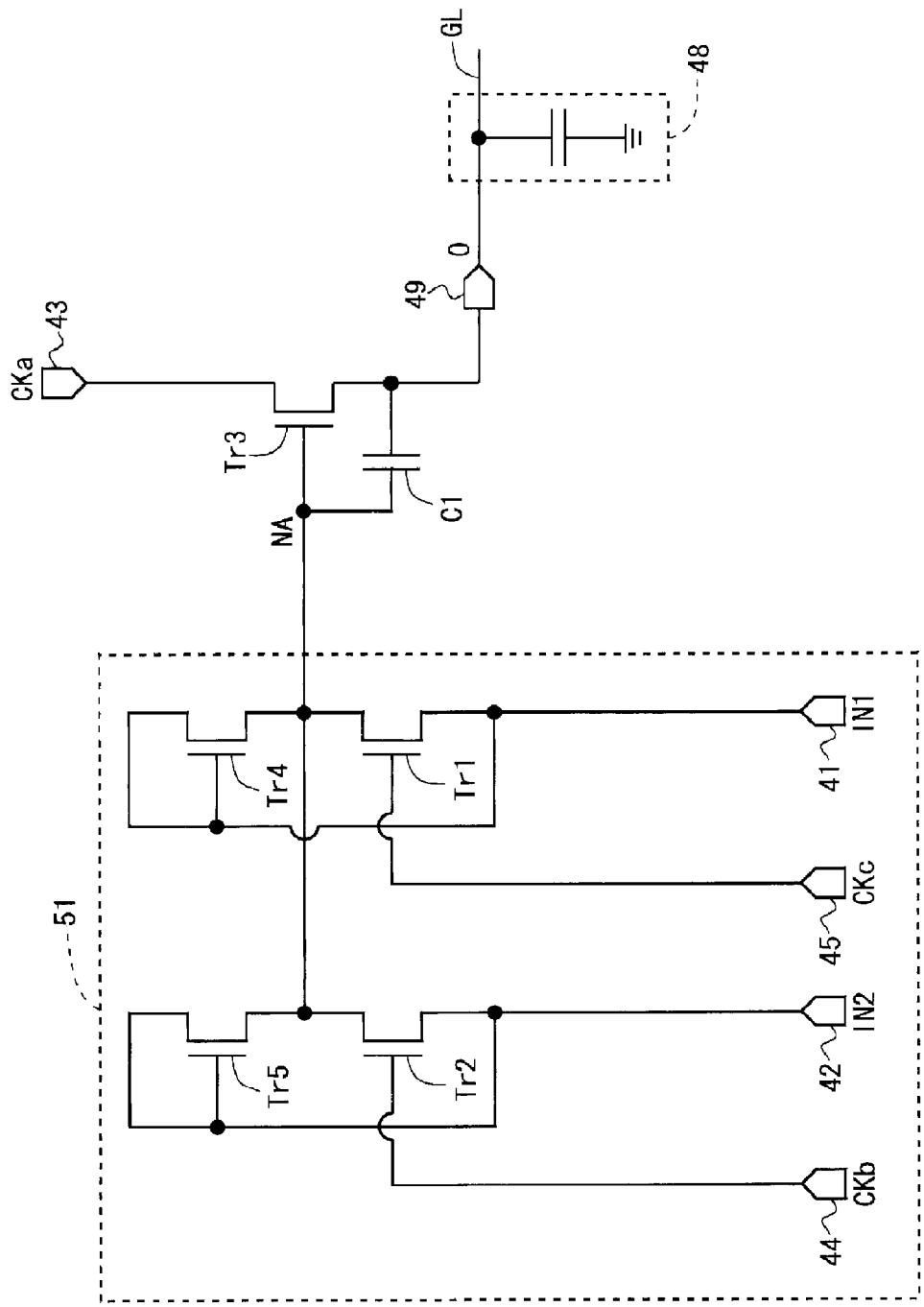
FIG. 13 is a circuit diagram depicting a configuration of a unit circuit in a second embodiment of the present invention.

A second embodiment of the present invention will be described. The overall configuration and operation of a liquid crystal display device and the configuration and operation of a gate driver are the same as in the first embodiment and a description is therefore omitted (see FIG. 2 to FIG. 7). FIG. 13 is a circuit diagram depicting a configuration of a unit circuit in the present embodiment. In the present embodiment, in a unit circuit, thin film transistors Tr4 and Tr5 are provided in addition to the constituent elements in the first embodiment depicted in FIG. 1. With regard to the thin film transistor Tr4, the gate terminal and the drain terminal are connected to an input terminal 41, and the source terminal is connected to a first node NA. With regard to the thin film transistor Tr5, the gate terminal and the drain terminal are connected to an input terminal 42, and the source terminal is connected to the first node NA. When a first input signal IN1 is high level, the thin film transistor Tr4 supplies the potential of the first input signal IN1 to the first node NA. When a second input signal IN2 is high level, the thin film transistor Tr5 supplies the potential of the second input signal IN2 to the first node NA. It should be noted that the fourth transistor is realized by the thin film transistor Tr4, and the fifth transistor is realized by the thin film transistor Tr5.

2.2 Operation of Each Stage (Unit Circuit)

Next, the operation of each stage (unit circuit) of a shift register 40 in the present embodiment will be described. In the present embodiment, the operation performed when pre-charging of the first node NA is carried out is different from in the first embodiment. Accordingly, hereinafter, the operation of a unit circuit performed when pre-charging is carried out will be described (see FIG. 8 and FIG. 9).

2.2.1 Operation when Forward Direction Scanning is Carried Out

When forward direction scanning is carried out, precharging of the first node NA is carried out in a unit circuit as follows. When a precharging start time (time t0 of FIG. 8) is reached, the first input signal IN1 changes from low level to high level. The thin film transistor Tr4 thereby enters an on state. Furthermore, a third clock CKc changes from low level to high level. The thin film transistor Tr1 thereby enters an on state. In the manner described above, the thin film transistor Tr1 and the thin film transistor Tr4 enter an on state and the first input signal IN1 becomes high level. As a result, the first node NA is precharged by way of the thin film transistors Tr1 and Tr4 on the basis of the potential of the first input signal IN1.

2.2.2 Operation when Reverse Direction Scanning is Carried Out

When reverse direction scanning is carried out, precharging of the first node NA is carried out in a unit circuit as follows. When the precharging start time (time t0 of FIG. 9) is reached, the second input signal IN2 changes from low level to high level. The thin film transistor Tr5 thereby enters an on state. Furthermore, a second clock CKb changes from low level to high level. The thin film transistor Tr2 thereby enters an on state. In the manner described above, the thin film transistor Tr2 and the thin film transistor Tr5 enter an on state and the second input signal IN2 becomes high level. As a result, the first node NA is precharged by way of the thin film transistors Tr2 and Tr5 on the basis of the potential of the second input signal IN2.

2.3 Effect

According to the present embodiment, the size of a thin film transistor can be made smaller compared with the first embodiment. This reason will be described below. With regard to the unit circuit (see FIG. 1) in the first embodiment, as mentioned above, the output terminal 49 is connected to a capacitive load (the gate bus line GL and the like). It is necessary for the size of the thin film transistor Tr3 to be made sufficiently large so that driving of that capacitive load is carried out as normal. Furthermore, the capacitor C1 is provided between the gate and source of the thin film transistor Tr3. Based on the above and taking the size of the capacitance of the first node NA into consideration, it is necessary for the sizes of the thin film transistors Tr1 and Tr2 to be made sufficiently large in order for charging to be sufficiently carried out in the first node NA. However, when the sizes of the thin film transistors Tr1 and Tr2 are made larger, the loads of the clock signal lines become larger, and there is concern that power consumption may increase. Furthermore, there is concern that normal driving may not be carried out when the load in a panel has increased due to an increase in the size of the panel.

In this regard, according to the present embodiment, the first node NA is precharged by way of the two thin film transistors Tr1 and Tr4 when forward direction scanning is performed, and the first node NA is precharged by way of the two thin film transistors Tr2 and Tr5 when reverse direction scanning is performed. Specifically, with regard to the pre-charging of the first node NA, when forward direction scanning is performed, the thin film transistor Tr4 functions as an auxiliary transistor for the thin film transistor Tr1, and the thin film transistor Tr5 functions as an auxiliary transistor for the thin film transistor Tr2. Therefore, compared with the first embodiment, it becomes possible for the sizes of the thin film transistors Tr1 and Tr2 to be made smaller. Furthermore, by making the sizes of the thin film transistors Tr1 and Tr2 smaller, it becomes possible for the loads of the clock signal lines to be made smaller. Furthermore, the thin film transistors Tr4 and Tr5 enter an on state only once in one vertical scanning period, and are therefore unlikely to deteriorate. Accordingly, it is not necessary for the sizes of the thin film transistors Tr4 and Tr5 to be made larger.

Figure 14:
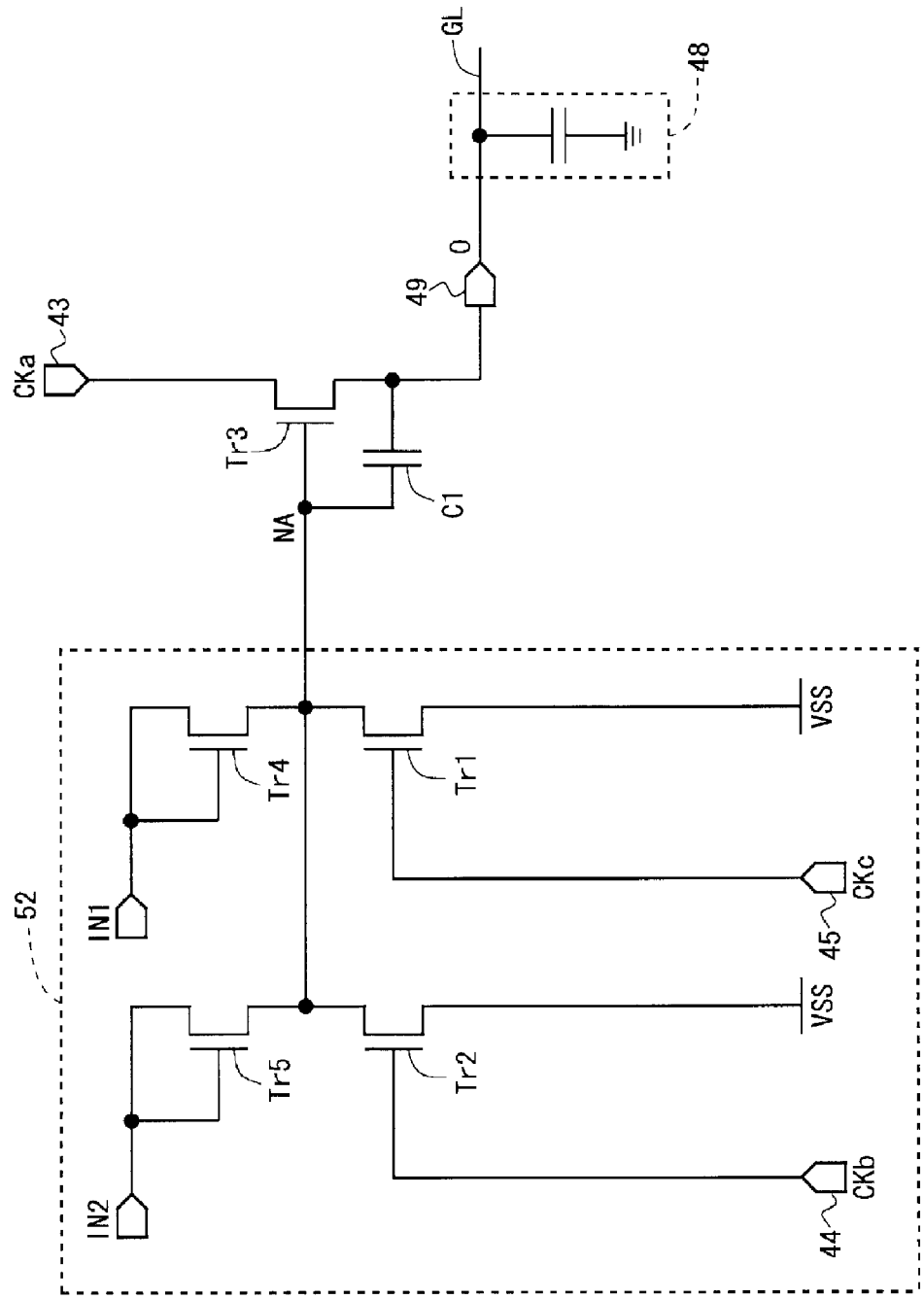
FIG. 14 is a circuit diagram depicting a configuration of the unit circuit in a comparison example of the second embodiment.

Here, it is conceivable for the portion indicated by reference character 51 in FIG. 13 to have a configuration such as that indicated by reference character 52 in FIG. 14. However, in the case of the configuration depicted in FIG. 14, when both the first input signal IN1 and the third clock CKc have become high level, or when both of the second input signal IN2 and the second clock CKb have become high level, through-current flows in the circuit. Therefore, there is concern that an erroneous operation may occur and that power consumption may increase. In this regard, according to the present embodiment, the configuration is implemented such that the first input signal IN1 is supplied to the source terminal of the thin film transistor Tr1, and the configuration is implemented such that the second input signal IN2 is supplied to the source terminal of the thin film transistor Tr2. Therefore, the generation of through-current is prevented.

2.4 Modification Example

Figure 15:
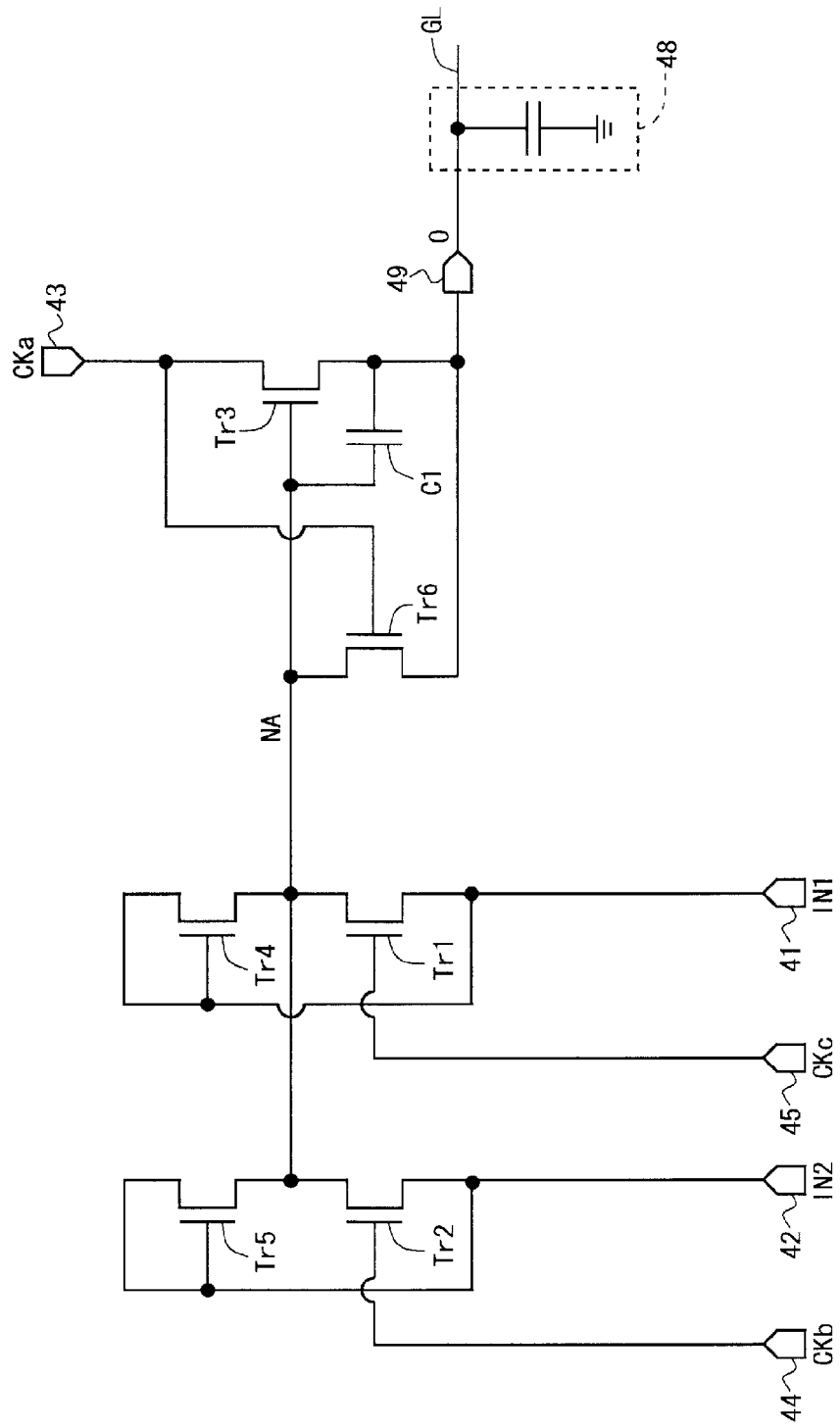
FIG. 15 is a circuit diagram depicting a configuration of the unit circuit in a modification example of the second embodiment.

FIG. 15 is a circuit diagram depicting a configuration of a unit circuit in a modification example of the second embodiment. In the second embodiment, the first node NA enters a floating state in a period in which both the second clock CKb and the third clock CKc are low level. Therefore, the potential of the first node NA rises due to the presence of the parasitic capacitances of the thin film transistor Tr3 when the first clock CKa changes from low level to high level, also in periods other than the selected period (the period between t1 and t2 of FIG. 8 and FIG. 9). When the thin film transistor Tr3 thereby enters an on state, the potential of the output terminal 49 is able to rise due to the first clock CKa being high level. Therefore, there is concern that an erroneous operation may occur.

Consequently, in the present modification example, as depicted in FIG. 15, a thin film transistor Tr6 is provided in the unit circuit. With regard to the thin film transistor Tr6, the gate terminal is connected to an input terminal 43, the drain terminal is connected to the first node NA, and the source terminal is connected to the output terminal 49. It should be noted that the sixth transistor is realized by the thin film transistor Tr6.

According to the present modification example, when the first clock CKa becomes high level, the thin film transistor Tr6 enters an on state. Thus, a conducting state is established between the first node NA and the output terminal 49 by way of the thin film transistor Tr6. With the output terminal 49 being connected to a gate bus line GL, the load of the gate bus line GL is extremely large when compared with wiring inside the unit circuit. Therefore, the effect that the presence of the parasitic capacitances of the third transistor has on the potential of the first node becomes notably smaller compared with the effect on the potential of the first node NA caused by the thin film transistor Tr6 entering an on state. As a result, when the first clock CKa has become high level in periods other than the selected period, the potential of the first node NA is brought to low level because the potential of the output terminal 49 (the potential of a scanning signal O) is low level. It should be noted that, when the first clock CKa has become high level in the selected period, an erroneous operation caused by the thin film transistor Tr6 being provided does not occur because the potential of the first node NA is high level and the potential of the output terminal 49 also becomes high level.

It should be noted that, also with regard to the first embodiment, in the same manner as in the present modification example, a configuration may be implemented in which the thin film transistor Tr6 (a thin film transistor in which the gate terminal is connected to the input terminal 43, the drain terminal is connected to the first node NA, and the source terminal is connected to the output terminal 49) is provided in the unit circuits.

3. Third Embodiment

3.1 Configuration, Etc.

A third embodiment of the present embodiment will be described. The overall configuration and operation of a liquid crystal display device and the configuration and operation of a gate driver are the same as in the first embodiment and a description is therefore omitted (see FIG.

2 to FIG. 7). It should be noted that, in the present embodiment, an initialization signal INIT is supplied from a display control circuit 200 to a gate driver 400, in addition to two gate start pulse signals (a first gate start pulse signal ST1 and a second gate start pulse signal ST2) and gate clock signals having three phases (a first gate clock signal CK1, a second gate clock signal CK2, and a third gate clock signal CK3), as a gate control signal GC. The initialization signal INIT is supplied in common to all unit circuits in a shift register 40.

Figure 16:
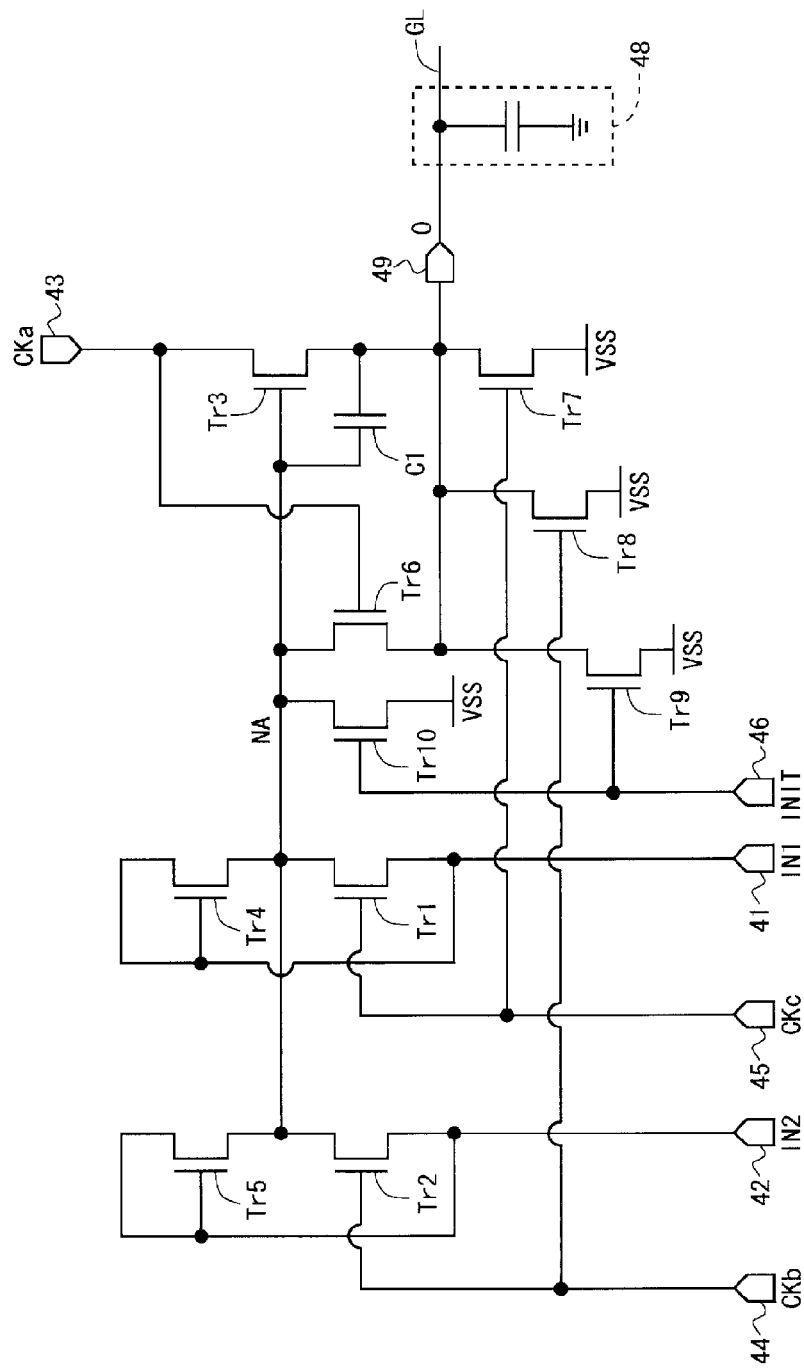
FIG. 16 is a circuit diagram depicting a configuration of a unit circuit in a third embodiment of the present invention.

FIG. 16 is a circuit diagram depicting a configuration of a unit circuit in the present embodiment. In the present embodiment, in the unit circuit, thin film transistors Tr7, Tr8, Tr9, and Tr10 and an input terminal 46 are provided in addition to the constituent elements in the modification example of the second embodiment depicted in FIG. 15. With regard to the thin film transistor Tr7, the gate terminal is connected to an input terminal 45, the drain terminal is connected to an output terminal 49, and a low-level power source potential VSS is supplied to the source terminal. With regard to the thin film transistor Tr8, the gate terminal is connected to an input terminal 44, the drain terminal is connected to the output terminal 49, and the low-level power source potential VSS is supplied to the source terminal. With regard to the thin film transistor Tr9, the gate terminal is connected to the input terminal 46, the drain terminal is connected to the output terminal 49, and the low-level power source potential VSS is supplied to the source terminal. With regard to the thin film transistor Tr10, the gate terminal is connected to the input terminal 46, the drain terminal is connected to a first node NA, and the low-level power source potential VSS is supplied to the source terminal. The initialization signal INIT is supplied to the input terminal 46. When a third clock CKc is high level, the thin film transistor Tr7 causes the potential of the output terminal 49 to change to low level. When a second clock CKb is high level, the thin film transistor Tr8 causes the potential of the output terminal 49 to change to low level. When the initialization signal INIT is high level, the thin film transistor Tr9 causes the potential of the output terminal 49 to change to low level. When the initialization signal INIT is high level, the thin film transistor Tr10 causes the potential of the first node NA to change to low level.

It should be noted that the seventh transistor is realized by the thin film transistor Tr7, the eighth transistor is realized by the thin film transistor Tr8, the ninth transistor is realized by the thin film transistor Tr9, and the tenth transistor is realized by the thin film transistor Tr10.

3.2 Operation of Each Stage (Unit Circuit)

Points that are different from the first embodiment will be described with regard to the operation of each stage (unit circuit) of the shift register 40 in the present embodiment. The initialization signal INIT is set to high level at an appropriate timing with the aim of setting the shift register 40 to an initial state, and is set to low level in periods other than that. When the initialization signal INIT is low level, the thin film transistors Tr9 and Tr10 are in an off state. When the initialization signal INIT changes from low level to high level, the thin film transistors Tr9 and Tr10 enter an on state. As a result of the thin film transistor Tr9 entering an on state, the potential of the output terminal 49 (the potential of a scanning signal O) is brought to low level. As a result of the thin film transistor Tr10 entering an on state, the potential of the first node NA is brought to low level. The unit circuits are initialized in the manner described above. Furthermore, because the initialization signal INIT is supplied in common to all unit circuits in the shift register 40 as mentioned above, the entirety of the shift register is initialized. It should be noted that, with regard to the thin film transistors Tr9 and Tr10, which function as initialization transistors, both may be provided as in the present embodiment or only either one may be provided.

Furthermore, in the present embodiment, the thin film transistor Tr8 enters an on state when the second clock CKb becomes high level, and the thin film transistor Tr7 enters an on state when the third clock CKc becomes high level. When the thin film transistor Tr8 enters an on state, the potential of the output terminal 49 is brought to low level. When the thin film transistor Tr7 enters an on state, the potential of the output terminal 49 is brought to low level. The duty cycle of the second clock CKb and the duty cycle of the third clock CKc are ⅓, and therefore the potential of the scanning signal O is brought to low level as required. It should be noted that, with regard to the thin film transistor Trs7 and Tr8 for bringing the potential of the scanning signal O to low level, both may be provided as in the present embodiment or only either one may be provided.

3.3 Effect

According to the present embodiment, the potential of the scanning signal O is brought to low level as required, even when the potential of the scanning signal O rises due to the effect of noise or the like in a period in which the potential of the scanning signal O is to be maintained at low level. Furthermore, the potential of the first node NA and the potential of the scanning signal O can be set to low level by setting the initialization signal INIT to high level at an appropriate timing. The occurrence of an erroneous operation is thereby suppressed.

3.4 Modification Examples

3.4.1 First Modification Example

Figure 17:
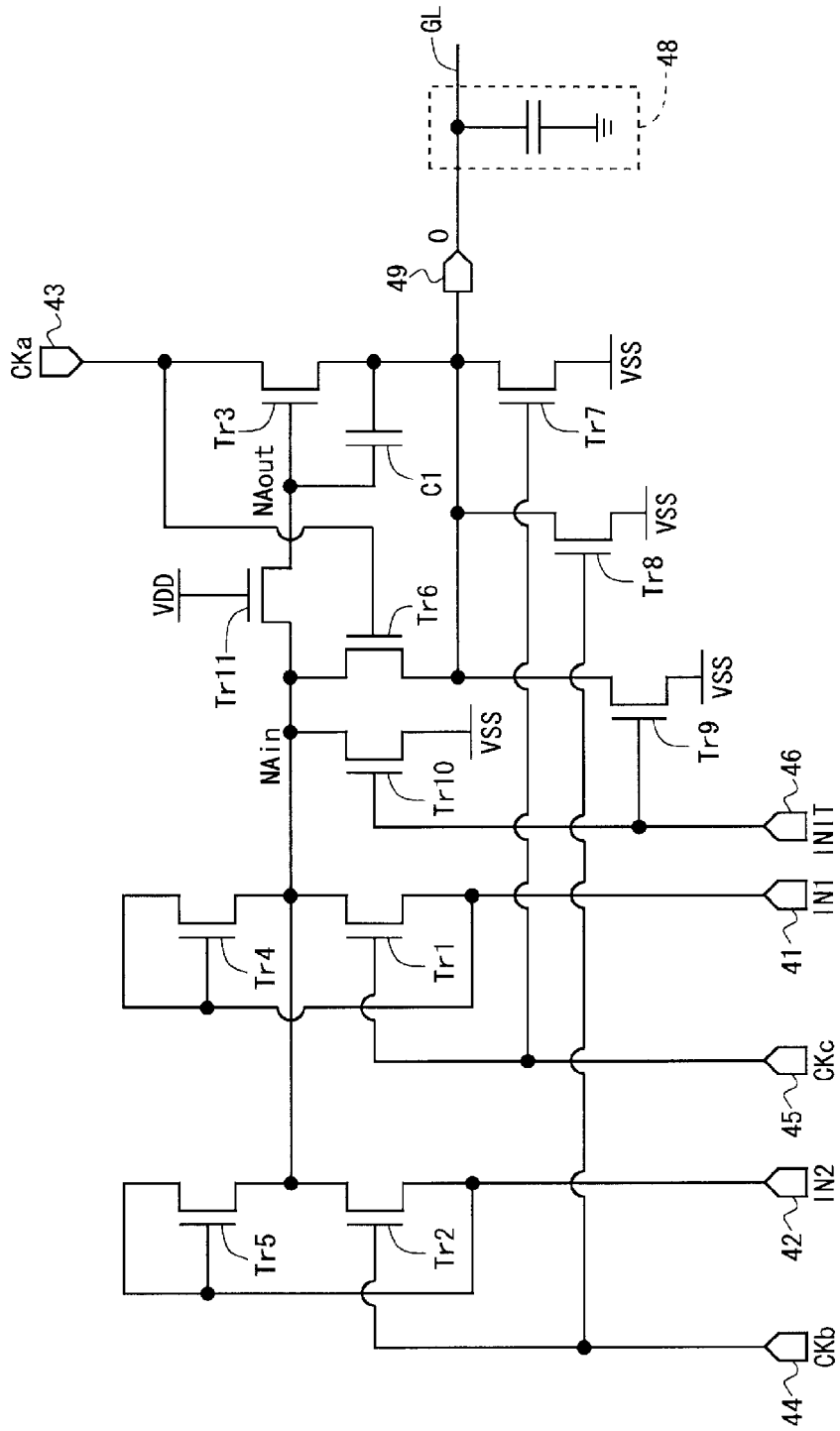
FIG. 17 is a circuit diagram depicting a configuration of the unit circuit in a first modification example of the third embodiment.

FIG. 17 is a circuit diagram depicting a configuration of a unit circuit in a first modification example of the third embodiment. In the present modification example, in the unit circuit, a thin film transistor Tr11 is provided in addition to the constituent elements in the third embodiment depicted in FIG. 16. As a result of this thin film transistor Tr11 being provided, in the present modification example, the first node NA is divided into two regions of an input-side first node NAin and an output-side first node NAout. With regard to the thin film transistor Tr11, a high-level power source potential VDD is supplied to the gate terminal, the drain terminal is connected to the input-side first node NAin, and the source terminal is connected to the output-side first node NAout. It should be noted that the eleventh transistor is realized by the thin film transistor Tr11.

As depicted in FIG. 17, the drain terminal of the thin film transistor Tr1, the drain terminal of the thin film transistor Tr2, the source terminal of the thin film transistor Tr4, the source terminal of the thin film transistor Tr5, the drain terminal of the thin film transistor Tr6, the drain terminal of the thin film transistor Tr10, and the drain terminal of the thin film transistor Tr11 are connected to each other by the input-side first node NAin. Furthermore, the gate terminal of the thin film transistor Tr3, one end of a capacitor C1, and the source terminal of the thin film transistor Tr11 are connected to each other by the output-side first node NAout.

Here, according to the configuration in the third embodiment (see FIG. 16), the potential of the first node NA greatly increases due to the aforementioned bootstrap effect in the selected period (the period between t1 and t2 of FIG. 8 and FIG. 9). Therefore, a voltage that exceeds a breakdown voltage (a voltage of a limit at which dielectric breakdown is not caused) is able to be applied between the gate and drain and between the source and drain of the thin film transistor Tr6, for example. The same is also true for the thin film transistors Tr1, Tr2, Tr4, Tr5, and Tr10. When a voltage that exceeds the breakdown voltage is applied to a thin film transistor, deterioration and breakdown of the thin film transistor is caused and circuit reliability declines. In this regard, according to the present modification example, the thin film transistor Tr11 functions as a dividing unit, and a rise in the potential of the input-side first node NAin is suppressed in the selected period. Specifically, when the threshold voltage of the thin film transistor Tr11 is taken as Vth, the potential of the input-side first node NAin in the selected period becomes "VDD-Vth". In this manner, according to the present modification example, a voltage that exceeds the breakdown voltage is prevented from being applied to the thin film transistors Tr1, Tr2, Tr4, Tr5, Tr6, and Tr10 and circuit reliability is improved.

It should be noted that a configuration may be implemented in which the thin film transistor Tr11, which functions as a dividing unit for preventing the deterioration and breakdown of a thin film transistor, may be provided in a unit circuit in the same manner as in the present modification example also with regard to embodiments and modification examples other than the third embodiment.

3.4.2 Second Modification Example

Figure 18:
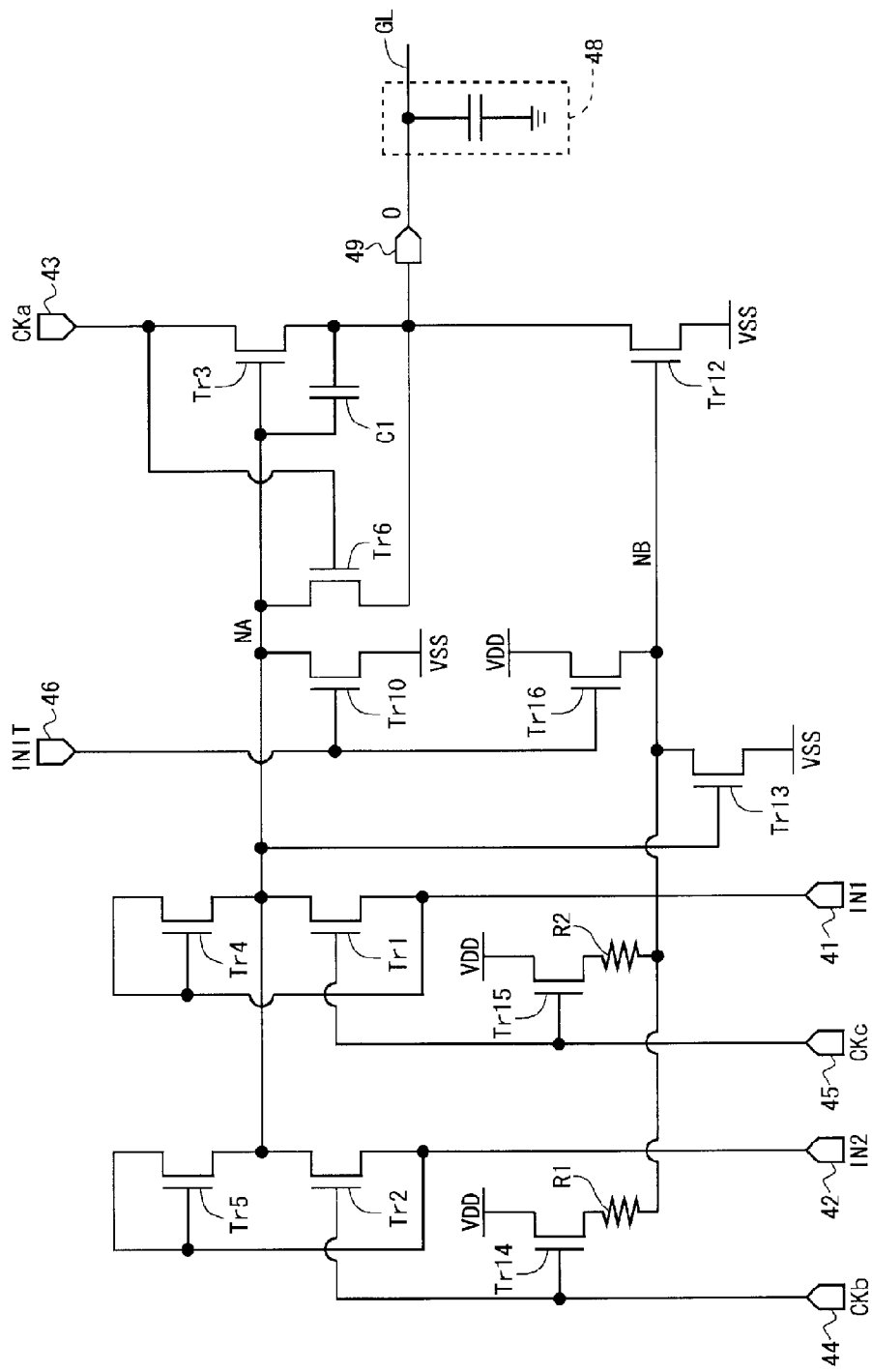
FIG. 18 is a circuit diagram depicting a configuration of the unit circuit in a second modification example of the third embodiment.

FIG. 18 is a circuit diagram depicting a configuration of a unit circuit in a second modification example of the third embodiment. In the present modification example, when compared with the configuration in the third embodiment depicted in FIG. 16, thin film transistors Tr12 to Tr16 are provided instead of the thin film transistors Tr7 to Tr9 in the unit circuit. It should be noted that the gate terminal of the thin film transistor Tr12, the drain terminal of the thin film transistor Tr13, the source terminal of the thin film transistor Tr14, the source terminal of the thin film transistor Tr15, and the source terminal of the thin film transistor Tr16 are connected to each other. The region (wiring) where these are connected to each other is referred to as a "second node" for convenience. The reference character NB is assigned to this second node.

With regard to the thin film transistor Tr12, the gate terminal is connected to the second node NB, the drain terminal is connected to the output terminal 49, and the low-level power source potential VSS is supplied to the source terminal. With regard to the thin film transistor Tr13, the gate terminal is connected to the first node NA, the drain terminal is connected to the second node NB, and the low-level power source potential VSS is supplied to the source terminal. With regard to the thin film transistor Tr14, the gate terminal is connected to the input terminal 44, the high-level power source potential VDD is supplied to the drain terminal, and the source terminal is connected to the second node NB by way of a resistance R1. With regard to the thin film transistor Tr15, the gate terminal is connected to the input terminal 45, the high-level power source potential VDD is supplied to the drain terminal, and the source terminal is connected to the second node NB by way of a resistance R2. With regard to the thin film transistor Tr16, the gate terminal is connected to the input terminal 46, the high-level power source potential VDD is supplied to the drain terminal, and the source terminal is connected to the second node NB.

It should be noted that the twelfth transistor is realized by the thin film transistor Tr12, the thirteenth transistor is realized by the thin film transistor Tr13, the fourteenth transistor is realized by the thin film transistor Tr14, and the fifteenth transistor is realized by the thin film transistor Tr15.

Here, in the third embodiment, the output terminal 49 may enter a floating state in a period in which both the second clock CKb and the third clock CKc are low level. With respect to this, in the present modification example, if the thin film transistor Tr13 enters an off state, electric charge accumulates in the second node NB during a period in which the thin film transistor Tr14 enters an on state due to the second clock CKb becoming high level, and during a period in which the thin film transistor Tr15 enters an on state due to the third clock CKc becoming high level. Thus, the thin film transistor Tr12 enters an on state also in a period in which both the second clock CKb and the third clock CKc are low level, and, as a result, the output terminal 49 is prevented from entering a floating state. The occurrence of an erroneous operation caused by noise or the like is thereby effectively suppressed. With regard to the selected period (the period between t1 and t2 of FIG. 8 and FIG. 9), because the first node NA becomes high level and the thin film transistor Tr13 enters an on state, the potential of the second node NB is brought to low level. At such time, due to the presence of the resistances R1 and R2, electric charge is not accumulated in the second node NB even when the thin film transistor Tr14 and the thin film transistor Tr15 enter an on state. Thus, in the selected period, the thin film transistor Tr12 enters an off state and the scanning signal O is output as normal. It should be noted that, with regard to the thin film transistors Tr14 and Tr15, both may be provided as in the present modification example or only either one may be provided.

Figure 19:
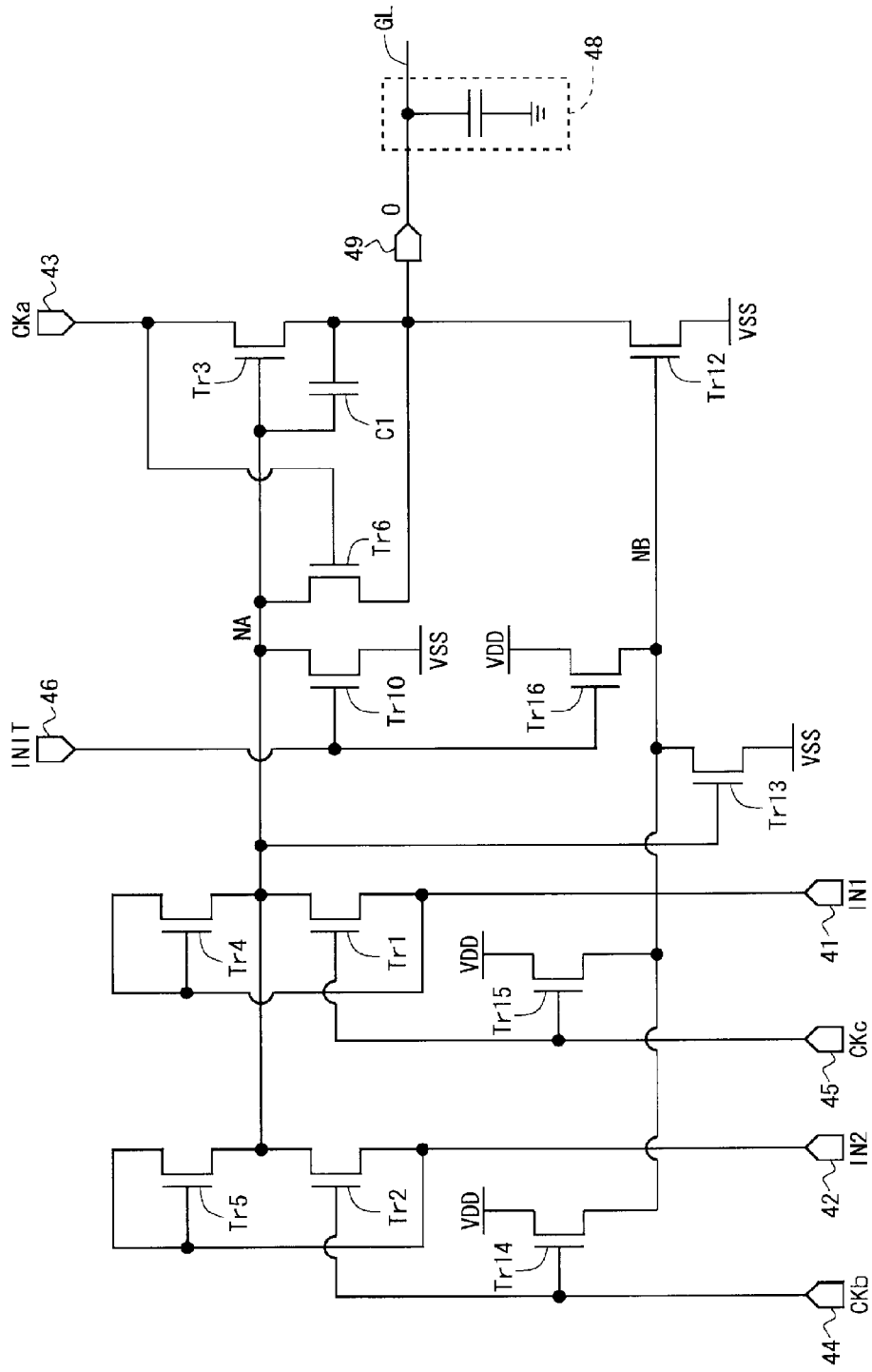
FIG. 19 is a circuit diagram depicting another configuration of the unit circuit in the second modification example of the third embodiment.
Figure 20:
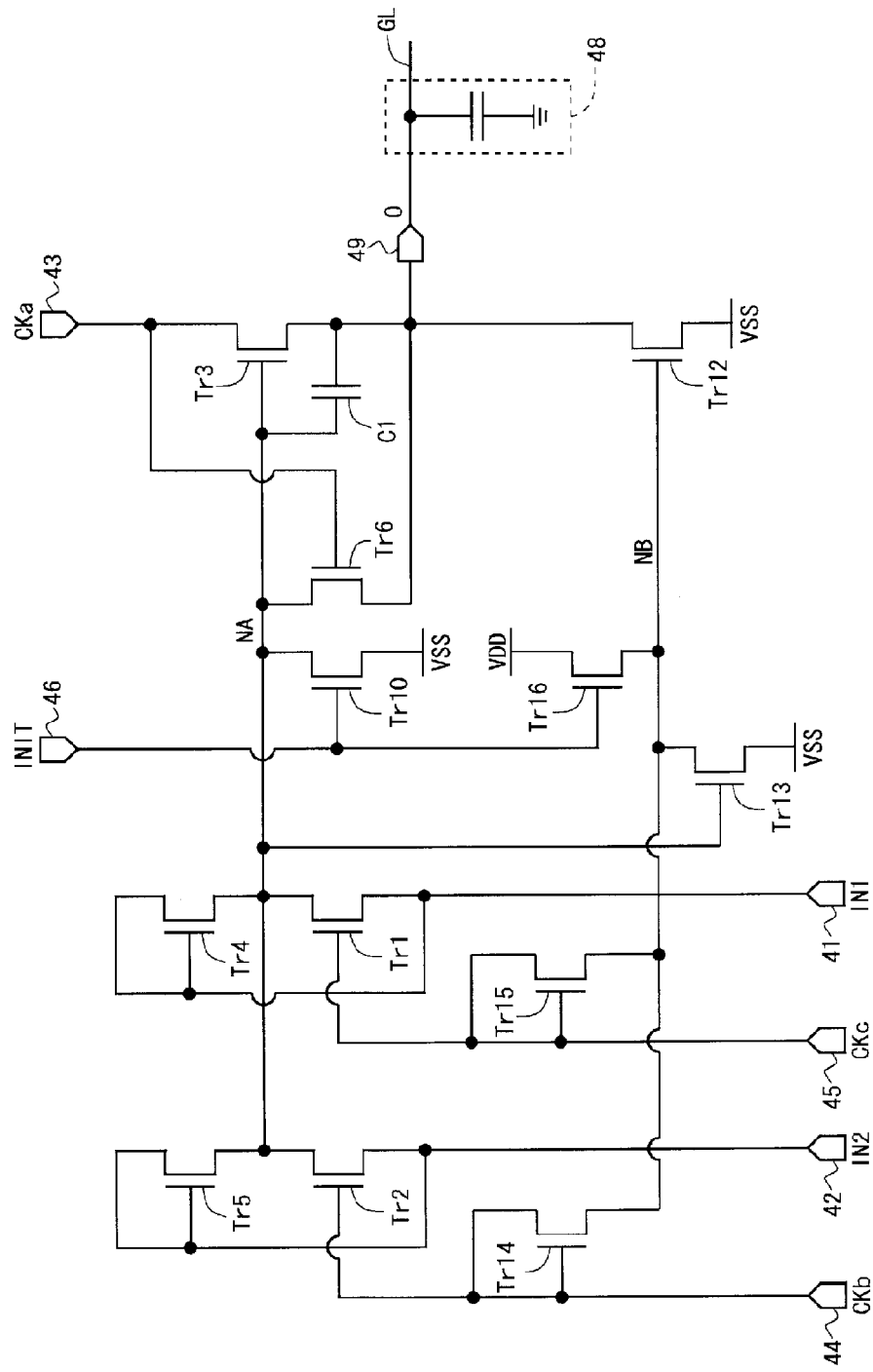
FIG. 20 is a circuit diagram depicting yet another configuration of the unit circuit in the second modification example of the third embodiment.

It should be noted that a configuration that does not have the resistances R1 and R2 as depicted in FIG. 19 may be implemented, and the sizes of the thin film transistors Tr14 and Tr15 may be made sufficiently smaller compared with the size of the thin film transistor Tr13. Furthermore, it is also possible to employ a configuration in which the thin film transistors Tr14 and Tr15 are diode-connected as depicted in FIG. 20, instead of the configuration depicted in FIG. 19.

3.4.5 Third Modification Example

Figure 21:
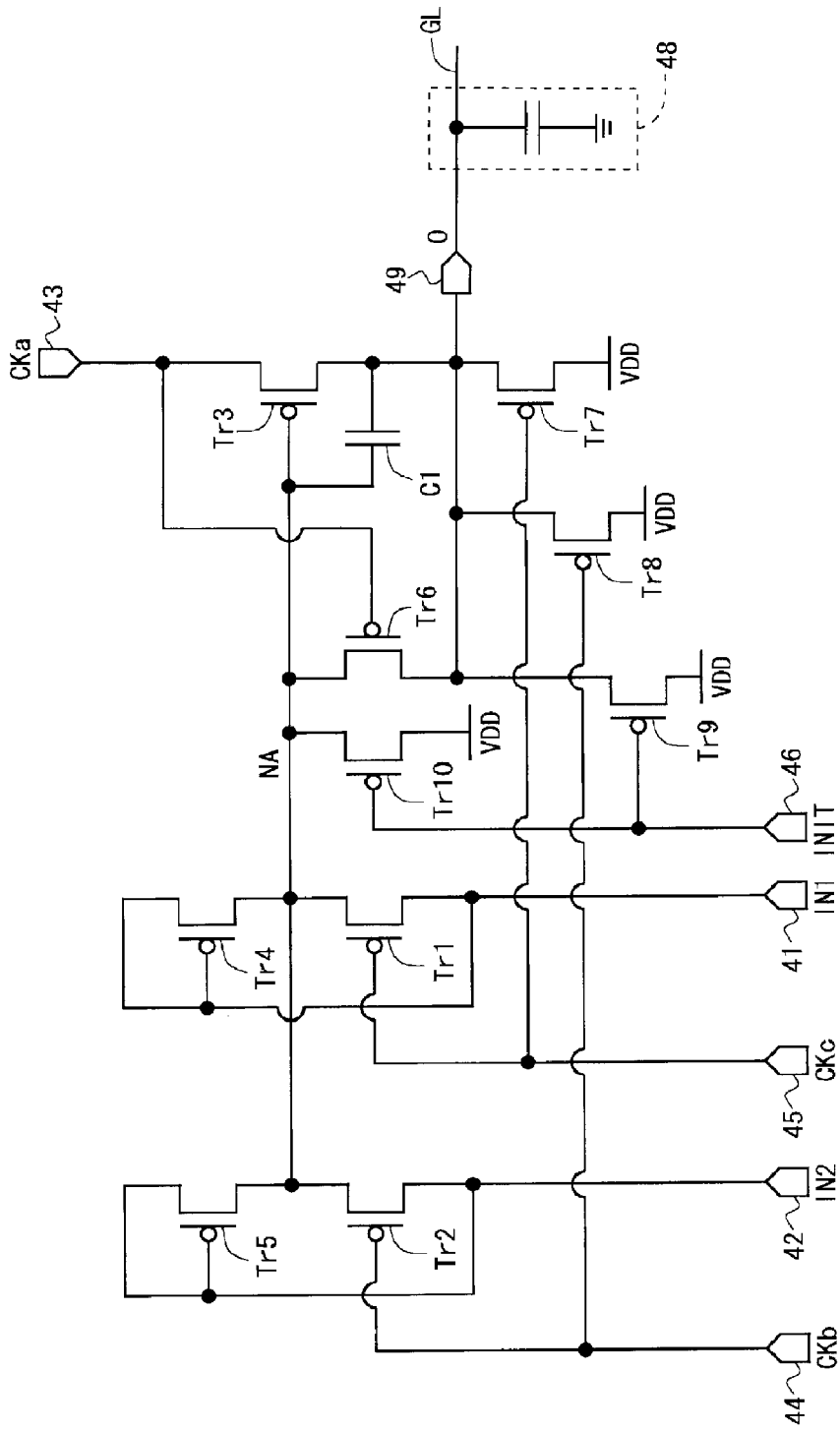
FIG. 21 is a circuit diagram depicting a configuration of the unit circuit in a third modification example of the third embodiment.
Figure 22:
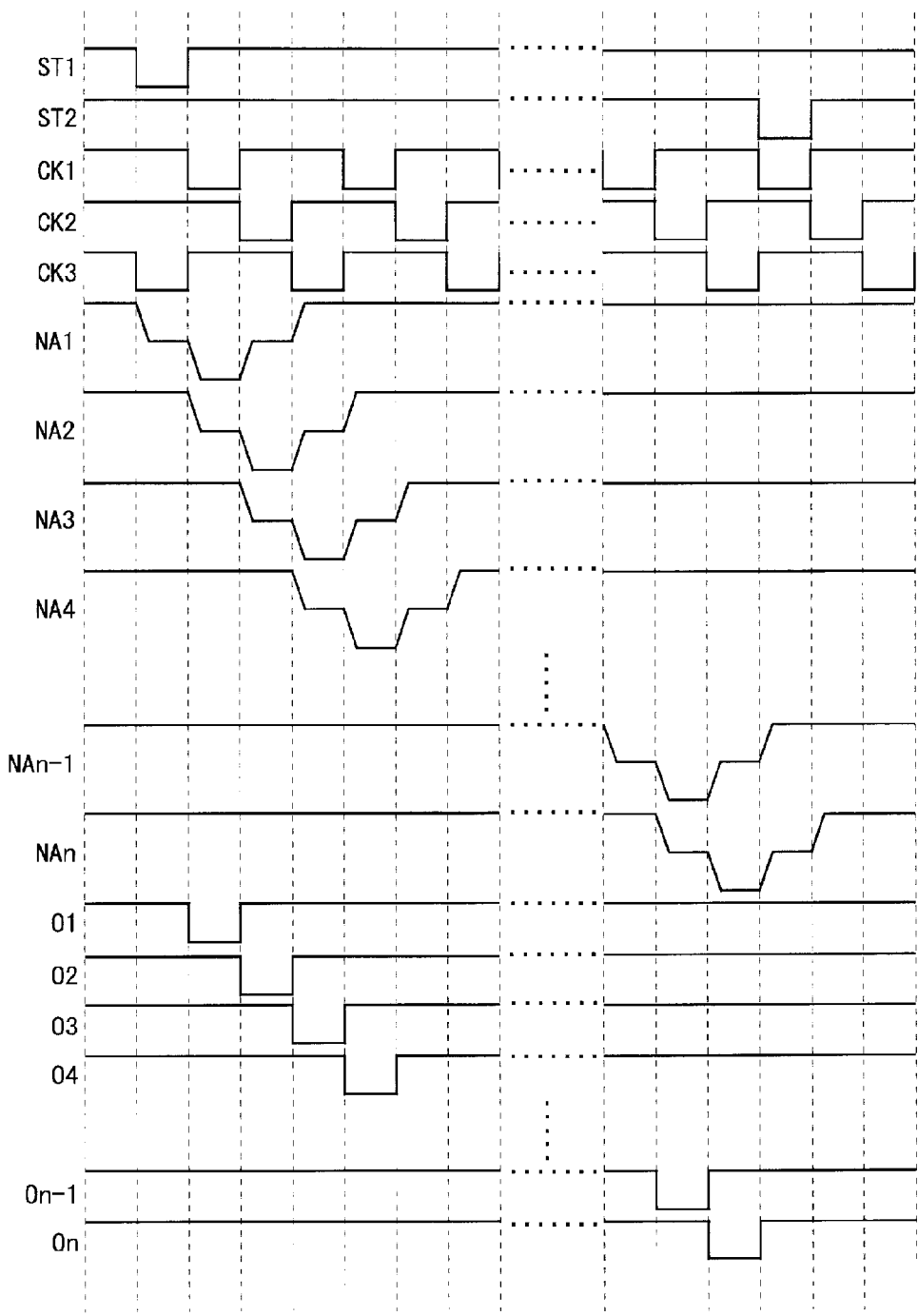
FIG. 22 is a signal waveform diagram for illustrating the operation of a gate driver performed when forward direction scanning is carried out in the third modification example of the third embodiment.
Figure 23:
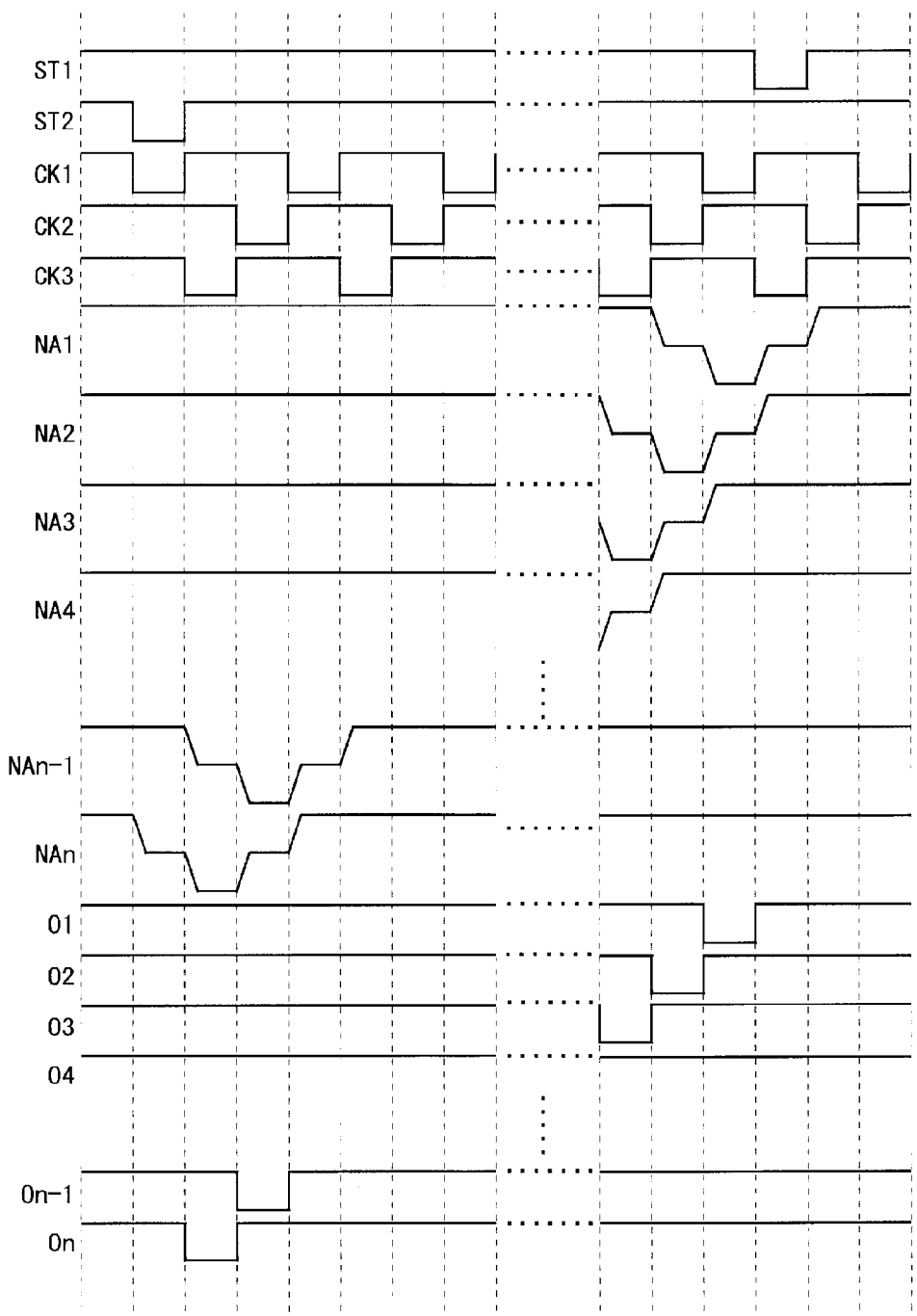
FIG. 23 is a signal waveform diagram for illustrating the operation of the gate driver performed when reverse direction scanning is carried out in the third modification example of the third embodiment.

In the third embodiment, the case where the thin film transistors inside each unit circuit are n-channel type transistors has been given as an example and described; however, the present invention is not limited thereto. If the power source potentials (VDD/VSS) and the signal clocks (high/low) are to be reversed from the third embodiment, p-channel type transistors may be employed as the thin film transistors inside each unit circuit. In the case where p-channel type transistors are to be used to realize the same circuit as the unit circuit depicted in FIG. 16, that circuit configuration will be as depicted in FIG. 21. In the case of this configuration, when forward direction scanning is carried out, as depicted in FIG. 22, together with the potentials of the first nodes NA1 to NAn of the first stage SR1 to the $n^{th}$ stage SRn greatly dropping in a sequential manner due to a bootstrap effect, the scanning signals O1 to On that are output from the first stage SR1 to the $n^{th}$ stage SRn sequentially become low level in each prescribed period. Furthermore, when reverse direction scanning is carried out, as depicted in FIG. 23, together with the potentials of the first nodes NAn to NA1 of the $n^{th}$ stage SRn to the first stage SR1 greatly dropping in a sequential manner due to a bootstrap effect, the scanning signals On to O1 that are output from the $n^{th}$ stage SRn to the first stage SR1 sequentially become low level in each prescribed period.

It should be noted that p-channel type transistors can also be employed as the thin film transistors inside each unit circuit in the same manner as in the present modification example also with regard to embodiments and modification examples other than the third embodiment.

4. Fourth Embodiment

4.1 Configuration, Etc.

A fourth embodiment of the present invention will be described. The overall configuration and operation of a liquid crystal display device, the configuration and operation of a gate driver, and the configuration of unit circuits are the same as in the first embodiment and a description is therefore omitted (see FIG. 2 to FIG. 7). However, in the present embodiment, the pulse widths of gate clock signals having three phases are twice the pulse widths in the first embodiment.

4.2 Operation of Shift Register

Figure 24:
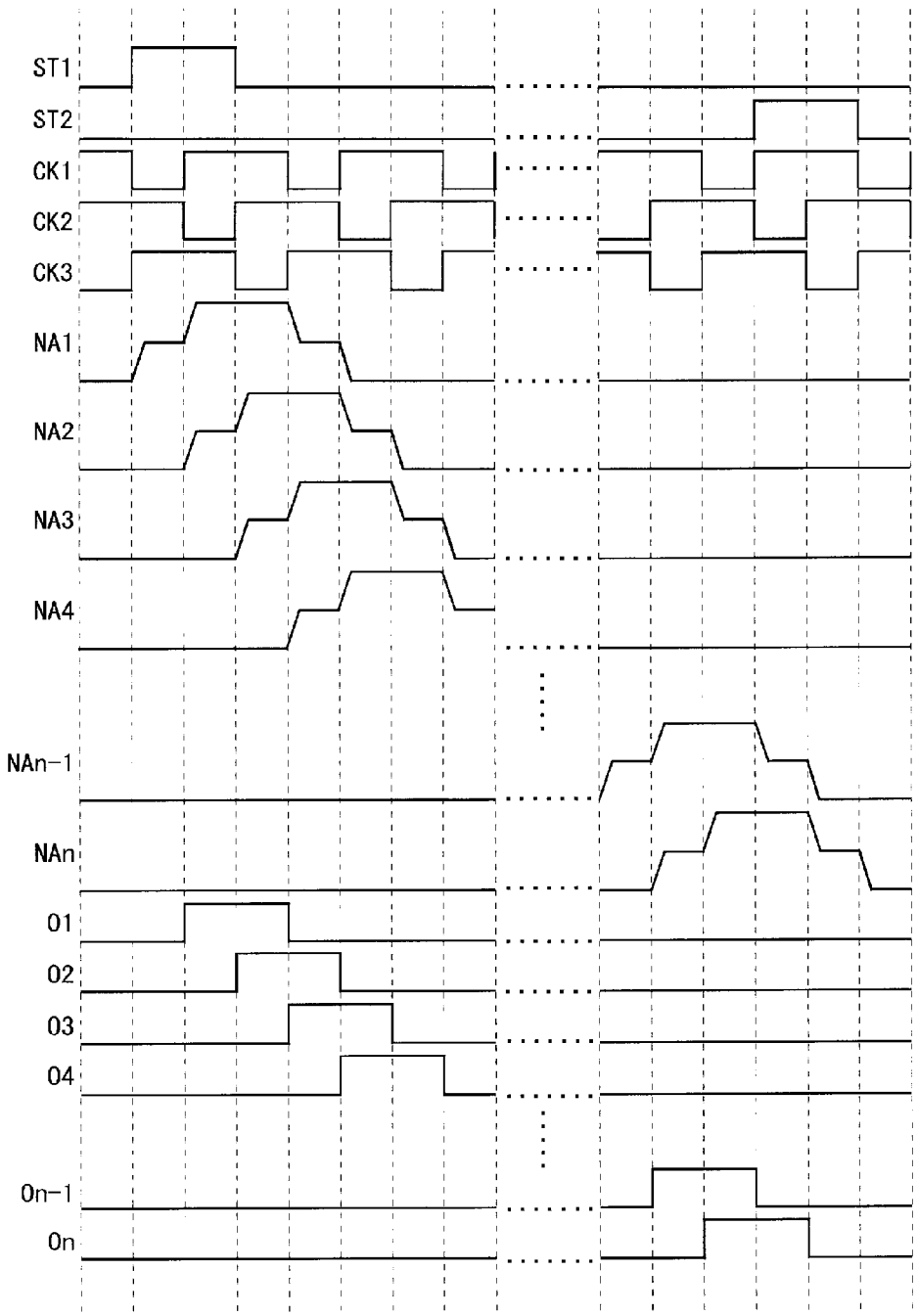
FIG. 24 is a signal waveform diagram for illustrating the operation of a gate driver performed when forward direction scanning is carried out in a fourth embodiment of the present invention.
Figure 25:
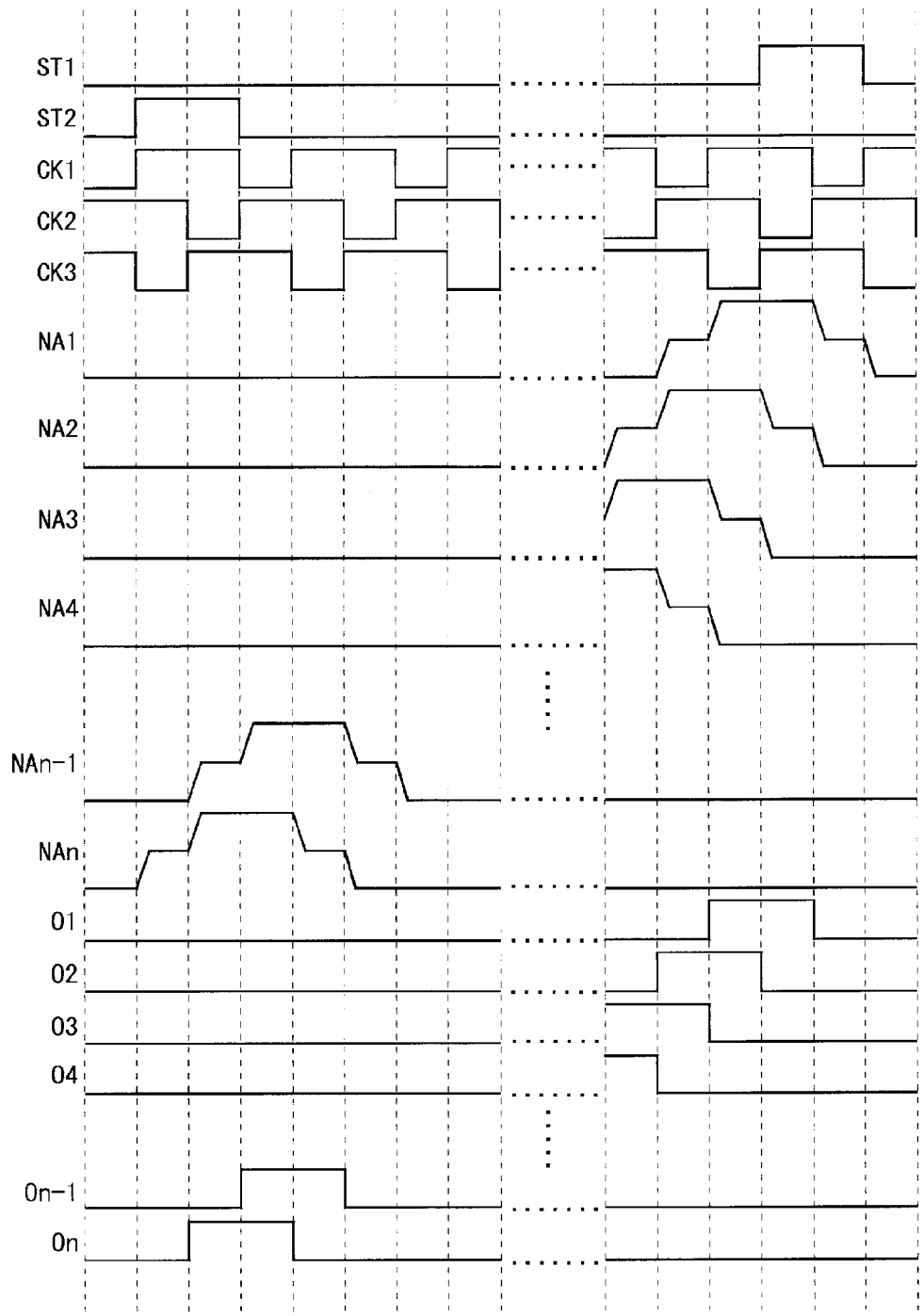
FIG. 25 is a signal waveform diagram for illustrating the operation of the gate driver performed when reverse direction scanning is carried out in the fourth embodiment.

Next, the operation of a shift register 40 in the present embodiment will be described. When forward direction scanning is carried out, first to third gate clock signals CK1 to CK3 and first and second gate start pulse signals ST1 and ST2 having waveforms as depicted in FIG. 24 are supplied to the shift register 40. When reverse direction scanning is carried out, the first to third gate clock signals CK1 to CK3 and the first and second gate start pulse signals ST1 and ST2 having waveforms as depicted in FIG. 25 are supplied to the shift register 40.

Figure 26:
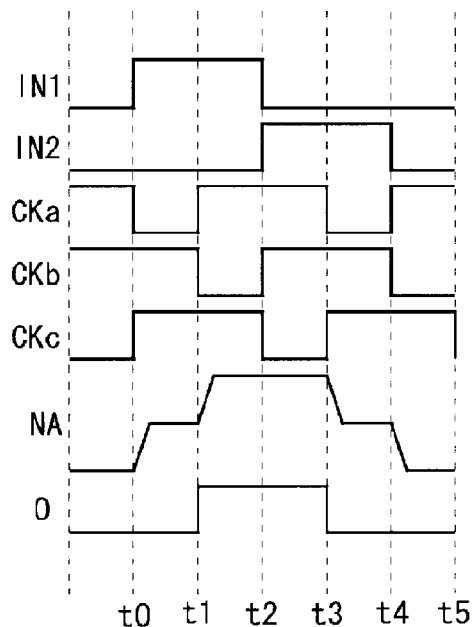
FIG. 26 is a signal waveform diagram for illustrating the operation of a unit circuit performed when forward direction scanning is carried out in the fourth embodiment.

The operation of each stage (unit circuit) of the shift register 40 performed when forward direction scanning is carried out will be described with reference to FIG. 26. In the period prior to time t1, the same operation as in the first embodiment is carried out. When time t1 is reached, a first clock CKa changes from low level to high level. At such time, the third clock CKc is maintained at high level, which is different from the first embodiment; however, a first input signal IN1 is also maintained at high level. Furthermore, at such time, a thin film transistor Tr3 is in an on state. Thus, the potential of an output terminal 49 (the potential of a scanning signal O) rises together with a rise in the potential of an input terminal 43. Then, in the same manner as in the first embodiment, a large voltage is applied to the gate terminal of the thin film transistor Tr3, and the potential of the output terminal 49 rises to the high-level potential of the first clock CKa without a threshold voltage drop occurring. In this manner, a gate bus line GL connected to the output terminal 49 of this unit circuit enters a selected state.

When time t2 is reached, the third clock CKc changes from high level to low level. A thin film transistor Tr1 thereby enters an off state. Furthermore, at time t2, a second clock CKb changes from low level to high level. A thin film transistor Tr2 thereby enters an on state. In addition, at time t2, a second input signal IN2 changes from low level to high level. Because the thin film transistor Tr2 enters an on state and the second input signal IN2 becomes high level as described above, the potential of a first node NA is maintained at high level. Furthermore, at time t2, the first clock CKa is maintained at high level. Accordingly, the potential of the output terminal 49 (the potential of the scanning signal O) is maintained at high level.

When time t3 is reached, the first clock CKa changes from high level to low level. Thus, the potential of the output terminal 49 (the potential of the scanning signal O) drops to low level together with a drop in the potential of the input terminal 43. Furthermore, the potential of the first node NA also drops by way of a capacitor C1 and parasitic capacitances between the gate and source and the gate and drain of the thin film transistor Tr3. At such time, because the second clock CKb is high level and the second input signal IN2 is maintained at high level, the first node NA is maintained in a precharged state.

When time t4 is reached, the second clock CKb changes from high level to low level. The thin film transistor Tr2 thereby enters an off state. At such time, because the third clock CKc is maintained at high level, the thin film transistor Tr1 enters an on state. Furthermore, the first input signal IN1 is low level during the period from time t4 to time t5. The potential of the first node NA thereby becomes low level during this period.

Figure 27:
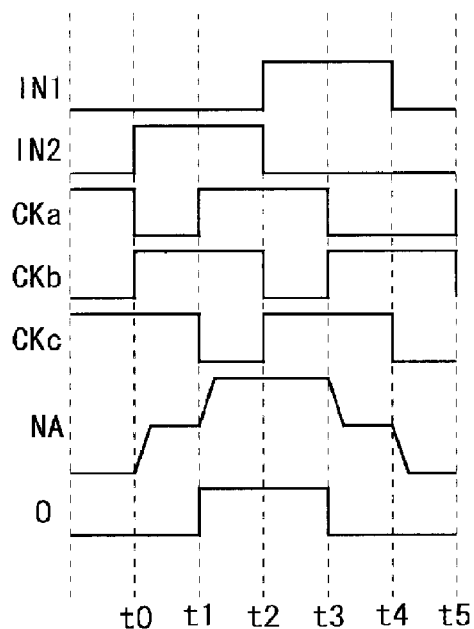
FIG. 27 is a signal waveform diagram for illustrating the operation of the unit circuit performed when reverse direction scanning is carried out in the fourth embodiment.

Next, the operation of each stage (unit circuit) of the shift register 40 performed when reverse direction scanning is carried out will be described with reference to FIG. 27. In the period prior to time t1, the same operation as in the first embodiment is carried out. When time t1 is reached, the first clock CKa changes from low level to high level. At such time, the second clock CKb is maintained at high level, which is different from the first embodiment; however, the second input signal IN2 is also maintained at high level. Furthermore, at such time, the thin film transistor Tr3 is in an on state. Thus, the potential of the output terminal 49 (the potential of the scanning signal O) rises together with a rise in the potential of the input terminal 43. Then, in the same manner as in the first embodiment, a large voltage is applied to the gate terminal of the thin film transistor Tr3, and the potential of the output terminal 49 rises to the high-level potential of the first clock CKa without a threshold voltage drop occurring. In this manner, the gate bus line GL connected to the output terminal 49 of this unit circuit enters a selected state.

When time t2 is reached, the second clock CKb changes from high level to low level. The thin film transistor Tr2 thereby enters an off state. Furthermore, at time t2, the third clock CKc changes from low level to high level. The thin film transistor Tr1 thereby enters an on state. In addition, at time t2, the first input signal IN1 changes from low level to high level. Because the thin film transistor Tr1 enters an on state and the first input signal IN1 becomes high level as described above, the potential of the first node NA is maintained at high level. Furthermore, at time t2, the first clock CKa is maintained at high level. Accordingly, the potential of the output terminal 49 (the potential of the scanning signal O) is maintained at high level.

When time t3 is reached, the first clock CKa changes from high level to low level. Thus, the potential of the output terminal 49 (the potential of the scanning signal O) drops to low level together with a drop in the potential of the input terminal 43. Furthermore, the potential of the first node NA also drops by way of the capacitor C1 and the parasitic capacitances between the gate and source and between the gate and drain of the thin film transistor Tr3. At such time, because the third clock CKc is high level and the first input signal IN1 is maintained at high level, the first node NA is maintained in a precharged state.

When time t4 is reached, the third clock CKc changes from high level to low level. The thin film transistor Tr1 thereby enters an off state. At such time, because the second clock CKb is maintained at high level, the thin film transistor Tr2 enters an on state. Furthermore, the second input signal IN2 is low level during the period from time t4 to time t5. The potential of the first node NA thereby becomes low level during this period.

As a result of each stage (unit circuit) of the shift register 40 operating as described above, an operation such as the following is carried out by the entirety of the shift register 40. When forward direction scanning is carried out, as depicted in FIG. 24, together with the potentials of the first nodes NA1 to NAn of the first stage SR1 to the $n^{th}$ stage SRn greatly rising in a sequential manner due to a bootstrap effect, the scanning signals O1 to On that are output from the first stage SR1 to the $n^{th}$ stage SRn sequentially become high level in each period, which are twice those of the first embodiment. Furthermore, when reverse direction scanning is carried out, as depicted in FIG. 25, together with the potentials of the first nodes NAn to NA1 of the $n^{th}$ stage SRn to the first stage SR1 greatly rising in a sequential manner due to a bootstrap effect, the scanning signals On to O1 that are output from the $n^{th}$ stage SRn to the first stage SR1 sequentially become high level in each period, which are twice those of the first embodiment. It should be noted that the latter half period of a period in which a scanning signal Oj that is applied to a gate bus line GLj of a $j^{th}$ row becomes high level and the former half period of a period in which a scanning signal Oj+1 that is applied to a gate bus line GLj+1 of a $j+1^{th}$ row becomes high level are the same period.

It should be noted that, although a description has been given here under the premise that the configuration of the unit circuits is the same as the configuration in the first embodiment (see FIG. 1), the pulse widths of the gate clock signals having three phases can be twice the pulse widths in the first embodiment also in the case where the configuration of the unit circuits is the same as the configuration in the embodiments and modification examples other than the first embodiment.

4.3 Effect

According to the present embodiment, the length of a period in which each scanning signal O becomes high level is twice as long compared with the first embodiment. In other words, the length of the period for charging a capacitive load connected to the output terminal 49 is twice as long compared with the first embodiment. Because the charging period becomes longer in this manner, the size of the thin film transistor Tr3 for controlling the output of the scanning signals O can be made smaller compared with the first embodiment. Accordingly, it is possible for the circuit area of the shift register to be made smaller compared with the first embodiment. Thus, a shift register with which it is possible to switch the scanning order of gate bus lines and the occurrence of an erroneous operation caused by a threshold voltage drop can be prevented is able to be realized with a simple configuration while suppressing an increase in the circuit area.

5. Fifth Embodiment

5.1 Configuration, Etc.

Figure 28:
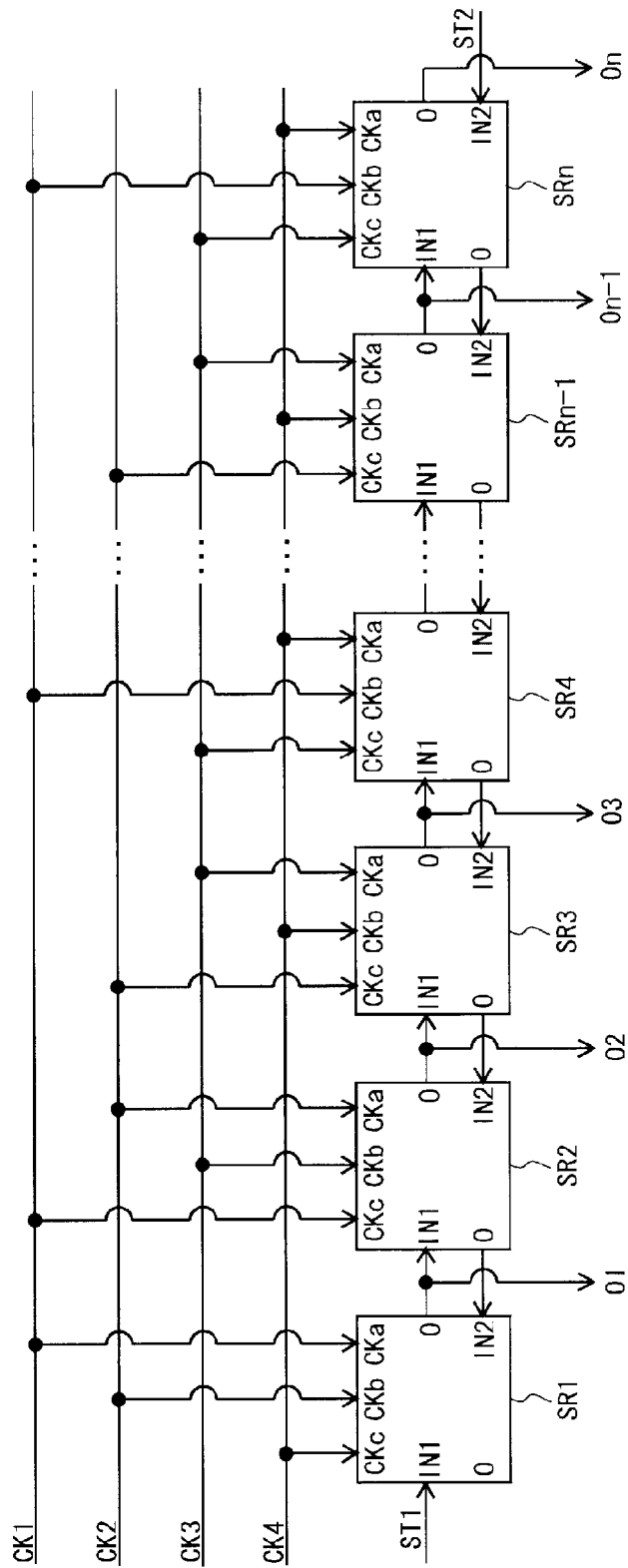
FIG. 28 is a block diagram depicting a configuration of a shift register inside a gate driver in a fifth embodiment of the present invention.

A fifth embodiment of the present invention will be described. The overall configuration and operation of a liquid crystal display device is the same as in the first embodiment and a description is therefore omitted (see FIG. 2 to FIG. 4). FIG. 28 is a block diagram depicting a configuration of a shift register 40 inside a gate driver 400 in the present embodiment. As understood from FIG. 28, in the present embodiment, gate clock signals having four phases (a first gate clock signal CK1, a second gate clock signal CK2, a third gate clock signal CK3, and a fourth gate clock signal CK4) are supplied to the shift register 40. It should be noted that the configuration of unit circuits is the same as the configuration in the first embodiment (see FIG. 1). However, a configuration in which the shift register 40 operates based on gate clock signals having four phases can be employed also in the case where the configuration of the unit circuits is the same as the configuration in the embodiments and modification examples other than the first embodiment.

In the present embodiment, the gate clock signals are supplied to the shift register 40 in the following manner. With regard to a first stage SR1, the first gate clock signal CK1 is supplied as a first clock CKa, the second gate clock signal CK2 is supplied as a second clock CKb, and the fourth gate clock signal CK4 is supplied as a third clock CKc. With regard to a second stage SR2, the second gate clock signal CK2 is supplied as the first clock CKa, the third gate clock signal CK3 is supplied as the second clock CKb, and the first gate clock signal CK1 is supplied as the third clock CKc. With regard to a third stage SR3, the third gate clock signal CK3 is supplied as the first clock CKa, the fourth gate clock signal CK4 is supplied as the second clock CKb, and the second gate clock signal CK2 is supplied as the third clock CKc. With regard to a fourth stage SR4, the fourth gate clock signal CK4 is supplied as the first clock CKa, the first gate clock signal CK1 is supplied as the second clock CKb, and the third gate clock signal CK3 is supplied as the third clock CKc. The same configuration as the configuration from the first stage SR1 to the fourth stage SR4 as described above is repeated every four stages.

Figure 29:
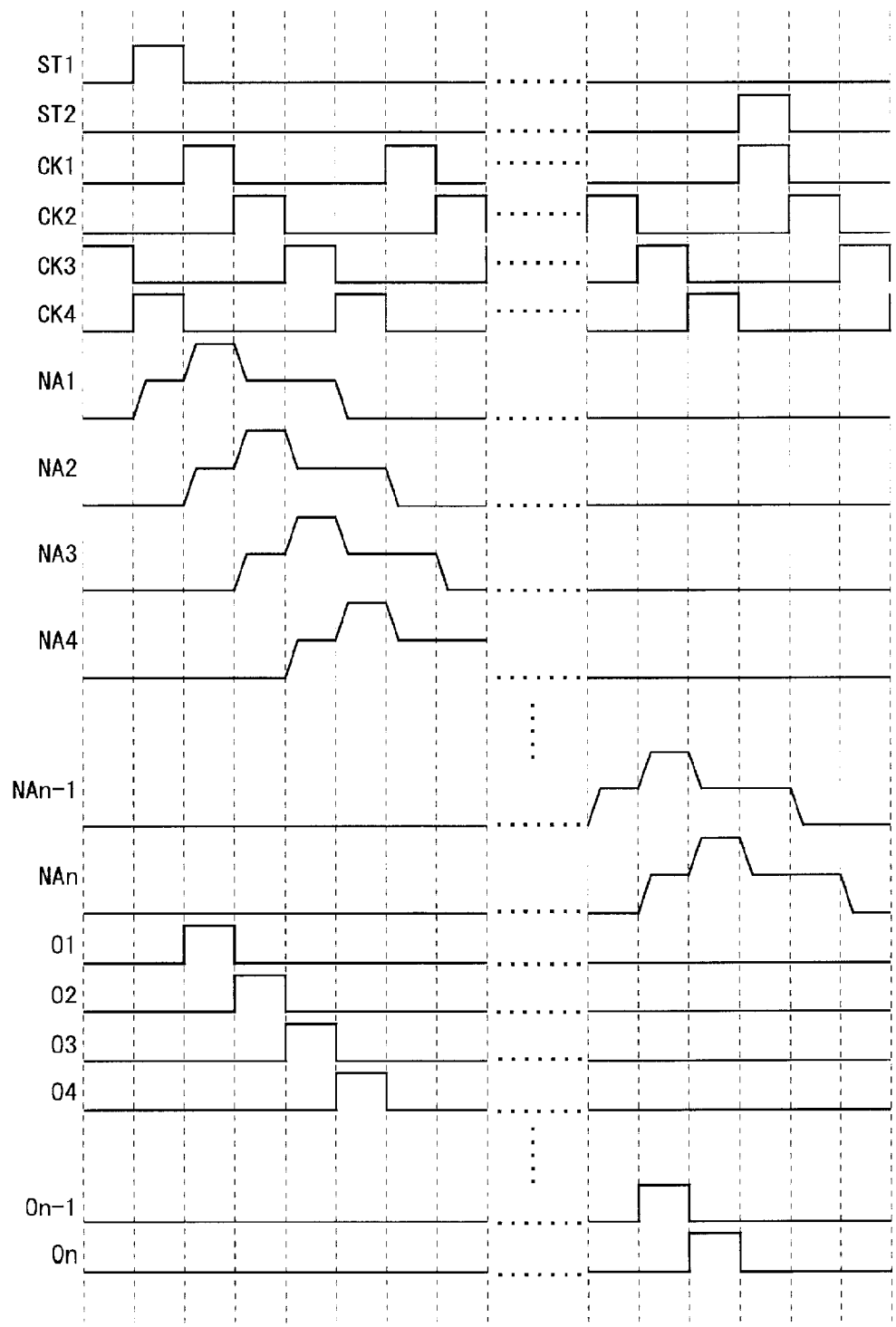
FIG. 29 is a signal waveform diagram for illustrating the operation of the gate driver performed when forward direction scanning is carried out in the fifth embodiment.

When forward direction scanning is carried out, the first to fourth gate clock signals CK1 to CK4 having waveforms as depicted in FIG. 29 are supplied to the shift register 40. The phase of the second gate clock signal CK2 is 90 degrees behind the phase of the first gate clock signal CK1, the phase of the third gate clock signal CK3 is 180 degrees behind the phase of the first gate clock signal CK1, and the phase of the fourth gate clock signal CK4 is 90 degrees ahead of the phase of the first gate clock signal CK1. Furthermore, a first gate start pulse signal ST1 rises at a timing at which the fourth gate clock signal CK4 rises. Thus, based upon the rising timing of the first gate start pulse signal ST1, when forward direction scanning is carried out, pulses of the gate clock signals having four phases are generated in the order of "the fourth gate clock signal CK4, the first gate clock signal CK1, the second gate clock signal CK2, and the third gate clock signal CK3".

Figure 30:
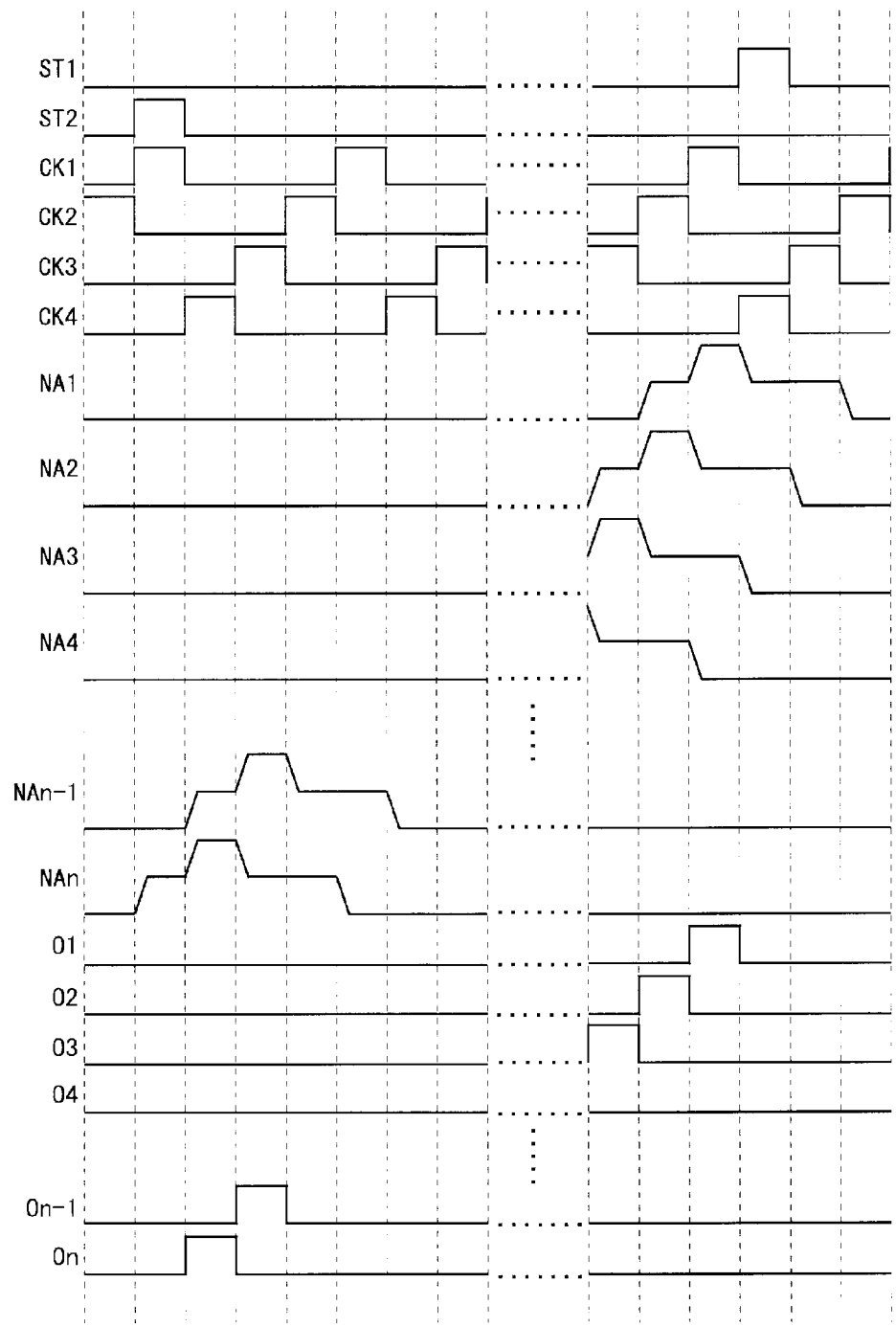
FIG. 30 is a signal waveform diagram for illustrating the operation of the gate driver performed when reverse direction scanning is carried out in the fifth embodiment.

When reverse direction scanning is carried out, the first to fourth gate clock signals CK1 to CK4 having waveforms as depicted in FIG. 30 are supplied to the shift register 40. The phase of the second gate clock signal CK2 is 90 degrees ahead of the phase of the first gate clock signal CK1, the phase of the third gate clock signal CK3 is 180 degrees ahead of the phase of the first gate clock signal CK1, and the phase of the fourth gate clock signal CK4 is 90 degrees behind the phase of the first gate clock signal CK1. Furthermore, a second gate start pulse signal ST2 rises at a timing at which the first gate clock signal CK1 rises. Thus, based upon the rising timing of the second gate start pulse signal ST2, when forward direction scanning is carried out, pulses of the gate clock signals having four phases are generated in the order of "the first gate clock signal CK1, the fourth gate clock signal CK4, the third gate clock signal CK3, and the second gate clock signal CK2".

5.2 Operation of Shift Register

Next, the operation of the shift register 40 in the present embodiment will be described. It should be noted that switching between forward direction scanning and reverse direction scanning is carried out in accordance with the generation order of the pulses of the first to fourth gate clock signals CK1 to CK4 and the gate clock signal that rises when a gate start pulse signal (the first gate start pulse signal ST1 or the second gate start pulse signal ST2) rises.

5.2.1 Operation of Each Stage (Unit Circuit)

Figure 31:
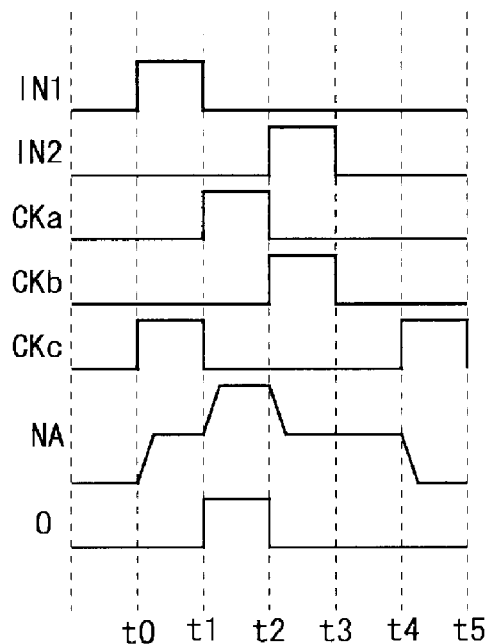
FIG. 31 is a signal waveform diagram for illustrating the operation of a unit circuit performed when forward direction scanning is carried out in the fifth embodiment.
Figure 32:
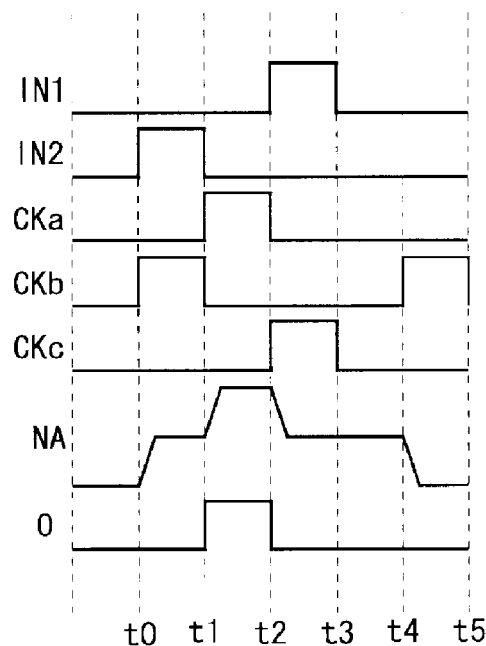
FIG. 32 is a signal waveform diagram for illustrating the operation of the unit circuit performed when reverse direction scanning is carried out in the fifth embodiment.

First, the operation of each stage (unit circuit) of the shift register 40 will be described with reference to FIG. 1, FIG. 31, and FIG. 32. FIG. 31 is a signal waveform diagram of when forward direction scanning is carried out, and FIG. 32 is a signal waveform diagram of when reverse direction scanning is carried out. It should be noted that, in the present embodiment, the operation carried out at time t3 and thereafter is different from the operation in the first embodiment. Accordingly, only the operation carried out at time t3 and thereafter will be described.

5.2.1.1 Operation when Forward Direction Scanning is Carried Out

When time t3 is reached, a second input signal IN2 changes from high level to low level. Furthermore, at time t3, the second clock CKb changes from high level to low level. A thin film transistor Tr2 thereby enters an off state. In this manner, although the second input signal IN2 becomes low level, a first node NA is maintained in a precharged state because the thin film transistor Tr2 enters an off state.

When time t4 is reached, the third clock CKc changes from low level to high level. A thin film transistor Tr1 thereby enters an on state. Furthermore, a first input signal IN1 is low level during the period from time t4 to time t5. The potential of the first node NA thereby becomes low level during this period.

5.2.1.2 Operation when Reverse Direction Scanning is Carried Out

When time t3 is reached, the first input signal IN1 changes from high level to low level. Furthermore, at time t3, the third clock CKc changes from high level to low level. The thin film transistor Tr1 thereby enters an off state. In this manner, although the first input signal IN1 becomes low level, the first node NA is maintained in a precharged state because the thin film transistor Tr1 enters an off state.

When time t4 is reached, the second clock CKb changes from low level to high level. The thin film transistor Tr2 thereby enters an on state. Furthermore, the second input signal IN2 is low level during the period from time t4 to time t5. The potential of the first node NA thereby becomes low level during this period.

5.2.2 Overall Operation of Shift Register

Due to each stage (unit circuit) of the shift register 40 operating as described above, when forward direction scanning is carried out, as depicted in FIG. 29, together with the potentials of first nodes NA1 to NAn of the first stage SR1 to the $n^{th}$ stage SRn greatly rising in a sequential manner due to a bootstrap effect, the scanning signals O1 to On that are output from the first stage SR1 to the $n^{th}$ stage SRn, sequentially become high level in each prescribed period. Furthermore, when reverse direction scanning is carried out, as depicted in FIG. 30, together with the potentials of the first nodes NAn to NA1 of the $n^{th}$ stage SRn to the first stage SR1 greatly rising in a sequential manner due to a bootstrap effect, the scanning signals On to O1 that are output from the $n^{th}$ stage SRn to the first stage SR1 sequentially become high level in each prescribed period.

5.3 Effect

According to the present embodiment, a shift register with which it is possible to switch the scanning order of gate bus lines and the occurrence of an erroneous operation caused by a threshold voltage drop can be prevented is able to be realized with a simple configuration in the same manner as in the first embodiment also in the case where the clock signals having four phases are used to cause the gate driver 400 to operate. It should be noted that a shift register that operates with clock signals having n phases is also able to be realized in the same manner.

6. Sixth Embodiment

6.1 Configuration, Etc.

A sixth embodiment of the present invention will be described. The overall configuration and operation of a liquid crystal display device is the same as in the first embodiment and a description is therefore omitted (see FIG. 2 to FIG. 4). In the present embodiment, the configuration of unit circuits is different between a first stage SR1, an $n^{th}$ stage (final stage) SRn, and second to $n-1^{th}$ stages SR2 to SRn-1. With regard to the second to $n-1^{th}$ stages SR2 to SRn-1, the unit circuits are configured as depicted in FIG. 13 in the same manner as in the second embodiment.

Figure 33:
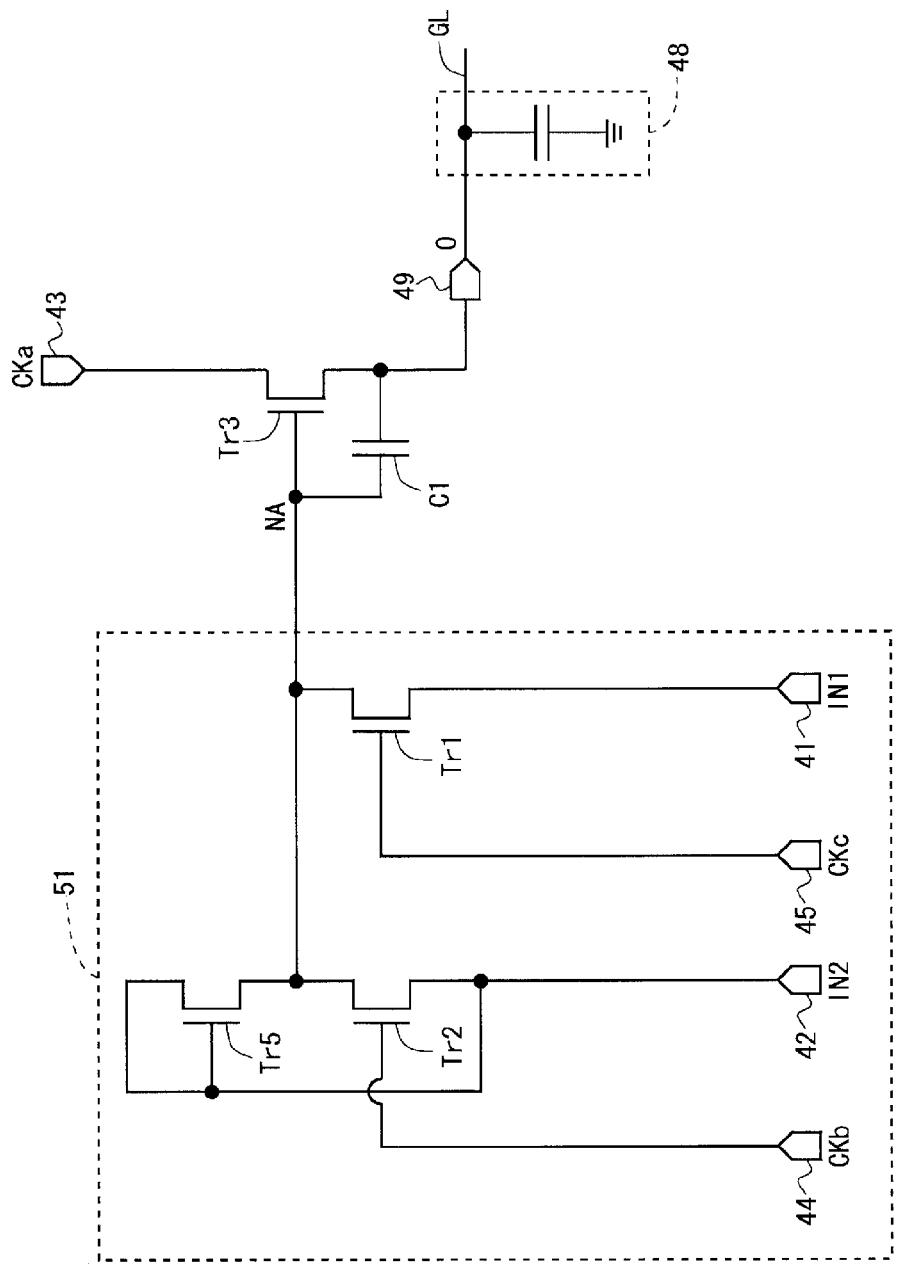
FIG. 33 is a circuit diagram depicting a configuration of a unit circuit of a first stage in a sixth embodiment of the present invention.
Figure 34:
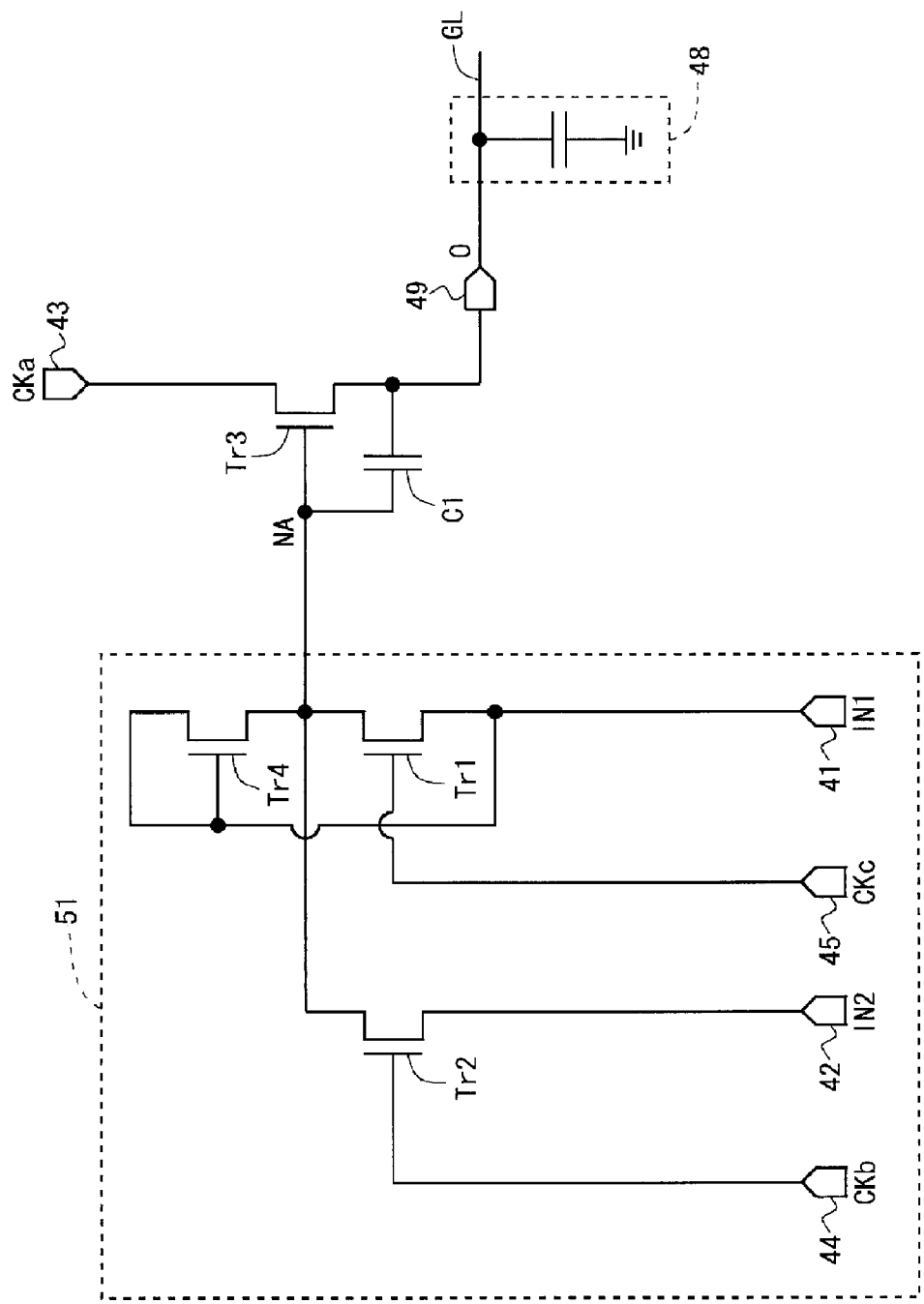
FIG. 34 is a circuit diagram depicting a configuration of a unit circuit of a final stage in the sixth embodiment.

FIG. 33 is a circuit diagram depicting a configuration of a unit circuit of the first stage. Different from the configuration depicted in FIG. 13, a thin film transistor Tr4 is not provided in the unit circuit of the first stage. However, the size of a thin film transistor Tr1 has been made larger compared with the configuration depicted in FIG. 13. FIG. 34 is a circuit diagram depicting a configuration of a unit circuit of the $n^{th}$ stage. Different from the configuration depicted in FIG. 13, a thin film transistor Tr5 is not provided in the unit circuit of the $n^{th}$ stage. However, the size of a thin film transistor Tr2 has been made larger compared with the configuration depicted in FIG. 13.

6.2 Operation of Shift Register

Here, it is hypothetically assumed that a shift register 40 is caused to operate with one gate start pulse signal in the configuration depicted in FIG. 13. At such time, when a pulse of the gate start pulse signal is generated when reverse direction scanning is to be performed, in the first stage SR1, the thin film transistor Tr4 enters an on state and therefore the first node NA enters a precharged state. As a result, an erroneous operation occurs in the first stage SR1. In the same manner, when a pulse of the gate start pulse signal is generated when forward direction scanning is to be performed, in the $n^{th}$ stage SRn, the thin film transistor Tr5 enters an on state and therefore the first node NA enters a precharged state. As a result, an erroneous operation occurs in the n$^{th}$ stage SRn.

With respect to this, according to the present embodiment, in the first stage SR1, the first node NA does not enter a precharged state as long as the third clock CKc does not become high level, even when the first input signal IN1 becomes high level. Furthermore, in the n$^{th}$ stage SRn, the first node NA does not enter a precharged state as long as the second clock CKb does not become high level, even when the second input signal IN2 becomes high level. Accordingly, an erroneous operation is prevented from occurring in the first stage SR1 when reverse direction scanning is performed and an erroneous operation is prevented from occurring in the n$^{th}$ stage SRn (final stage) when forward direction scanning is performed, even when the shift register 40 is caused to operate with one gate start pulse signal.

6.3 Effect

According to the present embodiment, it becomes possible for a shift register that enables shift direction switching to be caused to operate with one gate start pulse signal. Thus, a shift register with which it is possible to switch the shift direction is able to be realized with an even simpler configuration.

6.4 Modification Examples

6.4.1 First Modification Example

Figure 35:
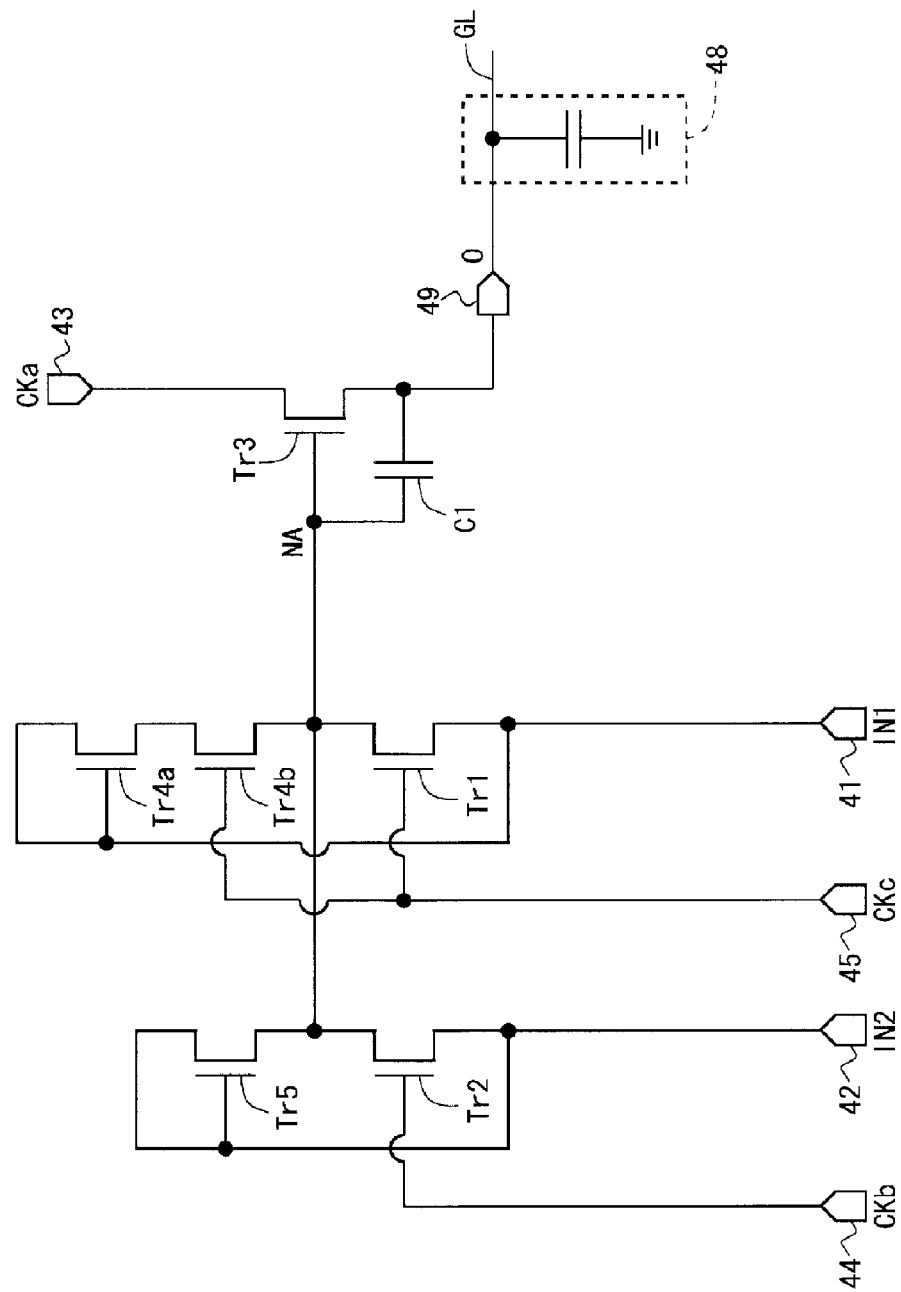
FIG. 35 is a circuit diagram depicting a configuration of the unit circuit of the first stage in a first modification example of the sixth embodiment.
Figure 36:
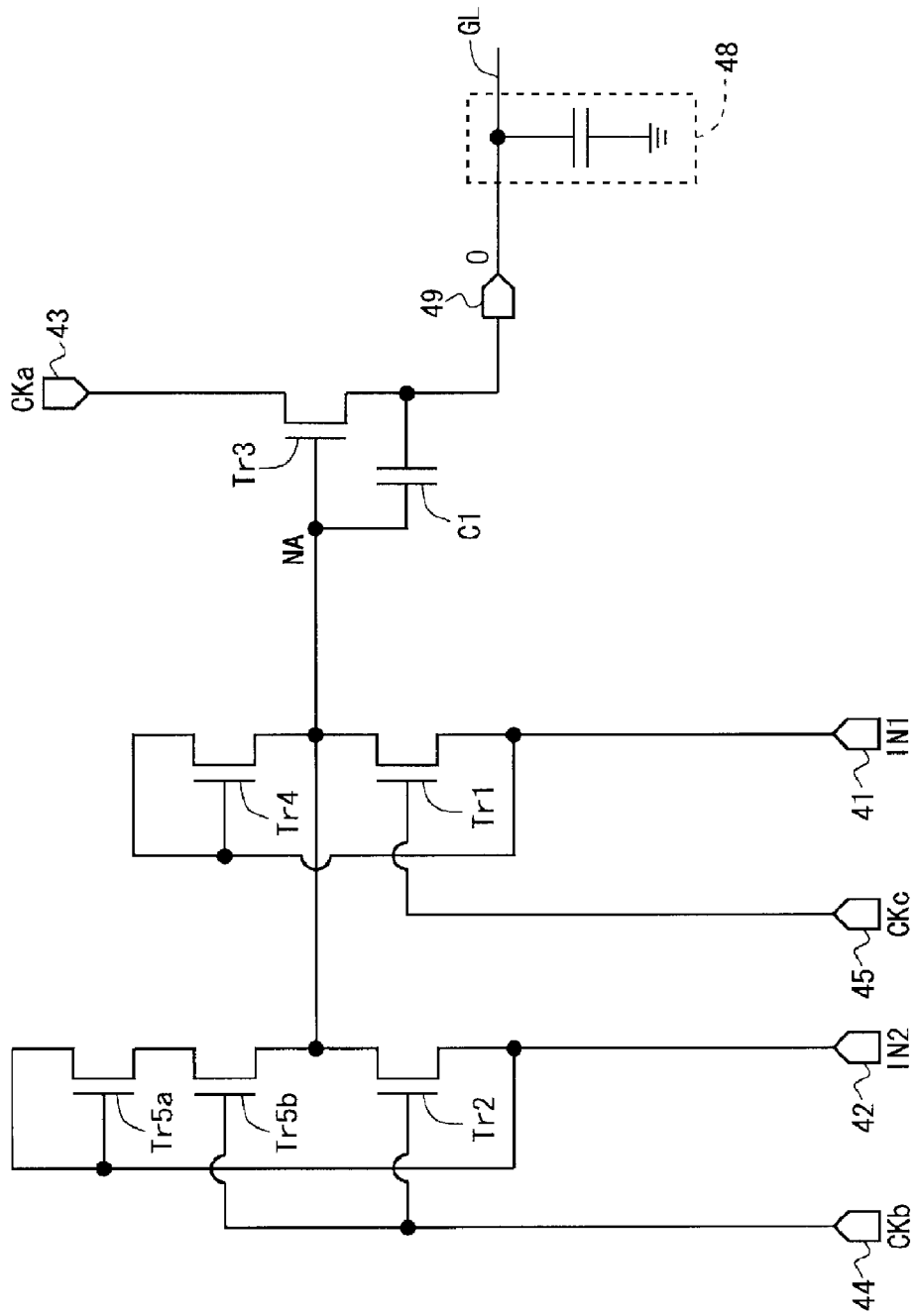
FIG. 36 is a circuit diagram depicting a configuration of the unit circuit of the final stage in the first modification example of the sixth embodiment.

FIG. 35 is a circuit diagram depicting a configuration of the unit circuit of the first stage in a first modification example of the sixth embodiment. In the present modification example, in the unit circuit of the first stage, a thin film transistor Tr4a and a thin film transistor Tr4b are provided instead of the thin film transistor Tr4 in the configuration depicted in FIG. 13. With regard to the thin film transistor Tr4a, the gate terminal and the drain terminal are connected to an input terminal 41, and the source terminal is connected to the drain terminal of the thin film transistor Tr4b. With regard to the thin film transistor Tr4b, the gate terminal is connected to an input terminal 45, the drain terminal is connected to the source terminal of the thin film transistor Tr4a, and the source terminal is connected to the first node NA. FIG. 36 is a circuit diagram depicting a configuration of the unit circuit of an n$^{th}$ stage in a second modification example of the sixth embodiment. In the present modification example, in the unit circuit of the n$^{th}$ stage, a thin film transistor Tr5a and a thin film transistor Tr5b are provided instead of the thin film transistor Tr5 in the configuration depicted in FIG. 13. With regard to the thin film transistor Tr5a, the gate terminal and the drain terminal are connected to an input terminal 42, and the source terminal is connected to the drain terminal of the thin film transistor Tr5b. With regard to the thin film transistor Tr5b, the gate terminal is connected to an input terminal 44, the drain terminal is connected to the source terminal of the thin film transistor Tr5a, and the source terminal is connected to the first node NA.

Also in the present modification example, in the first stage SR1, even when the first input signal IN1 becomes high level, because the thin film transistor Tr4b is present, the first node NA does not enter a precharged state as long as the third clock CKc does not become high level. Furthermore, in the n$^{th}$ stage SRn, even when the second input signal IN2 becomes high level, because the thin film transistor Tr5b is present, the first node NA does not enter a precharged state as long as the second clock CKb does not become high level. Accordingly, an erroneous operation is prevented from occurring in the first stage SR1 when reverse direction scanning is performed and an erroneous operation is prevented from occurring in the n$^{th}$ stage SRn (final stage) when forward direction scanning is performed, even when the shift register 40 is caused to operate with one gate start pulse signal.

6.4.2 Second Modification Example

Figure 37:
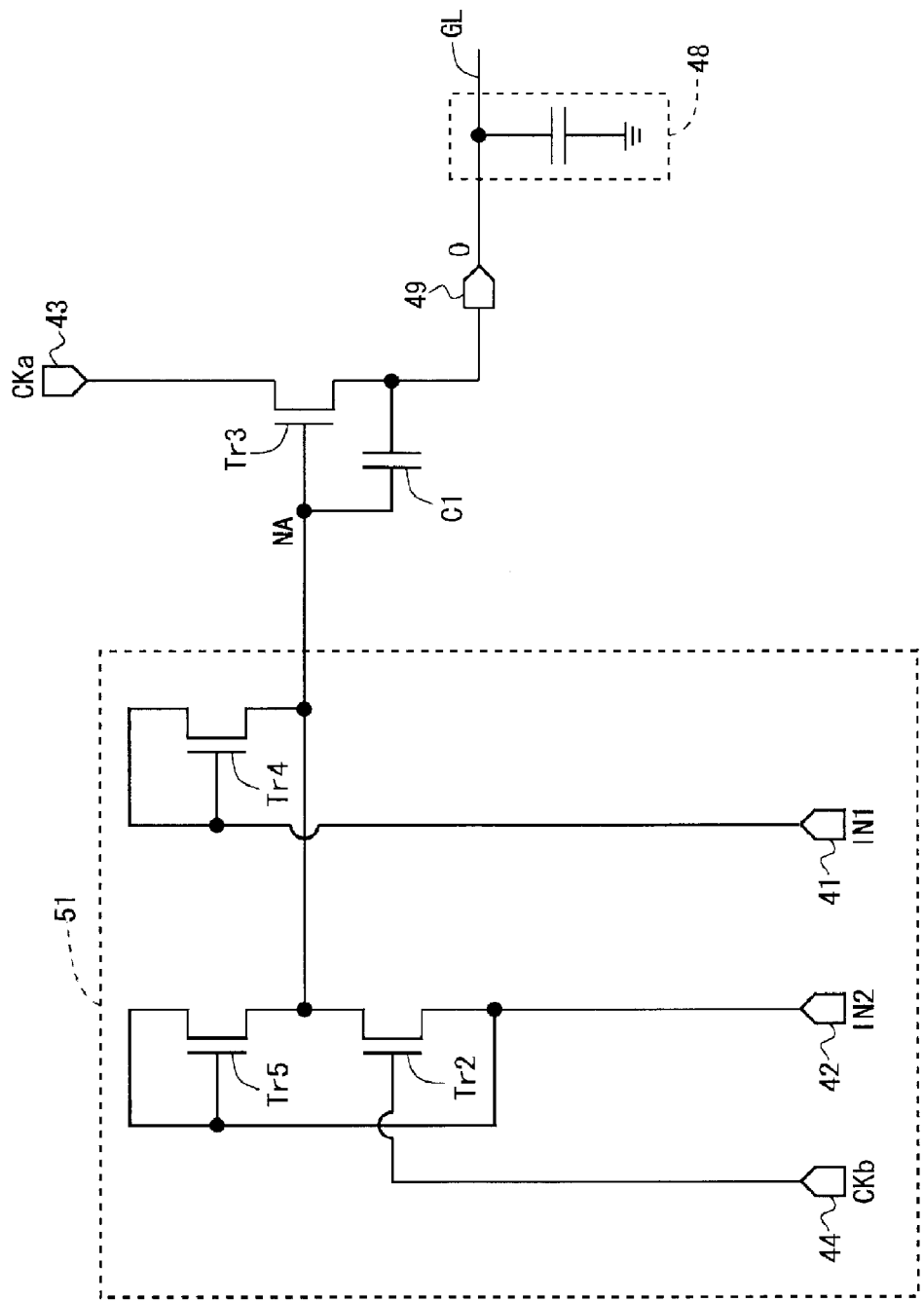
FIG. 37 is a circuit diagram depicting a configuration of the unit circuit of the first stage in a second modification example of the sixth embodiment.
Figure 38:
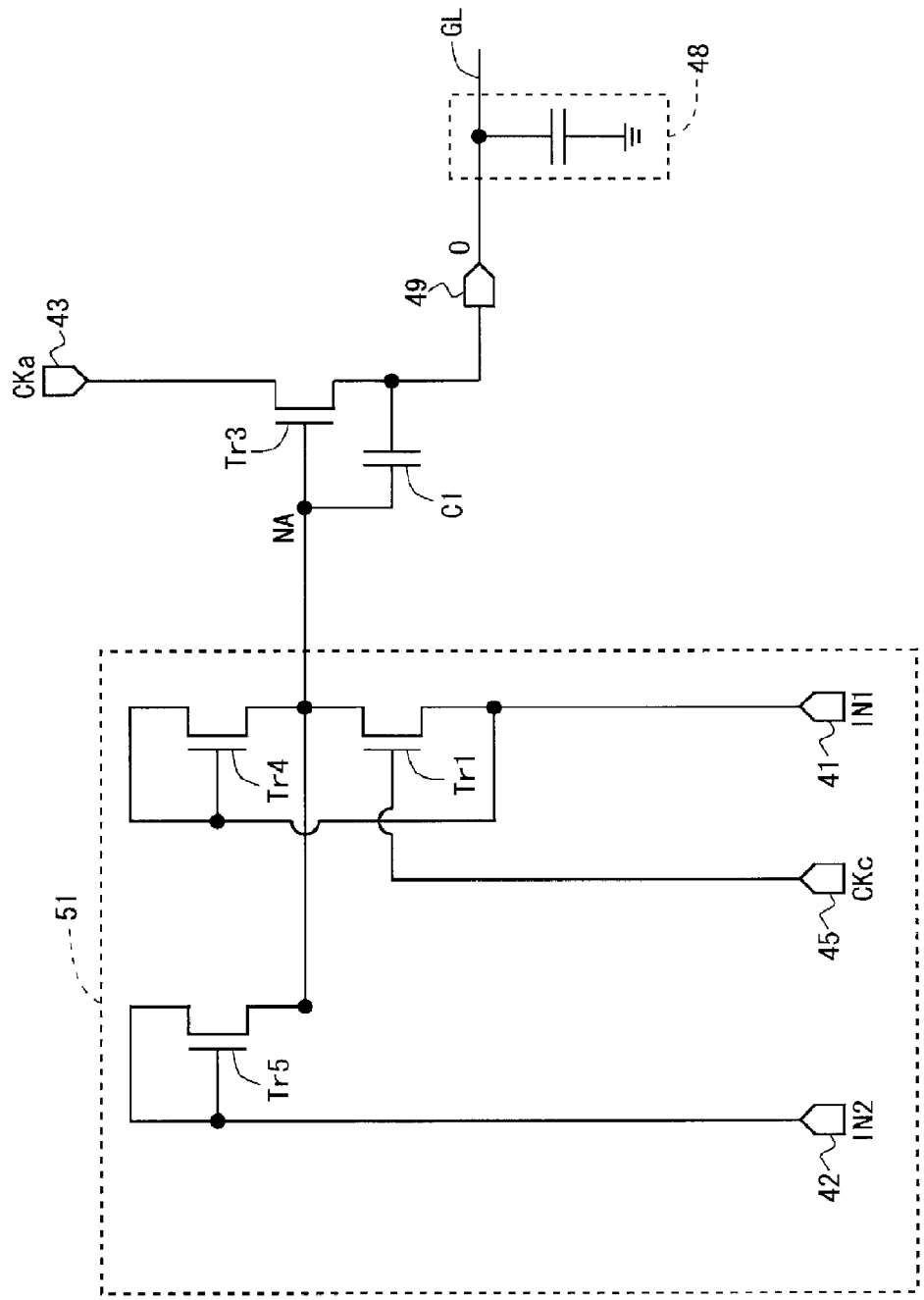
FIG. 38 is a circuit diagram depicting a configuration of the unit circuit of the final stage in the second modification example of the sixth embodiment.
Figure 40:
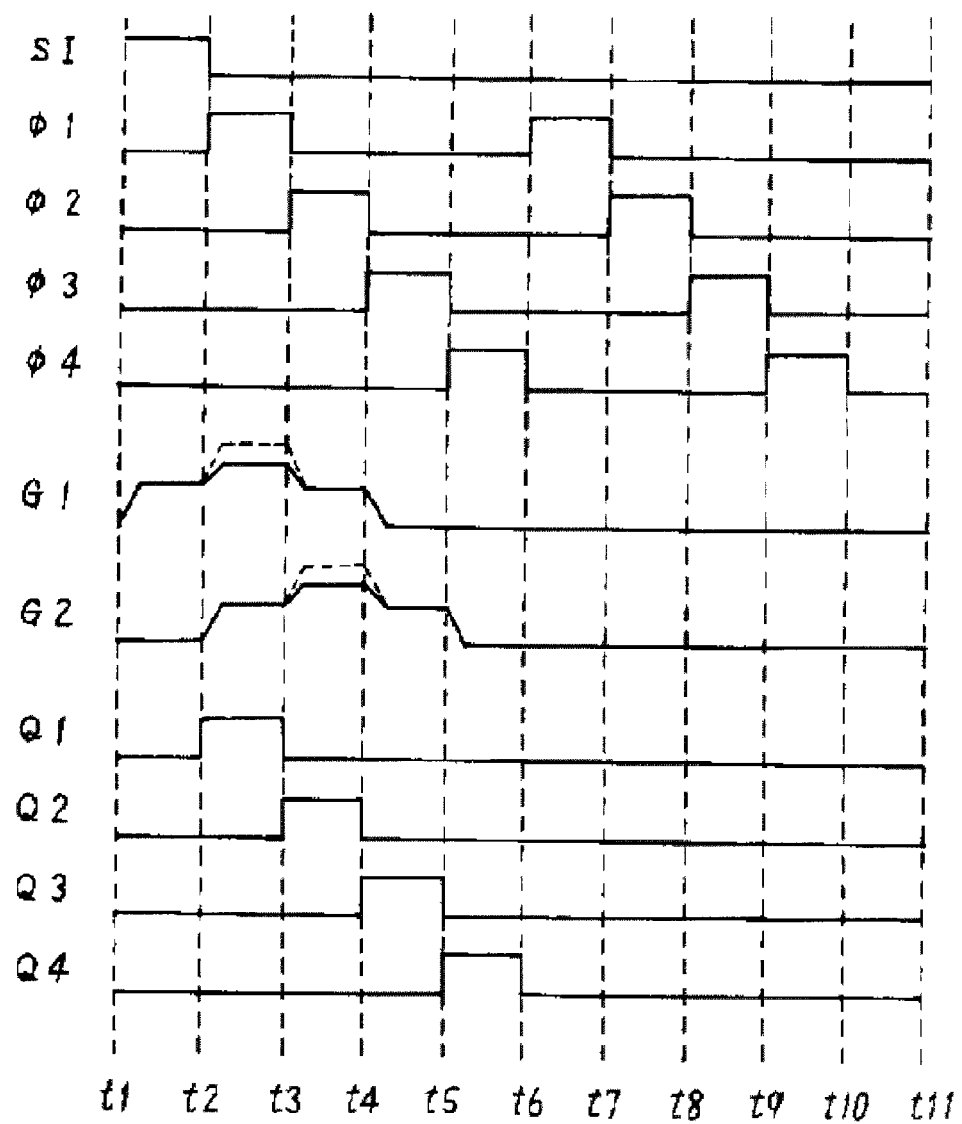
FIG. 40 is a signal waveform diagram for illustrating the operation of the conventional shift register.
Figure 41:
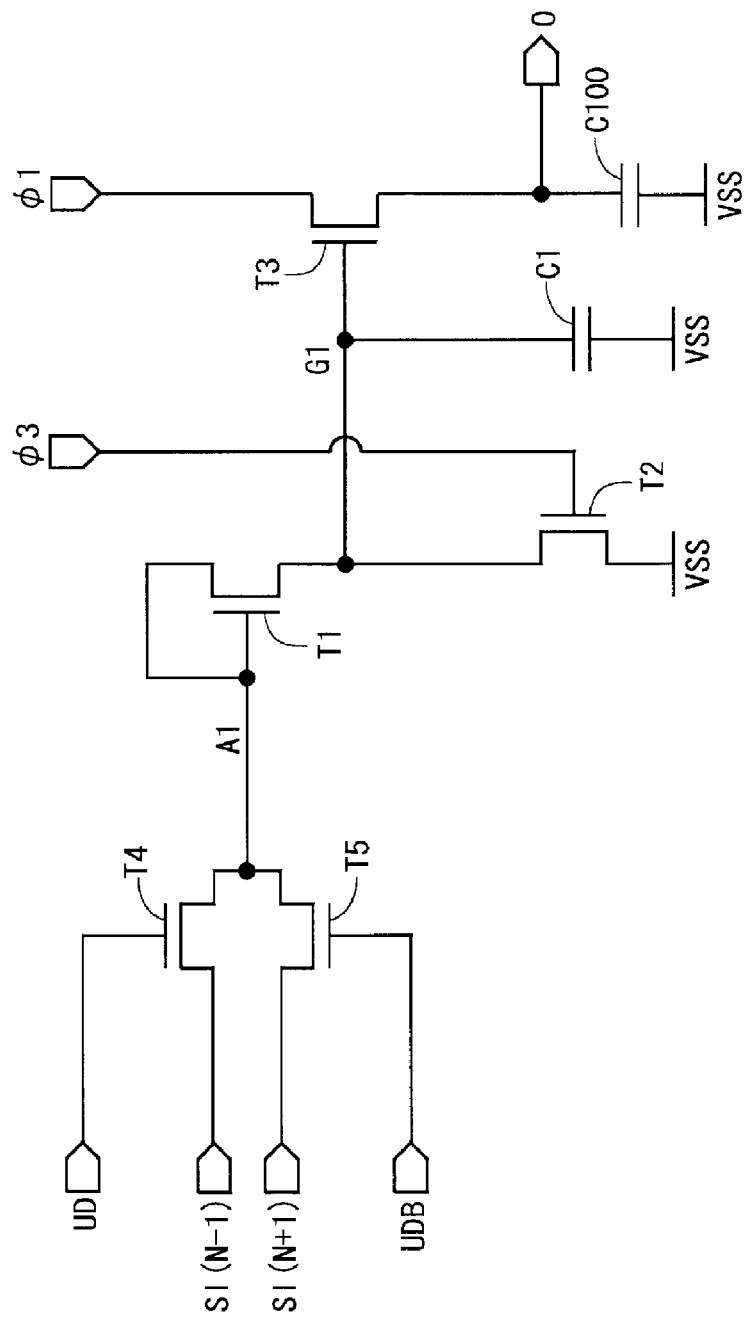
FIG. 41 is a circuit diagram of a unit circuit for illustrating a conventional example.
Figure 42:
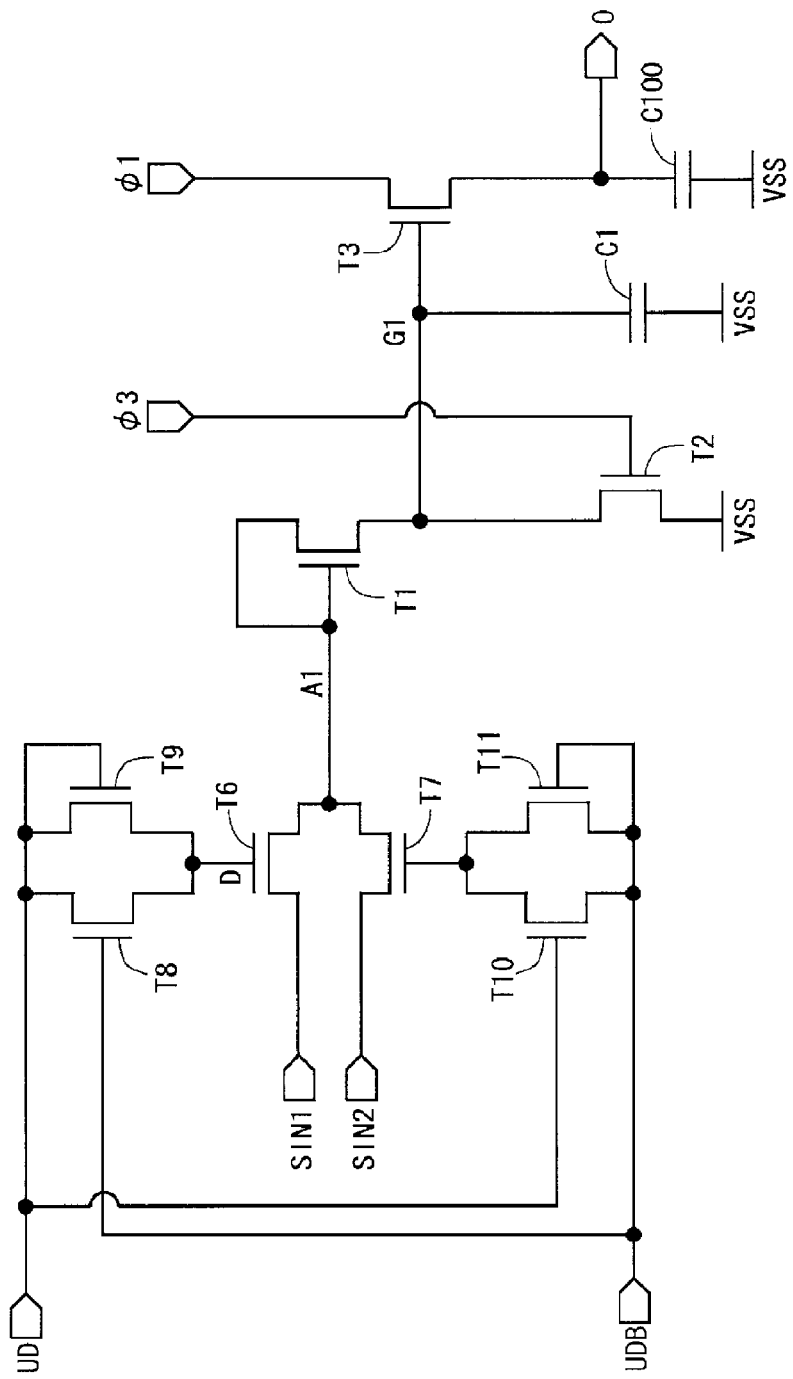
FIG. 42 is a circuit diagram of a unit circuit for illustrating a conventional example.

FIG. 37 is a circuit diagram depicting a configuration of the unit circuit of the first stage in a second modification example of the sixth embodiment. FIG. 38 is a circuit diagram depicting a configuration of the unit circuit of the n$^{th}$ stage in the second modification example of the sixth embodiment. In this manner, the unit circuit of the first stage may have a configuration in which the thin film transistor Tr1 has been removed from the configuration depicted in FIG. 13, and the unit circuit of the n$^{th}$ stage may have a configuration in which the thin film transistor Tr2 has been removed from the configuration depicted in FIG. 13.

7. Other

A liquid crystal display device has been given as an example and described in the aforementioned embodiments; however, the present invention is not limited thereto. The present invention can be applied also in another display device such as an organic EL (electroluminescence) display device.

| Description of Reference Characters | |
|---|---|
| 40 | shift register |
| 100 | display unit |
| 200 | display control circuit |
| 300 | source driver (video signal line driver circuit) |
| 400 | gate driver (scanning signal line driver circuit) |
| SR1 to SRn | unit circuit |
| Tr1 to Tr16 | thin film transistor |
| NA, NB | first node, second node |
| CKa, CKb, CKc | first clock, second clock, third clock |
| CK1, CK2, CK3 | first gate clock signal, second gate clock signal, third gate clock signal |
| O | scanning signal |
| ST1, ST2 | first gate start pulse signal, second gate start pulse signal |
| IN1, IN2 | first input signal, second input signal |

What is claimed is:

1. A shift register, comprising a plurality of unit circuits serially-connected to each other in a plurality of stages and constituted by transistors of the same conductivity type, each transistor having a control terminal, a first conducting terminal, and a second conducting terminal, the shift register operating in accordance with a plurality of clock signals having mutually differing phases, wherein each of said unit circuits comprises:
first to third clock terminals respectively receiving the clock signals;
an output terminal for outputting an output signal;
a first transistor in which said third clock terminal is connected directly to the control terminal of the first transistor, an output signal from a previous stage being supplied to the second conducting terminal of the first transistor;

a first node connected to the first conducting terminal of the first transistor;

a second transistor in which said second clock terminal is connected directly to the control terminal of the second transistor, the first conducting terminal of the second transistor being connected to said first node and an output signal of a subsequent stage being supplied to the second conducting terminal of the second transistor; and a third transistor in which the control terminal of the third transistor is connected to said first node, said first clock terminal being connected to the first conducting terminal of the third transistor and the second conducting terminal being connected to the output terminal, wherein the first node is not connected to any other transistor, wherein said clock signals are a first gate clock signal, a second gate clock signal, and a third gate clock signal each shifted in phase 120 degrees relative to one another, and wherein, when three of the unit circuits comprising three successive stages are respectively defined as a first unit circuit, a second unit circuit, and a third unit circuit:
said first unit circuit is configured such that said first gate clock signal is supplied to said first clock terminal, said second gate clock signal is supplied to said second clock terminal, and said third gate clock signal is supplied to said third clock terminal;
said second unit circuit is configured such that said second gate clock signal is supplied to said first clock terminal, said third gate clock signal is supplied to said second clock terminal, and said first gate clock signal is supplied to said third clock terminal; and
said third unit circuit is configured such that said third gate clock signal is supplied to said first clock terminal, said first gate clock signal is supplied to said second clock terminal, and said second gate clock signal is supplied to said third clock terminal.

2. The shift register according to claim 1, wherein shift operations of the shift register when pulses are repeatedly generated in order of said first gate clock signal, said second gate clock signal, and said third gate clock signal are performed in a direction opposite to when pulses are repeatedly generated in order of said third gate clock signal, said second gate clock signal, and said first gate clock signal.

3. The shift register according to claim 1, wherein, when for every two clock signals of said plurality of clock signals that successively generate a clock pulse, a clock signal that generates a clock pulse first is defined as a first clock signal, and a clock signal that generates a pulse afterwards is defined as a second clock signal, a latter half of a pulse output period of said first clock signal coincides with a leading half period of a pulse output period of said second clock signal.

4. The shift register according to claim 1, wherein the shift register is configured to receive a start pulse for starting a shift operation, the start pulse being either one of a first start pulse that causes the shift operation to be carried out in a forward direction or a second start pulse that causes the shift operation to be carried out in a reverse direction.

5. The shift register according to claim 4,
wherein, when said shift operation is carried out in said forward direction, assuming that a unit circuit has been added at a stage subsequent to a final stage, a signal corresponding to an output signal that would be outputted from said added unit circuit is supplied as said second start pulse to a unit circuit of said final stage, and wherein, when said shift operation is carried out in said reverse direction, assuming that a unit circuit has been added at a stage prior to a first stage, a signal corresponding to an output signal that would be outputted from said added unit circuit is supplied as said first start pulse to a unit circuit of said first stage.

6. A shift register, comprising a plurality of unit circuits serially-connected to each other in a plurality of stages and constituted by transistors of the same conductivity type, each transistor having a control terminal, a first conducting terminal, and a second conducting terminal, the shift register operating in accordance with a plurality of clock signals having mutually differing phases, wherein each of said unit circuits comprises:
first to third clock terminals respectively receiving the clock signals;
an output terminal for outputting an output signal;
a first transistor in which said third clock terminal is connected directly to the control terminal of the first transistor, an output signal from a previous stage being supplied to the second conducting terminal of the first transistor;
a first node connected to the first conducting terminal of the first transistor;
a second transistor in which said second clock terminal is connected directly to the control terminal of the second transistor, the first conducting terminal of the second transistor being connected to said first node and an output signal of a subsequent stage being supplied to the second conducting terminal of the second transistor; and
a third transistor in which the control terminal of the third transistor is connected to said first node, said first clock terminal being connected to the first conducting terminal of the third transistor and the second conducting terminal being connected to the output terminal, wherein the first node is not connected to any other transistor, wherein said clock signals are a first gate clock signal, a second gate clock signal, a third gate clock signal, and a fourth gate clock signal each shifted in phase of 90 degrees relative to one another, and wherein, when four of the unit circuits comprising four successive stages are respectively defined as a first unit circuit, a second unit circuit, a third unit circuit, and a fourth unit circuit:
said first unit circuit is configured such that said first gate clock signal is supplied to said first clock terminal, said second gate clock signal is supplied to said second clock terminal, and said fourth gate clock signal is supplied to said third clock terminal;
said second unit circuit is configured such that said second gate clock signal is supplied to said first clock terminal, said third gate clock signal is supplied to said second clock terminal, and said first gate clock signal is supplied to said third clock terminal;
said third unit circuit is configured such that said third gate clock signal is supplied to said first clock terminal, said fourth gate clock signal is supplied to said second clock terminal, and said second gate clock signal is supplied to said third clock terminal; and said fourth unit circuit is configured such that said fourth gate clock signal is supplied to said first clock terminal, said first gate clock signal is supplied to said second clock terminal, and said third gate clock signal is supplied to said third clock terminal.

7. The shift register according to claim 6, wherein shift operations of the shift register when pulses are repeatedly generated in order of said first gate clock signal, said second gate clock signal, said third gate clock signal, and said fourth gate clock signal are performed in a direction opposite to when pulses are repeatedly generated in order of said fourth gate clock signal, said third gate clock signal, said second gate clock signal, and said first gate clock signal.

8. The shift register according to claim 6, wherein, when for every two clock signals of said plurality of clock signals that successively generate a clock pulse, a clock signal that generates a clock pulse first is defined as a first clock signal, and a clock signal that generates a pulse afterwards is defined as a second clock signal, a latter half of a pulse output period of said first clock signal coincides with a leading half period of a pulse output period of said second clock signal.

9. The shift register according to claim 6, wherein the shift register is configured to receive a start pulse for starting a shift operation, the start pulse being either one of a first start pulse that causes the shift operation to be carried out in a forward direction or a second start pulse that causes the shift operation to be carried out in a reverse direction.

10. The shift register according to claim 9,
wherein, when said shift operation is carried out in said forward direction, assuming that a unit circuit has been added at a stage subsequent to a final stage, a signal corresponding to an output signal that would be outputted from said added unit circuit is supplied as said second start pulse to a unit circuit of said final stage, and wherein, when said shift operation is carried out in said reverse direction, assuming that a unit circuit has been added at a stage prior to a first stage, a signal corresponding to an output signal that would be outputted from said added unit circuit is supplied as said first start pulse to a unit circuit of said first stage.

* * * * *